(12) United States Patent
Takahashi

(10) Patent No.: US 10,727,264 B2
(45) Date of Patent: Jul. 28, 2020

(54) IMAGING ELEMENT, ELECTRONIC DEVICE, MANUFACTURING APPARATUS, AND MANUFACTURING METHOD

(71) Applicant: SONY CORPORATION, Tokyo (JP)

(72) Inventor: Hirotsugu Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/577,403

(22) PCT Filed: May 20, 2016

(86) PCT No.: PCT/JP2016/065023
§ 371 (c)(1),
(2) Date: Nov. 28, 2017

(87) PCT Pub. No.: WO2016/194653
PCT Pub. Date: Dec. 8, 2016

(65) Prior Publication Data
US 2018/0175083 A1    Jun. 21, 2018

(30) Foreign Application Priority Data

Jun. 5, 2015    (JP) .................................. 2015-114524

(51) Int. Cl.
*H01L 27/146*    (2006.01)
*H01L 27/14*    (2006.01)
(Continued)

(52) U.S. Cl.
CPC .... *H01L 27/1463* (2013.01); *H01L 21/76224* (2013.01); *H01L 21/823878* (2013.01);
(Continued)

(58) Field of Classification Search
None
See application file for complete search history.

(56) References Cited

U.S. PATENT DOCUMENTS

| 9,160,953 B2 | 10/2015 | Oishi |
| 2003/0220708 A1* | 11/2003 | Sahin ................ H01L 21/67253 700/121 |

(Continued)

FOREIGN PATENT DOCUMENTS

| JP | 2012-054495 A | 3/2012 |
| JP | 2012-520599 | 9/2012 |

(Continued)

OTHER PUBLICATIONS

International Search Report prepared by the Japan Patent Office dated Jul. 26, 2016, for International Application No. PCT/JP2016/065023.

*Primary Examiner* — Herve-Louis Y Assouman
(74) *Attorney, Agent, or Firm* — Sheridan Ross P.C.

(57) ABSTRACT

This technology relates to an imaging element and an electronic device for reducing any increase in pixel size while lessening any drop in image quality, and to a manufacturing apparatus and a manufacturing method for manufacturing the imaging element and the electronic device. For example, an imaging element includes an element isolation region with an insulator to penetrate a semiconductor layer having transistors formed in a pixel including a photoelectric conversion section. In another example, an electronic device includes an imaging section having an element isolation region with an insulator to penetrate a semiconductor layer having transistors formed in a pixel including a photoelectric conversion section. This technology is applicable not only to the imaging element and the electronic device but also to the manufacturing apparatus and the manufacturing method for manufacturing the imaging element and the electronic device to which the present technology is applied, for example.

20 Claims, 45 Drawing Sheets

(51) Int. Cl.
*H01L 21/762* (2006.01)
*H01L 27/092* (2006.01)
*H01L 21/8238* (2006.01)
*H04N 5/378* (2011.01)
*H04N 5/369* (2011.01)

(52) U.S. Cl.
CPC ............ *H01L 27/092* (2013.01); *H01L 27/14* (2013.01); *H01L 27/146* (2013.01); *H01L 27/14634* (2013.01); *H01L 27/14689* (2013.01); *H04N 5/378* (2013.01); *H01L 27/14621* (2013.01); *H01L 27/14623* (2013.01); *H01L 27/14627* (2013.01); *H04N 5/369* (2013.01)

(56) References Cited

U.S. PATENT DOCUMENTS

| | | | |
|---|---|---|---|
| 2005/0168604 A1* | 8/2005 | Mishina | H04N 5/3559 348/294 |
| 2006/0219866 A1* | 10/2006 | Egawa | H04N 3/155 250/208.1 |
| 2007/0063235 A1* | 3/2007 | Lee | H01L 27/14609 257/292 |
| 2010/0279459 A1* | 11/2010 | Huang | H01L 21/28518 438/98 |
| 2011/0216212 A1* | 9/2011 | Watanabe | H04N 5/2353 348/222.1 |
| 2012/0056251 A1 | 3/2012 | Kudoh | |
| 2013/0001730 A1 | 1/2013 | Miyanami | |
| 2013/0020468 A1* | 1/2013 | Mitsuhashi | H01L 27/14627 250/208.1 |
| 2013/0033632 A1 | 2/2013 | Kishi | |
| 2013/0248862 A1* | 9/2013 | Inoue | H01L 31/0224 257/48 |
| 2014/0016012 A1 | 1/2014 | Oishi | |
| 2014/0035083 A1* | 2/2014 | Wan | H01L 27/14634 257/432 |
| 2015/0060967 A1 | 3/2015 | Yokoyama et al. | |
| 2015/0179697 A1 | 6/2015 | Kudoh | |

FOREIGN PATENT DOCUMENTS

| | | |
|---|---|---|
| JP | 2013-012556 A | 1/2013 |
| JP | 2013-051674 A | 3/2013 |
| JP | 2013-085164 | 5/2013 |
| JP | 2014-022448 A | 2/2014 |
| JP | 2015-065407 A | 4/2015 |

* cited by examiner

FIG.17
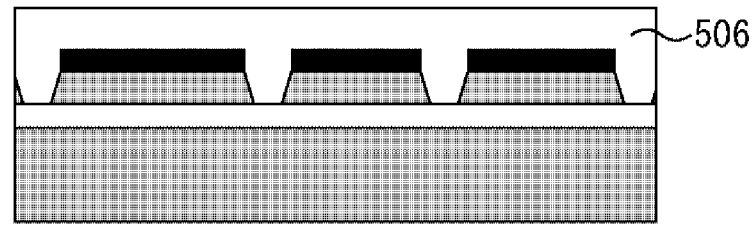
A
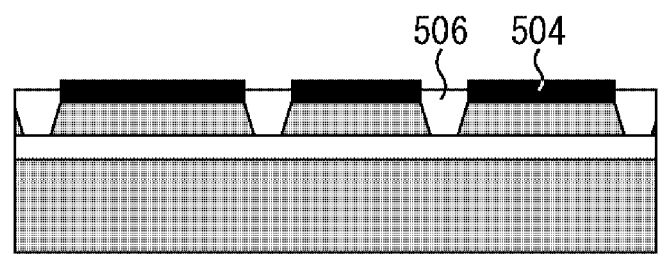
B
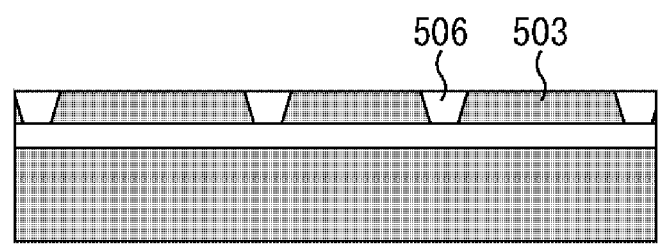
C

FIG.18
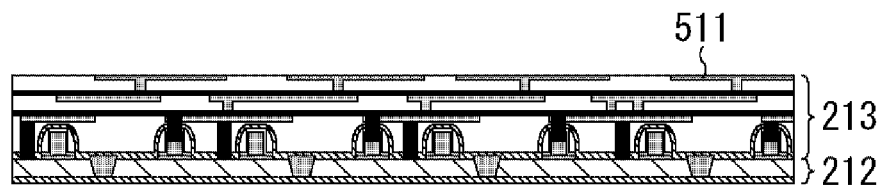
A
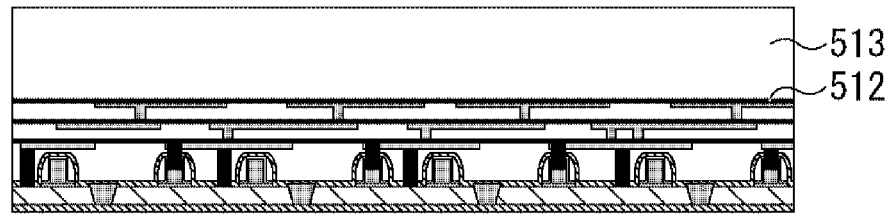
B
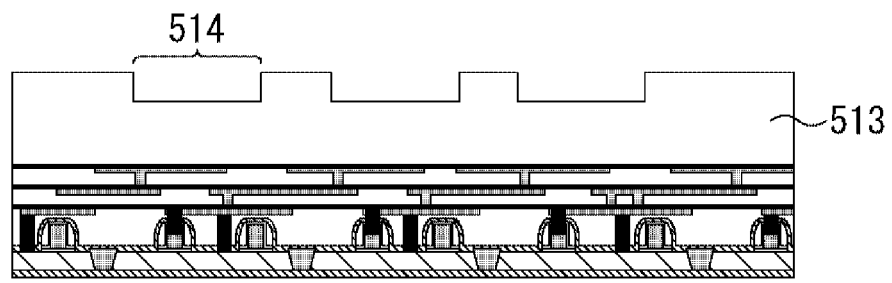
C

FIG.19
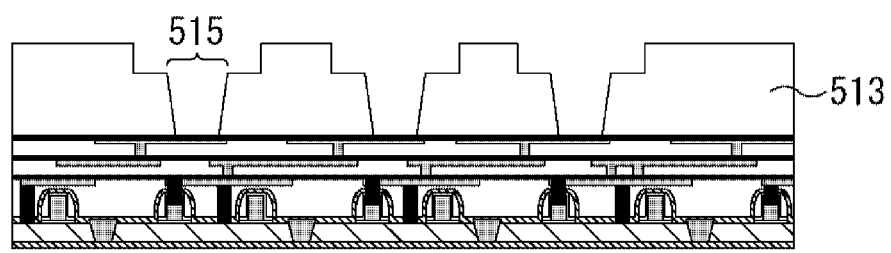
A
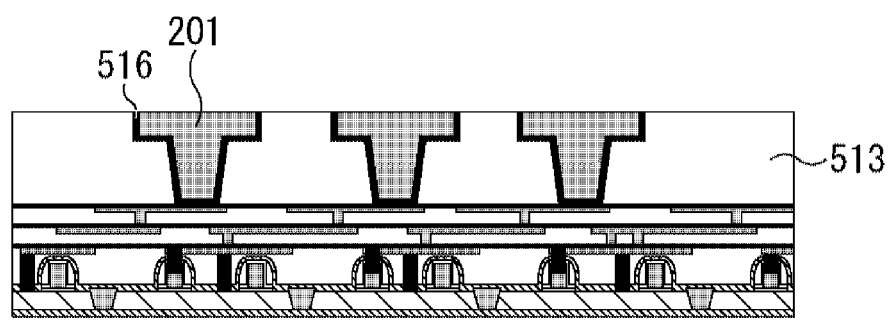
B

FIG. 21
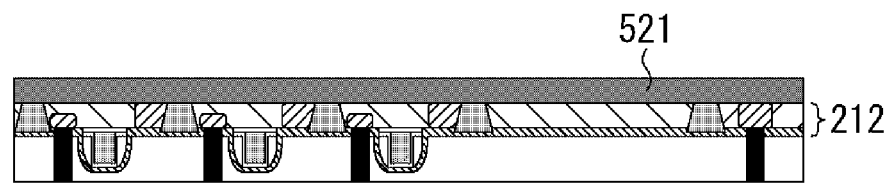
A
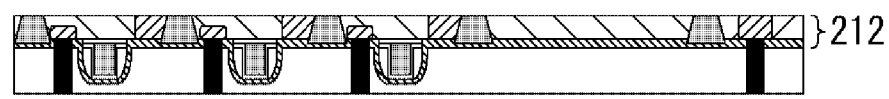
B
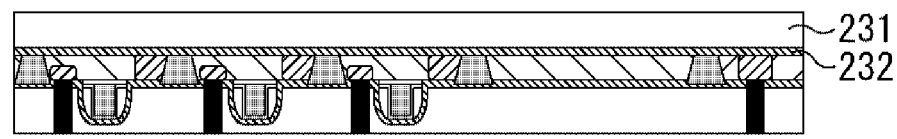
C

FIG.22
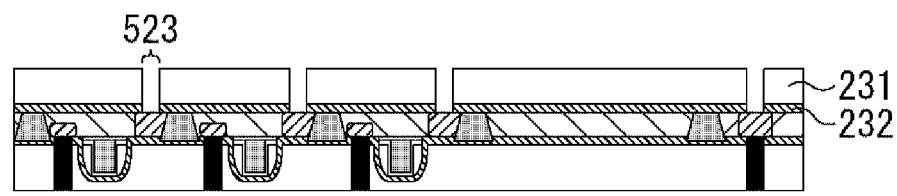
A
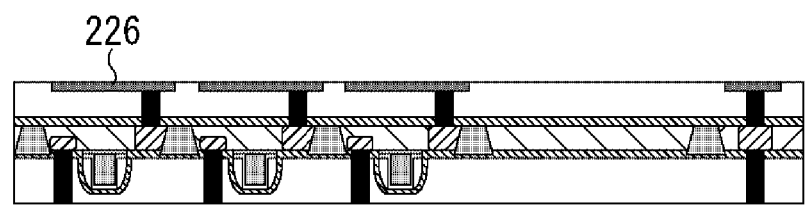
B
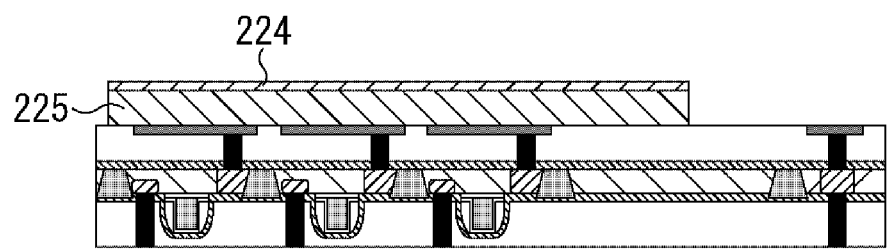
C

FIG. 23
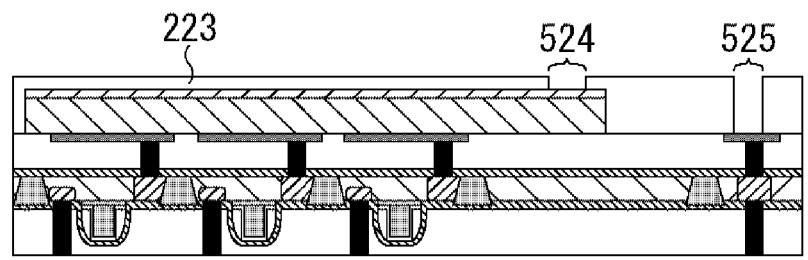
A
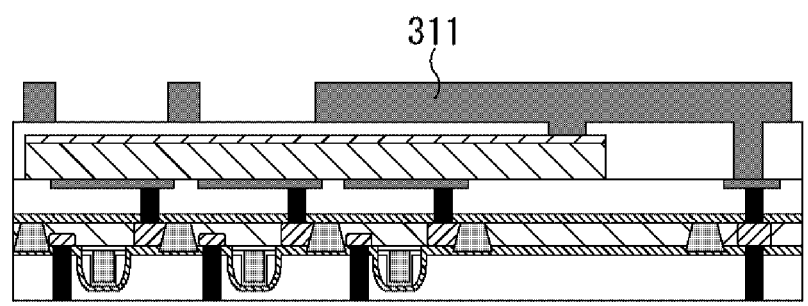
B
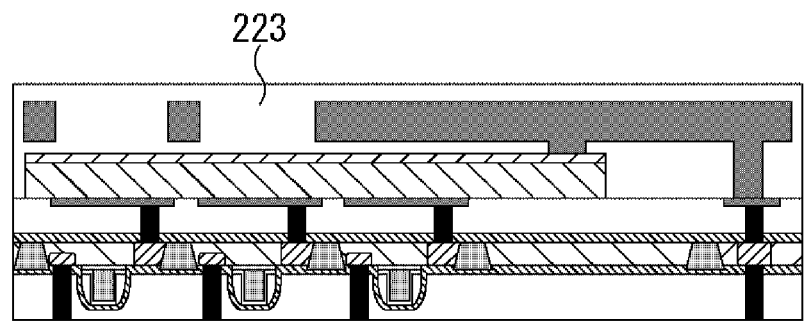
C

FIG. 29
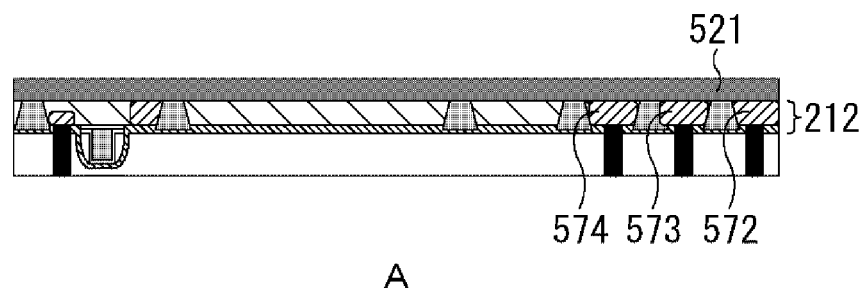
A
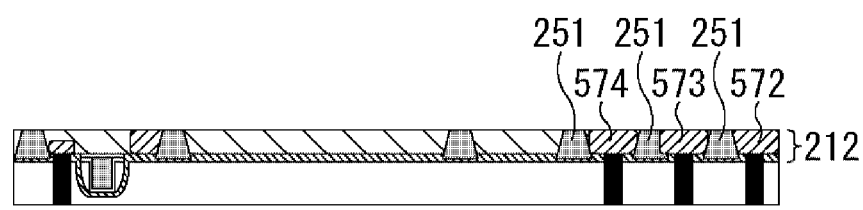
B
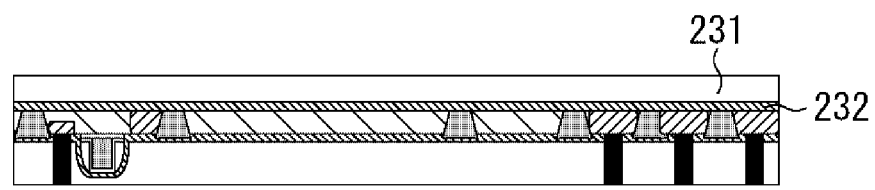
C

FIG.30
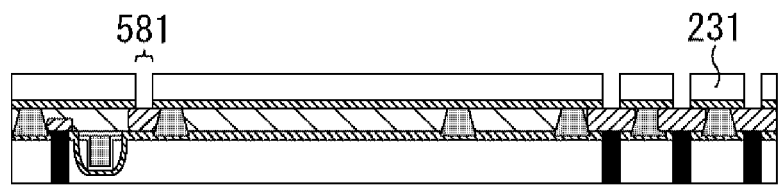
A
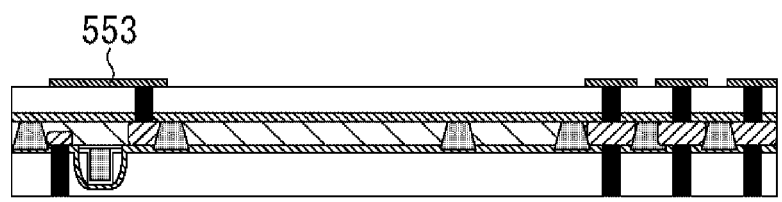
B
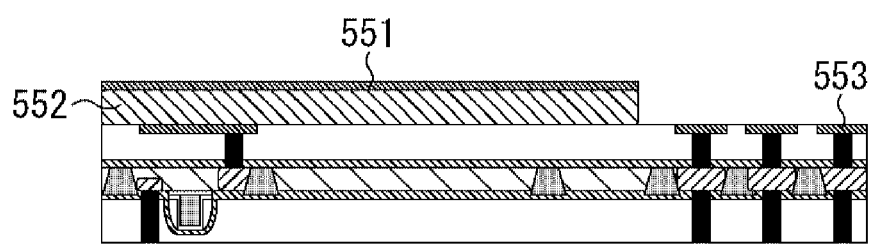
C
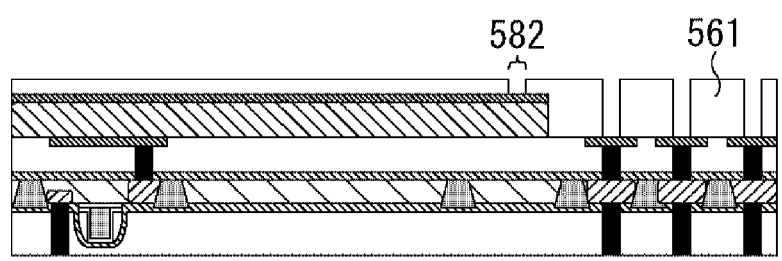
D

FIG.31
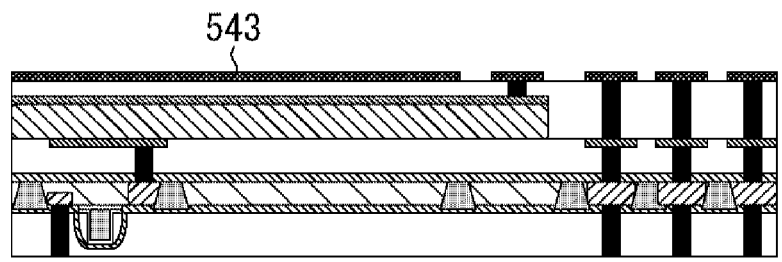
A
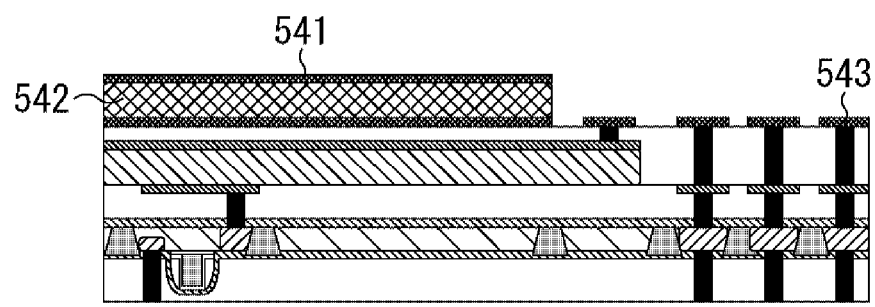
B
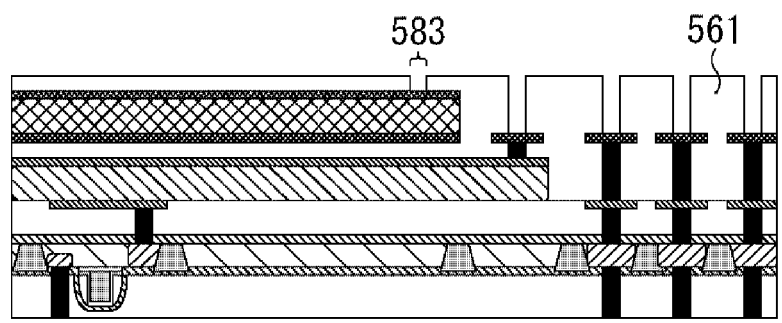
C

FIG.32
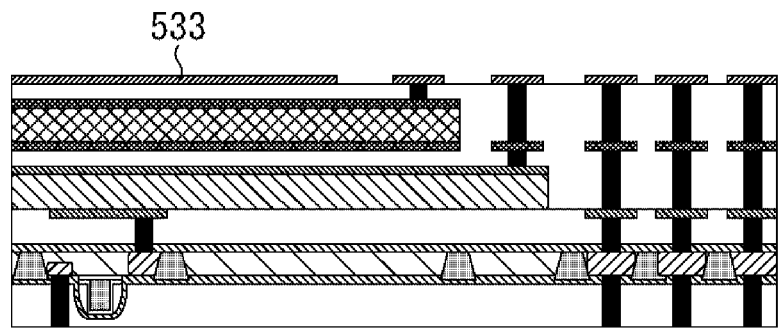
A
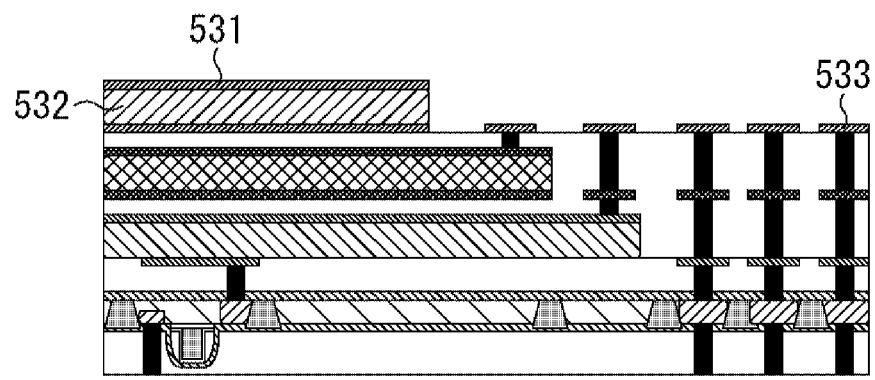
B

IMAGING ELEMENT, ELECTRONIC DEVICE, MANUFACTURING APPARATUS, AND MANUFACTURING METHOD

CROSS REFERENCE TO RELATED APPLICATIONS

This application is a national stage application under 35 U.S.C. 371 and claims the benefit of PCT Application No. PCT/JP2016/065023 having an international filing date of 20 May 2016, which designated the United States, which PCT application claimed the benefit of Japanese Patent Application No. 2015-114524 filed 5 Jun. 2015, the disclosures of which are incorporated herein by reference in their entirety.

TECHNICAL FIELD

The present technology relates to an imaging element, an electronic device, a manufacturing apparatus, and a manufacturing method. More particularly, the technology relates to an imaging element and an electronic device for reducing any increase in pixel size while lessening any drop in image quality, as well as to a manufacturing apparatus and a manufacturing method for manufacturing the imaging element and the electronic device.

BACKGROUND ART

In the past, an image sensor was proposed that has an organic or inorganic photoelectric conversion section disposed over a semiconductor substrate as one technique for reducing pixel size without lessening the opening space of a photodiode (e.g., see PTL 1). Also, an image sensor was proposed that uses photovoltaic power of a photodiode in order to expand the dynamic range of the image sensor (e.g., see PTL 2).

CITATION LIST

Patent Literature

[PTL 1]
JP 2013-85164A
[PTL 2]
JP 2012-520599T

SUMMARY

Technical Problems

An image sensor was proposed that performs analog-to-digital (A/D) conversion per pixel to enable high-speed drive, regional control, and all-pixel simultaneous shutter control. For this type of image sensor, technique was proposed that involves stacking multiple semiconductor substrates on top of another and having part of the transistors of an A/D conversion circuit mounted on an open-side substrate so as to reduce any increase in substrate space while lessening pixel size. However, the added transistors tend to reduce the opening space of photodiodes, which can reduce sensitivity and lessen the quality of captured images. Where part of the transistors of the A/D conversion circuit is mounted on the open-side substrate, both P-type and N-type wells need to be formed in the pixels of the open-side substrate. This requires appropriating extensive well boundary regions that separate the wells. As a result, pixel size can be enlarged.

According to the configuration described in PTL 1, a depletion layer is formed around a floating diffusion layer. When thus formed, the depletion layer comes into contact with an insulating film to generate a dark current, which can reduce the quality of captured images.

According to the method described in PTL 2, N-type and P-type transistors coexist in the same pixel. This requires appropriating extensive well boundary regions, which can increase pixel size.

The present technology has been devised in view of the above circumstances. An object of the technology is therefore to reduce any increase in pixel size while lessening any drop in image quality.

Solution to Problems

According to one aspect of the present technology, there is provided an imaging element including an element isolation region configured with an insulator to penetrate a semiconductor layer having transistors formed in a pixel including a photoelectric conversion section photoelectrically converting incident light.

The element isolation region may be configured to isolate at least one of the transistors formed in the semiconductor layer, a diffusion layer, and a well from the others.

The element isolation region may be configured to be in contact with a side wall of a floating diffusion layer accumulating electrical charges photoelectrically converted by the photoelectric conversion section.

The element isolation region may be configured to be in contact with multiple side walls of the floating diffusion layer.

The element isolation region may be configured to isolate multiple floating diffusion layers from one another formed in the pixel.

The element isolation region may be configured to isolate a P-well from an N-well.

The element isolation region may be configured to isolate a P-type transistor from an N-type transistor.

The imaging element may further include a pixel array having multiple pixels arrayed two-dimensionally.

The element isolation region may be configured to isolate the diffusion layer for an upper electrode of the photoelectric conversion section outside the pixel.

The element isolation region may be configured to be in contact with a side wall of the diffusion layer for the upper electrode.

A first substrate over which the photoelectric conversion section and the semiconductor substrate are formed and a second substrate different from the first substrate may be stacked on each other. Transistors formed over the first substrate and transistors formed over the second substrate may constitute a circuit configured to read and amplify electrical charges obtained by the photoelectric conversion section, the circuit further subjecting the amplified electrical charges to analog-to-digital conversion.

The photoelectric conversion section may be formed by multiple photoelectric conversion sections configured to be stacked on each other to photoelectrically convert light in different wavelength bands.

A first substrate over which the photoelectric conversion section and the semiconductor substrate are formed and a second substrate different from the first substrate may be stacked on each other. Transistors formed over the first substrate may constitute a circuit configured to read and amplify electrical charges obtained by the photoelectric conversion section. Transistors formed over the second substrate may constitute a circuit configured to subject a signal formed of the electrical charges amplified by the other circuit to analog-to-digital conversion.

A first substrate over which the photoelectric conversion section and the semiconductor substrate are formed and a second substrate different from the first substrate may be stacked on each other. Transistors formed over the first substrate and transistors formed over the second substrate may constitute a circuit configured to read and amplify electrical charges obtained by the photoelectric conversion section. Transistors formed over the second substrate may constitute a circuit configured to subject a signal formed of the electrical charges amplified by the other circuit to analog-to-digital conversion.

The transistors in the pixel may constitute a circuit configured to read and amplify electrical charges obtained by the photoelectric conversion section.

The transistors in the pixel may be all N-type transistors.

A first substrate over which the photoelectric conversion section and the semiconductor substrate are formed and a second substrate different from the first substrate may be stacked on each other. Transistors formed over the second substrate may constitute a circuit configured to subject a signal formed of the electrical charges amplified by the other circuit to analog-to-digital conversion, the circuit being disposed for each column of the pixels disposed in array pattern.

According to another aspect of the present technology, there is provided an electronic device including: an imaging section configured to capture an image of a target object; and an image processing section configured to perform image processing on image data obtained by the imaging section capturing the image of the target object. The imaging section includes an element isolation region configured with an insulator to penetrate a semiconductor layer having transistors formed in a pixel including a photoelectric conversion section photoelectrically converting incident light.

According to a further aspect of the present technology, there is provided a manufacturing apparatus for manufacturing an imaging element, the manufacturing apparatus including an element isolation region forming section configured to form an element isolation region configured with an insulator to penetrate a semiconductor layer having transistors formed in a pixel including a photoelectric conversion section photoelectrically converting incident light.

According to an even further aspect of the present technology, there is provided a manufacturing method for use with a manufacturing apparatus for manufacturing an imaging element, the manufacturing method including forming an element isolation region configured with an insulator to penetrate a semiconductor layer having transistors formed in a pixel including a photoelectric conversion section photoelectrically converting incident light.

According to one aspect of the present technology outlined above, an imaging element includes an element isolation region configured with an insulator to penetrate a semiconductor layer having transistors formed in a pixel including a photoelectric conversion section photoelectrically converting incident light.

According to another aspect of the present technology outlined above, an electronic device includes: an imaging section configured to capture an image of a target object; and an image processing section configured to perform image processing on image data obtained by the imaging section capturing the image of the target object. The imaging section includes an element isolation region configured with an insulator to penetrate a semiconductor layer having transistors formed in a pixel including a photoelectric conversion section photoelectrically converting incident light.

According to a further aspect of the present technology outlined above, a manufacturing apparatus for manufacturing an imaging element includes an element isolation region forming section configured to form an element isolation region configured with an insulator to penetrate a semiconductor layer having transistors formed in a pixel including a photoelectric conversion section photoelectrically converting incident light.

Advantageous Effects of Invention

According to the present technology, captured images can be obtained. Also according to the present technology, any increase in pixel size and any drop in image quality are both reduced.

BRIEF DESCRIPTION OF DRAWINGS

FIG. 17 is a set of cross-sectional diagrams explanatory of typical manufacturing processes.

FIG. 18 is a set of cross-sectional diagrams explanatory of typical manufacturing processes.

FIG. 19 is a set of cross-sectional diagrams explanatory of typical manufacturing processes.

FIG. 21 is a set of cross-sectional diagrams explanatory of typical manufacturing processes.

FIG. 22 is a set of cross-sectional diagrams explanatory of typical manufacturing processes.

FIG. 23 is a set of cross-sectional diagrams explanatory of typical manufacturing processes.

FIG. 29 is a set of cross-sectional diagrams explanatory of typical manufacturing processes.

FIG. 30 is a set of cross-sectional diagrams explanatory of typical manufacturing processes.

FIG. 31 is a set of cross-sectional diagrams explanatory of typical manufacturing processes.

FIG. 32 is a set of cross-sectional diagrams explanatory of typical manufacturing processes.

DESCRIPTION OF EMBODIMENTS

The preferred modes for carrying out the present disclosure (called the embodiments thereunder) are described below. The description will be given under the following headings:
1. First embodiment (image sensor)
2. Second embodiment (image sensor)
3. Third embodiment (image sensor)
4. Fourth embodiment (image sensor)
5. Fifth embodiment (image sensor)
6. Sixth embodiment (image sensor)
7. Seventh embodiment (image sensor)
8. Eighth embodiment (imaging device)
9. Others 1. First Embodiment <Image Sensor>

Figure 1:
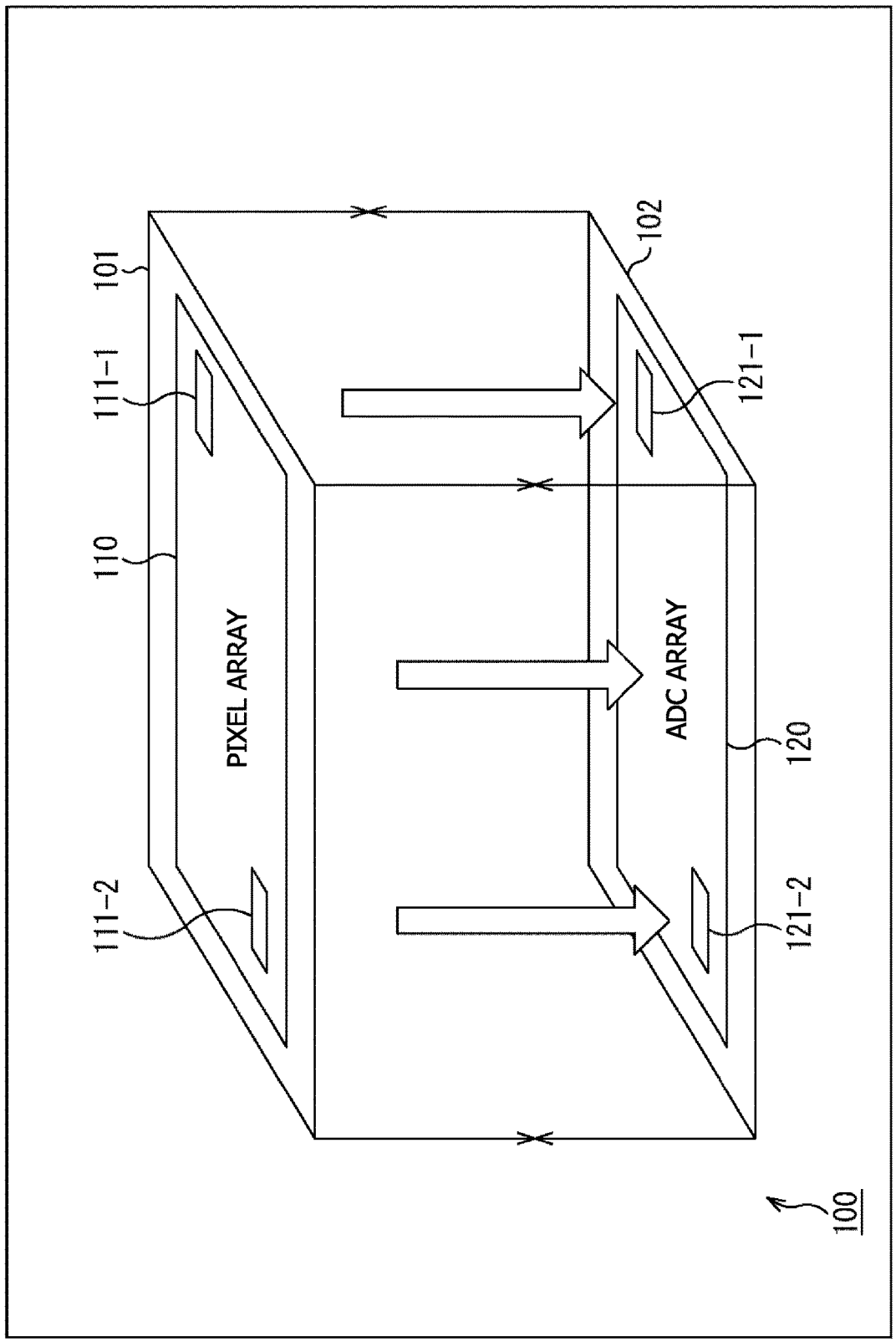
FIG. 1 is a perspective view depicting a typical configuration of an image sensor.

FIG. 1 is a perspective view depicting a typical configuration of an image sensor as one embodiment of an imaging element to which the present technology is applied.

An image sensor 100 depicted in FIG. 1 is a device that photoelectrically converts light from a target object into image data for output. For example, the image sensor 100 is configured as a complementary metal oxide semiconductor (CMOS) image sensor using CMOSs or as a charge-coupled device (CCD) image sensor using CCDs.

As depicted in FIG. 1, the image sensor 100 is made up of a pixel substrate 101 and a circuit substrate 102, two semiconductor substrates that are stacked on each other.

A pixel array 110 is formed over the pixel substrate 101. Unit pixels 111 such as a unit pixel 111-1 or 111-2 for converting incident light into an electrical signal are disposed two-dimensionally (e.g., in array pattern) in the pixel array 110. In the description that follows, the unit pixels (e.g., unit pixels 111-1 and 111-2) will be generically referred to as the unit pixel 111 if there is no need to individually describe these unit pixels. Whereas FIG. 1 depicts only the unit pixels 111-1 and 111-2 in the pixel array 110, a desired number of unit pixels 111 may be disposed in the pixel array 110.

An analog-digital converter (ADC) array 120 is formed over the circuit substrate 102. A/D conversion sections 121 such as an A/D conversion section 121-1 or 121-2 corresponding to the individual unit pixels are disposed two-dimensionally (e.g., in array pattern) in the ADC array 120. In the ensuing description, the A/D conversion sections (e.g., A/D conversion sections 121-1 and 121-2) will be generically referred to as the A/D conversion section 121 if there is no need to individually describe the A/D conversion sections.

The A/D conversion section 121 includes part of a unit pixel A/D conversion circuit configured to convert into a digital signal the analog signal read from the unit pixel 111 (i.e., an electrical signal obtained by photoelectrically converting incident light) corresponding to this section 121. In the ADC array 120, the A/D conversion section 121 is disposed in a region overlapping with the unit pixel 111 corresponding to this section 121. That is, the A/D conversion section 121 is arranged in the same manner as the unit pixel 111 in the pixel array 110.

Consequently, whereas FIG. 1 depicts the ADC array 120 including only the A/D conversion sections 121-1 and 121-2, the ADC array 120 has in fact as many A/D conversion sections 121 disposed therein as the configured unit pixels 111.

Incidentally, the unit pixels 111 in the pixel array 110 may be arranged in a desired pattern (as with the arrangement pattern of the A/D conversion sections 121 in the ADC array 120). For example, the arrangement pattern may be a honeycomb pattern or some other pattern other than the array pattern. Also, the surface over which the pixel array 110 of the pixel substrate 101 is formed and the surface over which the ADC array 120 of the circuit substrate 102 is formed may be of a desired shape. These surfaces may be flat or curved. The exterior of the pixel array 110 (and that of the ADC array 120) may also be of a desired shape. The arrays may be rectangular as depicted in FIG. 1, or may be shaped otherwise. Furthermore, the individual unit pixels 111 (and individual A/D conversion sections 121) may or may not have the same size each.

The pixel substrate 101 and the circuit substrate 102 are stacked on each other basically in a manner insulated from each other. However, the circuits formed over the pixel substrate 101 and those over the circuit substrate 102 are interconnected where necessary using copper (Cu) electrodes, for example.

The unit pixel 111 includes a photoelectric conversion section that photoelectrically converts incident light, a readout circuit that reads out an electrical signal obtained by the photoelectric conversion section amplifying the electrical charges, and part of an A/D conversion circuit configured to convert the analog electrical signal into a digital signal. That is, the unit pixel A/D conversion circuit for converting into a digital signal the electrical signal obtained by the unit pixel 111 is constituted by some of the transistors and other parts formed in the unit pixel 111 and by the A/D conversion section 121 corresponding to that unit pixel 111.

The unit pixel A/D conversion circuit is configured in such a manner as to compare a pixel signal as the electrical signal read from the unit pixel 111 with a predetermined reference signal. The time it takes for the result of the comparison to be varied is given as the count value of a clock signal. This count value is output as the digital value of the pixel signal.

<Unit Pixel A/D Conversion Circuit>

Figure 2:
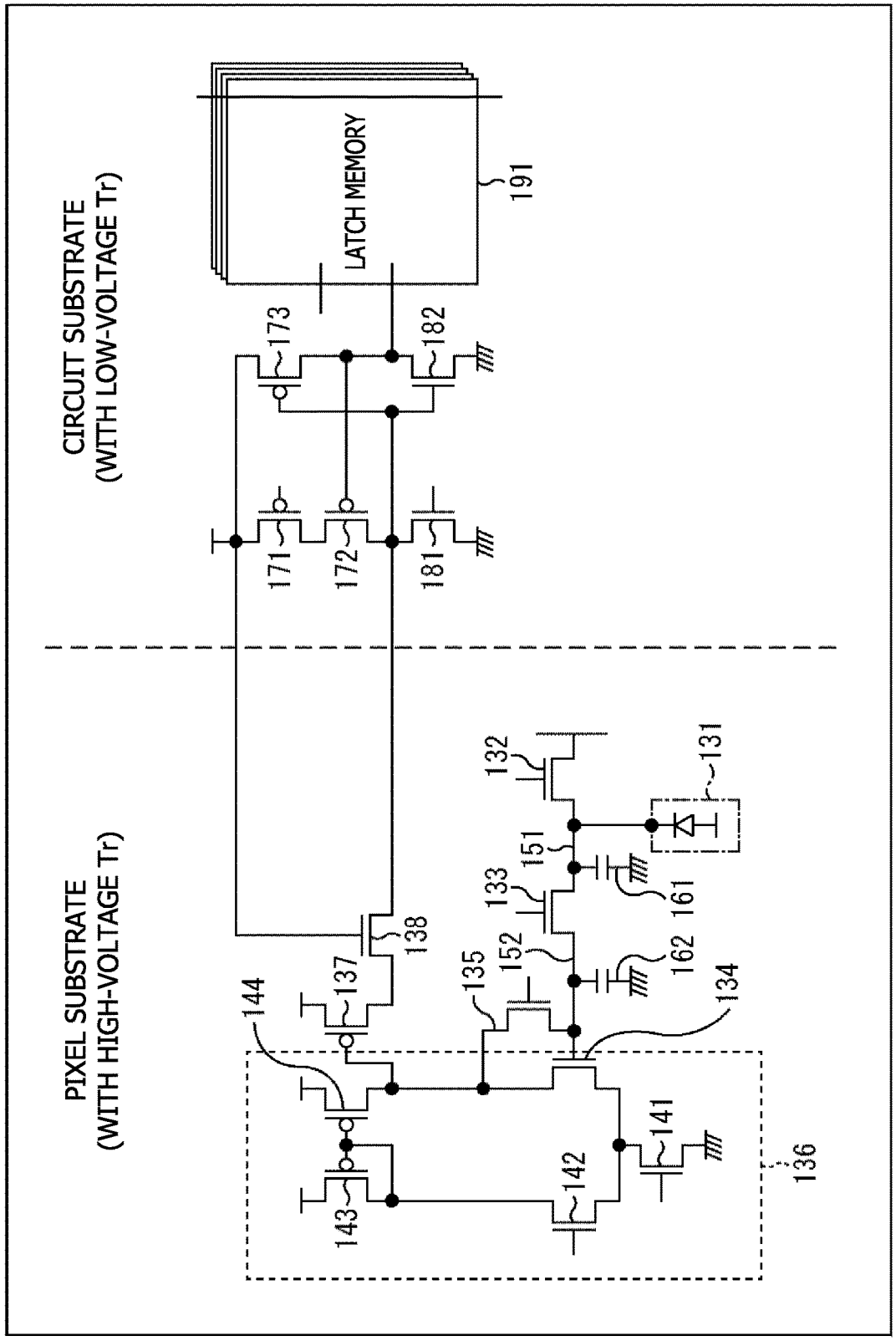
FIG. 2 is a schematic diagram depicting a typical configuration of a circuit mounted on the image sensor.

FIG. 2 is a schematic diagram depicting a typical configuration of the unit pixel A/D conversion circuit mounted on the image sensor. As depicted in FIG. 2, the pixel substrate 101 has high-voltage transistors formed thereon as part of the components making up the unit pixel A/D conversion circuit.

More specifically, the unit pixel 111 includes a photoelectric conversion section 131, a first reset transistor 132, a transfer transistor 133, an amplification transistor 134, a second reset transistor 135, a comparison section 136 including an amplification transistor 134, a transistor 137, and a transistor 138.

The photoelectric conversion section 131 converts the light incident on the unit pixel 111 into electrical charges. The first reset transistor 132 controls the discharge of electrical charges overflowing from a first floating diffusion layer 151. The transfer transistor 133 controls the transfer of electrical charges from the first floating diffusion layer 151 to a second floating diffusion layer 152. The amplification transistor 134 amplifies a potential variation of the second floating diffusion layer 152 for conversion into an electrical signal. The second reset transistor 135 controls the discharge of electrical charges accumulated in the second floating diffusion layer 152.

The comparison section 136 compares the electrical signal (pixel signal) reflecting the electrical charges read from the photoelectric conversion section 131 with a predetermined reference signal, and outputs an output signal representing the result of the comparison. When the pixel signal becomes the same as (i.e., has the same voltage as) the reference signal, the comparison section 136 inverts the output signal.

The comparison section 136 is formed by a transistor 142 and the amplification transistor 134 making up a differential pair, by transistors 143 and 144 constituting a current mirror circuit, and by a transistor 141 acting as a constant current source that supplies a current reflecting an input bias current.

Of the transistor 142 and the amplification transistor 134 making up the differential pair, the transistor 142 has a gate that receives the reference signal output from a digital-to-analog (D/A) conversion section, not depicted. The amplification transistor 134 has a gate that receives the pixel signal transferred from the second floating diffusion layer 152. The source of the transistor 142 and the amplification transistor 134 is connected with the drain of the transistor 141. The source of the transistor 141 is connected to ground (GND).

The drain of the transistor 142 is connected with the gate of the transistors 143 and 144 making up the current mirror circuit and with the drain of the transistor 143. The drain of the amplification transistor 134 is connected with the drain of the transistor 144. The source of the transistors 143 and 144 is connected to a power supply voltage.

The unit pixel 111 also has the first floating diffusion layer 151 and the second floating diffusion layer 152 formed therein. The first floating diffusion layer 151 accumulates the electrical charges transferred from the photoelectric conversion section 131. The second floating diffusion layer 152 accumulates the electrical charges transferred from the first floating diffusion layer 151.

The first floating diffusion layer 151 has a well contact 161 formed therein. The second floating diffusion layer 152 has a well contact 162 formed therein.

As depicted in FIG. 2, low-voltage transistors and other parts are formed over the circuit substrate 102.

The A/D conversion section 121 corresponding to the unit pixel 111 has transistors 171, 172, 173, 181, and 182 formed therein.

The transistors 171, 172 and 181, together with the transistors 137 and 138 in the unit pixel 111, make up a positive feedback (PFB) circuit. This positive feedback circuit boosts the transition rate of the output signal from the comparison section 136, thereby improving the determination speed of the comparison section 136.

The transistors 173 and 182 make up an inverter (NOT gate) that inverts the value of the output signal from the comparison section 136. The inversion is different from that of the output signal based on the result of the comparison performed by the above-mentioned comparison section 136. The inversion is carried out continuously on the output signal.

The A/D conversion section 121 further includes a latch memory 191. The latch memory 191 receives as its input signal a code value indicative of the current time. The latch memory 191 retains the code value applicable when the output signal from the comparison section 136 is inverted on the basis of the comparison result. The code value is read out as the output signal in a suitably timed manner. The code value is a digitized value in N bits of the analog pixel signal.

Where the high-voltage transistors from among the configured transistors are disposed over the pixel substrate 101 and the low-voltage transistors are disposed over the circuit substrate 102 as described above, the processing conditions regarding gate electrodes, diffusion layers, and wiring are optimized for each substrate. For example, it is easy to implement control such that the processing conditions for minimizing noise may be adopted for the pixel substrate 101 and that the processing conditions for maximum refining may be adopted for the circuit substrate 102.

As depicted in FIG. 2, from among the transistors formed over the pixel substrate 101, the first reset transistor 132, the transfer transistor 133, the amplification transistor 134, the second reset transistor 135, the transistor 138, the transistor 141, and the transistor 142 are N-type transistors. The transistor 137, the transistor 143, and the transistor 144 are P-type transistors. That is, both N-type and P-type transistors are disposed over the pixel substrate 101.

<Cross-Sectional Configuration of the Image Sensor>

Figure 3:
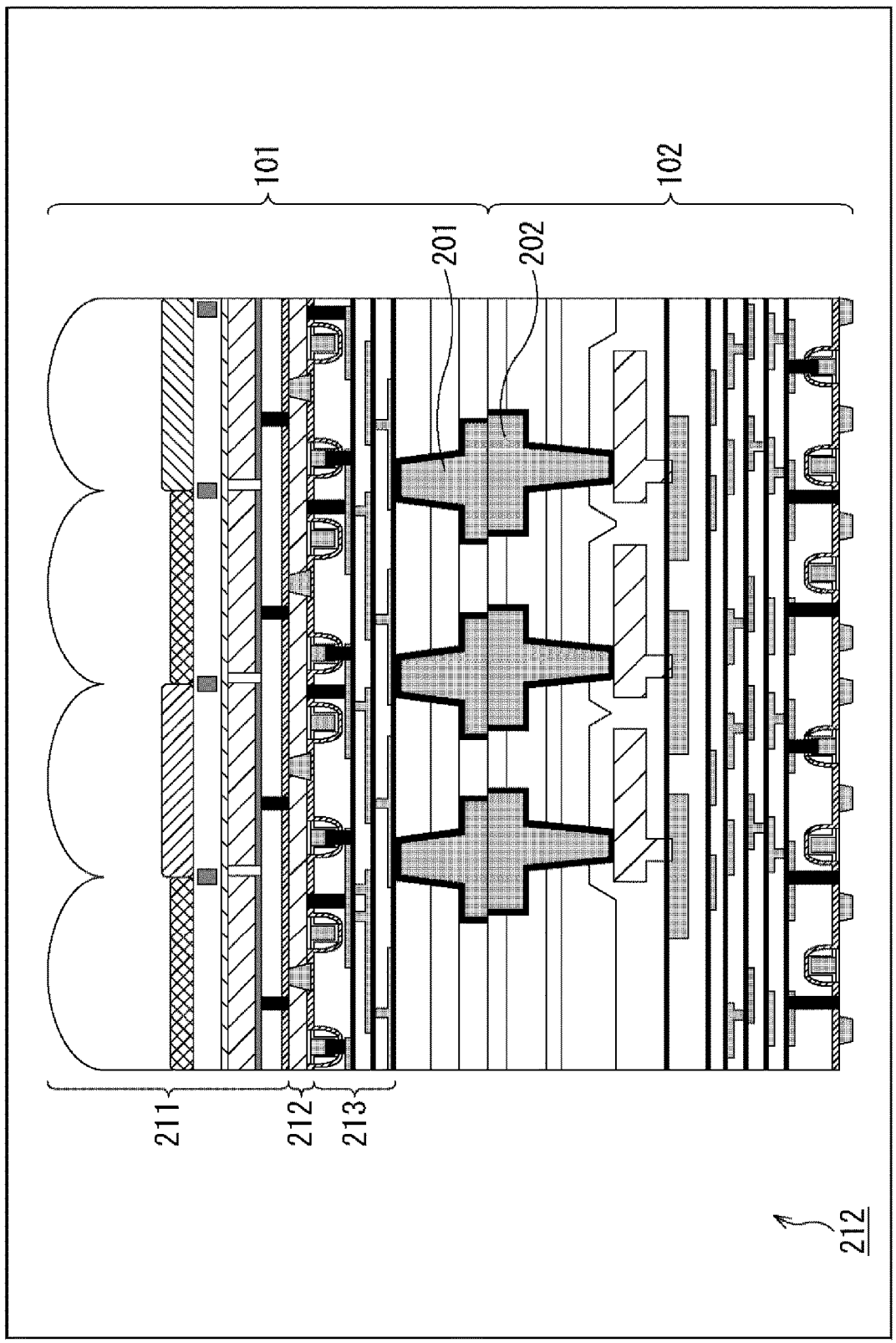
FIG. 3 is a cross-sectional diagram depicting a typical configuration of the image sensor.

FIG. 3 is a cross-sectional diagram depicting a typical configuration of the image sensor 100. Depicted in FIG. 3 is a typical configuration of a partial cross-section of the image sensor 100. As indicated in FIG. 3, the pixel substrate 101 and the circuit substrate 102 are stacked on each other in the image sensor 100.

The pixel substrate 101 has pads (also called electrodes) 201 formed thereon in a manner exposed to the surface in contact with the circuit substrate 102. The circuit substrate 102 also has pads (electrodes) 202 formed thereon in a manner exposed to the surface in contact with the pixel substrate 101. The pads 201 and 202 are formed by a conductive material such as copper (Cu).

The pads 201 are electrically connected with predetermined parts of the circuits formed over the pixel substrate 101. The pads 202 are electrically connected with the parts of the circuits over the circuit substrate 102 corresponding to parts of the circuits over the pixel substrate 101 with which the pads 201 corresponding to the pads 202 are connected.

The pads 201 and 202 corresponding to one another are formed at positions in contact with each other when the pixel substrate 101 and the circuit substrate 102 are stacked on top of another as depicted in FIG. 3. That is, the circuits formed over the pixel substrate 101 and those over the circuit substrate 102 are electrically interconnected via the pads 201 and 202.

Incidentally, as many pads 201 and 202 as desired may be provided in the image sensor 100.

As depicted in FIG. 3, the pixel substrate 101 has a photoelectric conversion layer 211, an element isolation layer 212, and a transistor wiring layer 213 formed therein. The photoelectric conversion layer 211 is configured to permit photoelectric conversion for the photoelectric conversion section, for example. The element isolation layer 212 is configured to include element isolation regions for isolating elements, for example. The transistor wiring layer 213 is configured to include gates and wiring for transistors, for example. The pads 201 are connected with the wiring formed in the transistor wiring layer 213.

Also as depicted in FIG. 3, the circuit substrate 102 has wiring and transistors formed therein. The pads 202 are connected with the wiring.

<Configuration of the Pixel Substrate>

Figure 4:
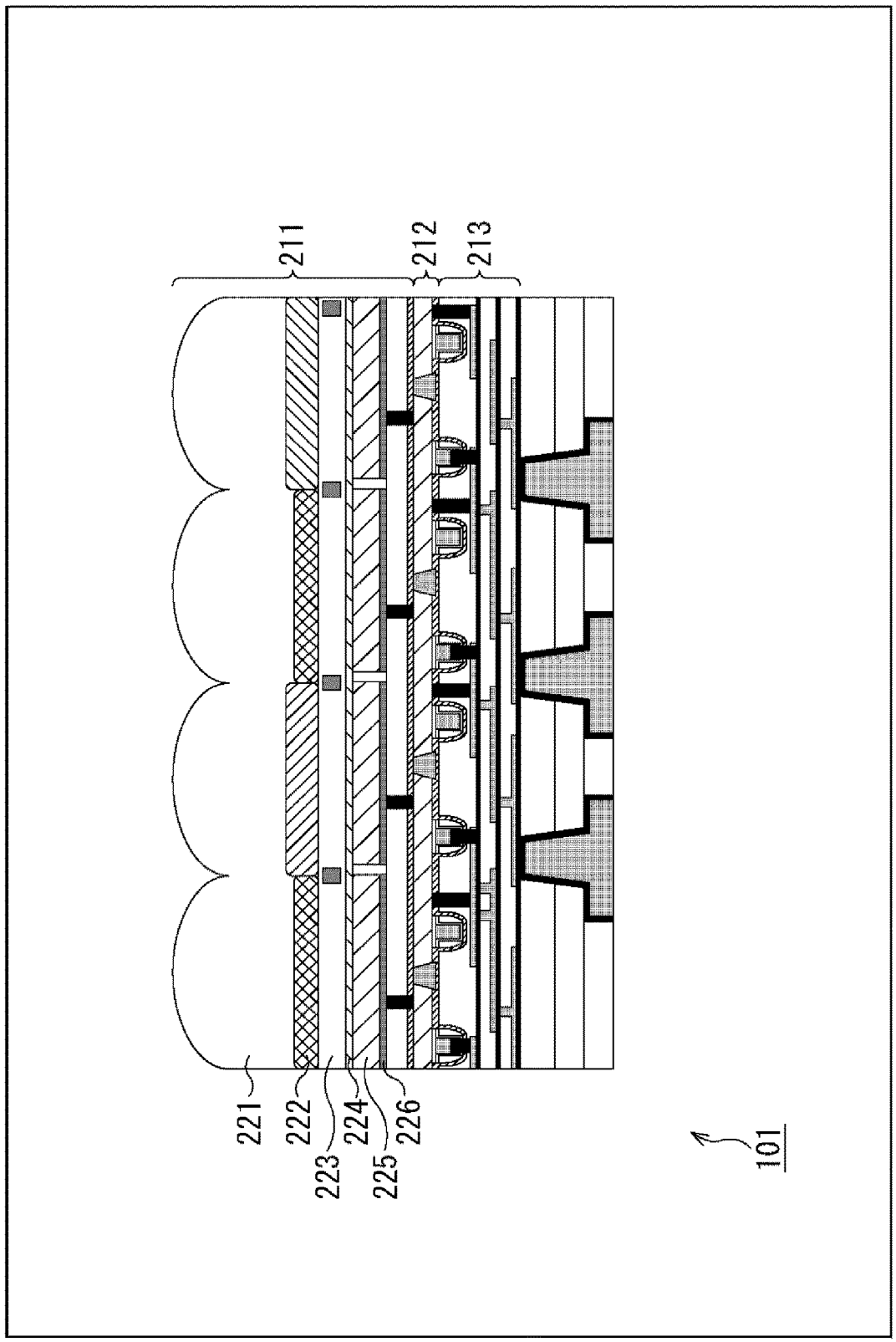
FIG. 4 is a cross-sectional diagram depicting a typical configuration of a pixel substrate.

FIG. 4 is a cross-sectional diagram depicting a typical configuration of the photoelectric conversion layer 211 over the pixel substrate 101. As depicted in FIG. 4, the photoelectric conversion layer 211 includes micro lenses 221, color filters 222, an inter-pixel light shielding layer 223, an upper electrode 224, photoelectric conversion sections 225, and a lower electrode 226.

The micro lens 221 formed for each unit pixel 111 collects (focuses) the light incident on an imaging plane onto the unit pixel 111. This improves the focusing efficiency of incident light for each unit pixel 111, which in turn enhances the quantum efficiency of the photoelectric conversion section for the unit pixel 111.

The color filter 222 formed for each unit pixel 111 transmits light incident on the unit pixel 111 via the corresponding micro lens 221. The color filter 222 allows a predetermined wavelength (color) band component of the incident light to enter the photoelectric conversion section for the unit pixel 111. Each color filter 222 may transmit a desired wavelength (color) band that may be visible light, infrared light, or ultraviolet light. The color filter 222 may be constituted by a filter that transmits a single wavelength (color) band or by multiple filters that transmit mutually different wavelength (color) bands. If multiple filters make up each color filter 222, the type of filter is set for each unit pixel 111.

For example, the color filter 222 may be formed by a red light filter that transmits visible light in a red wavelength band, by a blue light filter that transmits visible light in a blue wavelength band, and by a green light filter that transmits visible light in a green wavelength band. In this case, each unit pixel 111 is provided with the color filter 222 acting as a red, blue, or green light filter.

The inter-pixel light shielding layer 223 is formed by a transparent film that transmits light and a light shielding wall formed between the unit pixels 111 in a manner shielding light. For example, the transparent film is formed by an insulating material and the light shielding wall is formed by a metal. The inter-pixel light shielding layer 223 prevents the light passing through the color filters 222 from entering the adjacent pixels.

The upper electrode 224 is formed in a manner contacting the upper surface of the photoelectric conversion sections 225, as seen in the drawing. The lower electrode 226 is formed for each unit pixel 111 in a manner contacting the lower surface of the photoelectric conversion sections 225 as illustrated. That is, the upper electrode 224 and the lower electrode 226 are configured to sandwich the photoelectric conversion sections 225.

The upper electrode 224 is formed by a transparent electrode. The photoelectric conversion sections 225 convert light incident via the color filter 222, for example, into electrical charges. The photoelectric conversion sections 225 are formed by an organic photoelectric conversion film, a compound semiconductor, or quantum dots. The lower electrode 226 is used to transfer the electrical charges photoelectrically converted by the photoelectric conversion section 225 corresponding to the unit pixel 111.

For each unit pixel, the lower electrode 226 is electrically connected with the element isolation layer 212 via electrode plugs. Independent of the lower electrode 226, the upper electrode 224 is electrically connected with the element isolation layer 212 via electrode plugs. For example, the upper electrode 224 is electrically connected with the element isolation layer 212 outside the unit pixels 111. Naturally, the upper electrode 224 could also be electrically connected with the element isolation layer 212 inside the unit pixels 111. However, electrically connecting the upper electrode 224 with the element isolation layer 212 outside the unit pixels 111 reduces any increase in the size of the unit pixels 111.

<Typical Configuration of the Element Isolation Layer and Other Layers>

Figure 5:
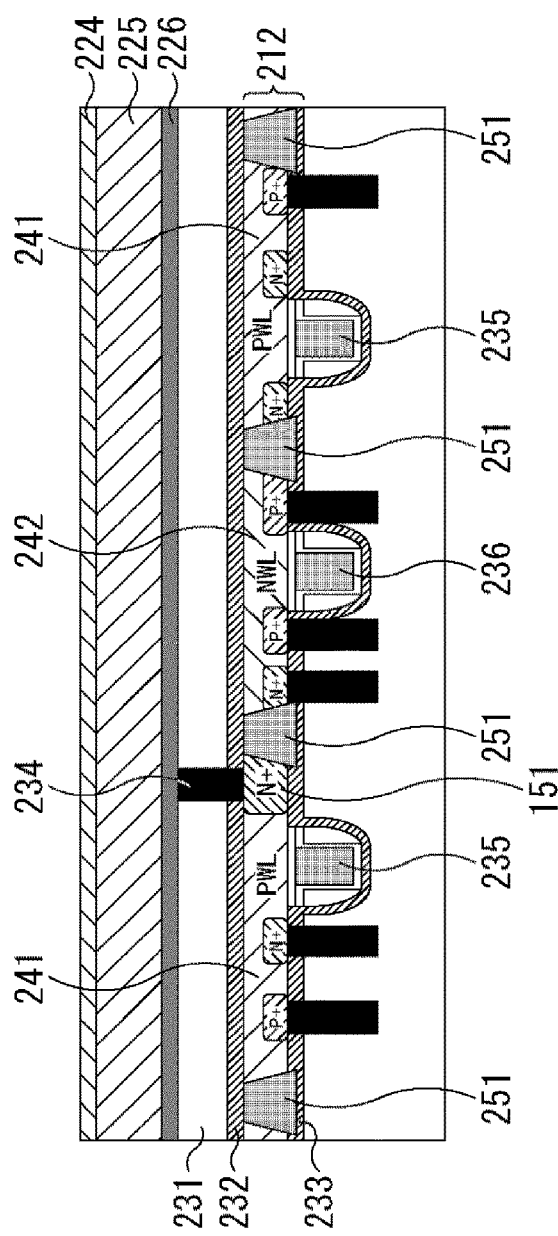
FIG. 5 is a cross-sectional diagram depicting a typical configuration of part of the layers making up the pixel substrate.

FIG. 5 is a cross-sectional diagram depicting a typical configuration of the element isolation layer 212 and other layers making up the pixel substrate 101. As depicted in FIG. 5, an insulating layer 231 is formed between the lower electrode 226 and the element isolation layer 212. The insulating layer 231 is formed by an insulating material such as silicon dioxide ($SiO_2$). Buried oxide film layers 232 and 233 are formed in a manner sandwiching the element isolation layer 212 from above and below as illustrated.

The element isolation layer 212 is formed by a silicon substrate approximately 200 to 2000 nm thick, for example. Over the pixel substrate 101, N-type transistors 235 and P-type transistors 236 are formed. This allows P-wells 241 and N-wells 242 to be formed in the element isolation layer 212. The N-type transistors 235 are formed in the P-wells 241 and the P-type transistors 236 are formed in the N-wells 242. In the element isolation layer 212, the first floating diffusion layer 151 (N+ diffusion layer) is formed. An electrode plug 234 electrically connects the lower electrode 226 with the first floating diffusion layer 151 for each unit pixel 111.

Element isolation regions 251 are further formed in the element isolation layer 212. As depicted in FIG. 5, the element isolation regions 251 are formed in a manner penetrating the element isolation layer 212 that constitutes a semiconductor layer where the transistors (e.g., N-type transistors 235 and P-type transistors 236) are formed, the element isolation regions 251 reaching from the buried oxide film layer 233 to the buried oxide film layer 232. The element isolation regions 251 may each be as wide as desired but may typically have a width of approximately 200 nm. The element isolation regions 251 may be configured from a suitable insulating material.

The element isolation regions 251 may be formed in a manner isolating at least one of the transistors, the diffusion layers, and the wells in the element isolation layer 212 from the others.

For example, the element isolation regions 251 may be disposed between the P-well 241 and the N-well 242 (on a well boundary) in the unit pixel 111. This isolates the P-wells 241 from the N-wells 242 with no need to appropriate extensive well boundary regions. That is, the N-type transistor 235 and the P-type transistor 236 electrically isolated from one another may be disposed in the unit pixel 111 while any increase in pixel size is reduced.

In other words, as depicted in FIG. 2, the unit pixel A/D conversion circuit may be partially configured over the pixel substrate 101 (in the unit pixels 111). This makes it possible to reduce any increase in the size of the A/D conversion section 121 over the circuit substrate 102 corresponding to the unit pixel 111, further reducing the increase in the size of the unit pixel 111.

That is, the image sensor 100 of this embodiment is provided with the pixel substrate 101 having the photoelectric conversion sections 225 and the element isolation layer 212 formed thereon, the pixel substrate 101 being a first substrate over which the photoelectric conversion sections and semiconductor layers are disposed. The image sensor 100 is also provided with the circuit substrate 102 as a second substrate different from the pixel substrate 101. In the image sensor 100, the pixel substrate 101 and the circuit substrate 102 are stacked on each other. Also in the image sensor 100, the transistors formed over the pixel substrate 101 and the transistors formed over the circuit substrate 102 constitute the unit pixel A/D conversion circuit that reads electrical charges from the photoelectric conversion sections 225, before amplifying the electrical charges for A/D conversion.

The image sensor 100 thus performs analog-to-digital conversion on each pixel while reducing any increase in pixel size. As such, the image sensor 100 provides such functions as high-speed drive, regional control, and all-pixel simultaneous shutter control.

In other words, the element isolation region 251 disposed between the N-type transistor 235 and the P-type transistor 236 is configured to isolate the N-type transistor 235 and the P-type transistor 236 from one another.

<Configuration of the Element Isolation Layer>

Figure 6:
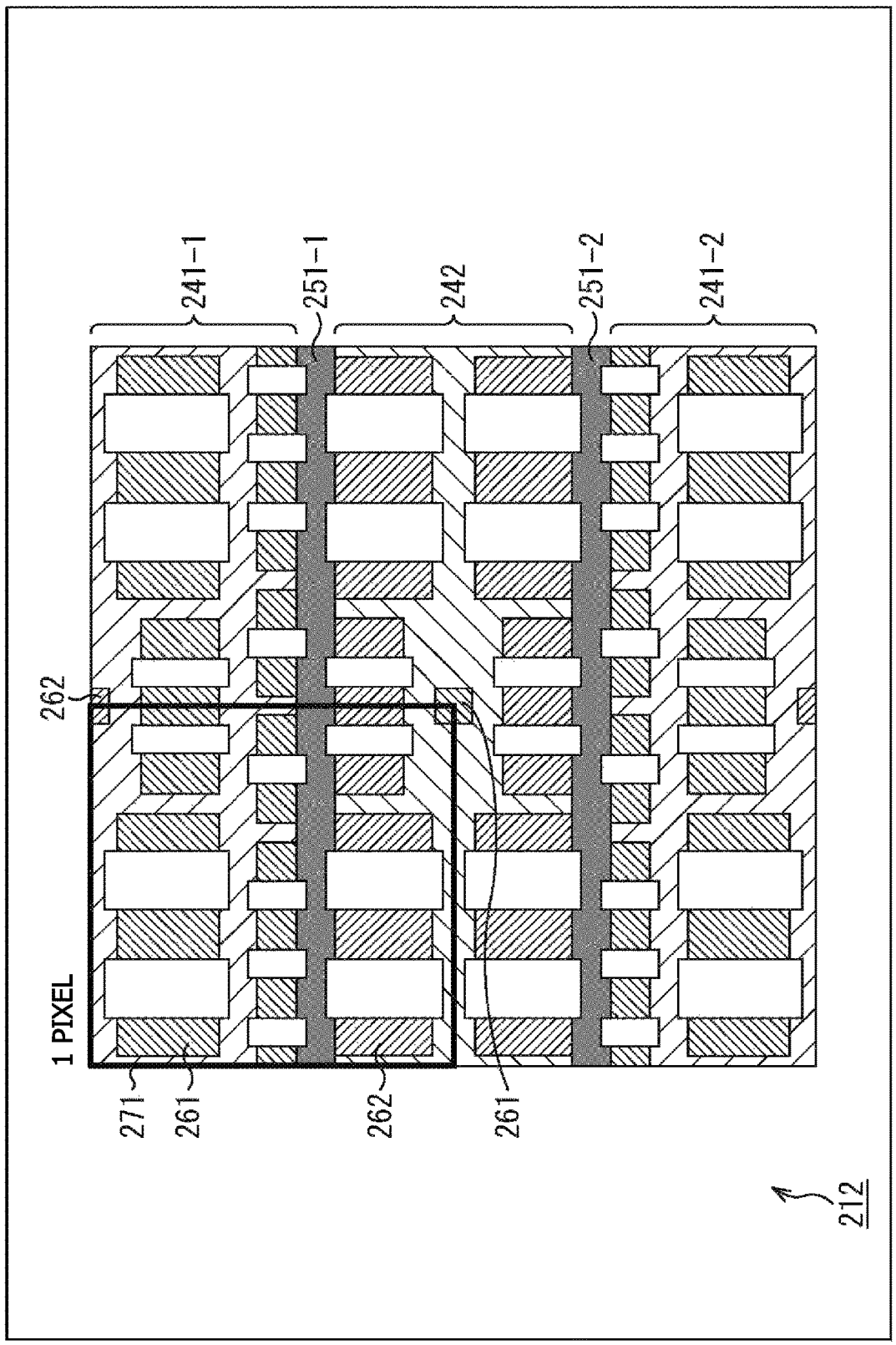
FIG. 6 is a plan view depicting a typical configuration of an element isolation layer.

FIG. 6 is a plan view depicting a typical configuration of the element isolation layer. A rectangle 271 in FIG. 6 indicates a configuration for one unit pixel. As depicted in FIG. 6, an element isolation region 251-1 is formed between a P-well 241-1 and an N-well 242. Between the N-well 242 and a P-well 241-2, an element isolation region 251-2 is formed.

An N+ diffusion layer 261 formed in the P-wells 241-1 and 241-2 makes up the source and drain for the N-type transistors. A P+ diffusion layer 262 formed in the N-well 242 constitutes the source and drain for the P-type transistors. Hollow rectangles in the drawing indicate gate insulator films for the transistors. The P+ diffusion layer 262 formed in the P-wells 241-1 and 241-2 and the N+ diffusion layer 261 formed in the N-well 242 constitute well contacts.

As depicted in FIG. 6, the element isolation regions 251 may each be disposed on a well boundary between the P-well 241 and the N-well 242 in the unit pixel 111. In this case, the element isolation regions 251 isolate the P-well 241 and the N-well 242 from each other, as well as the N-type transistor and the P-type transistor from one another.

<Configuration of the Element Isolation Layer in the Unit Pixel>

Figure 7:
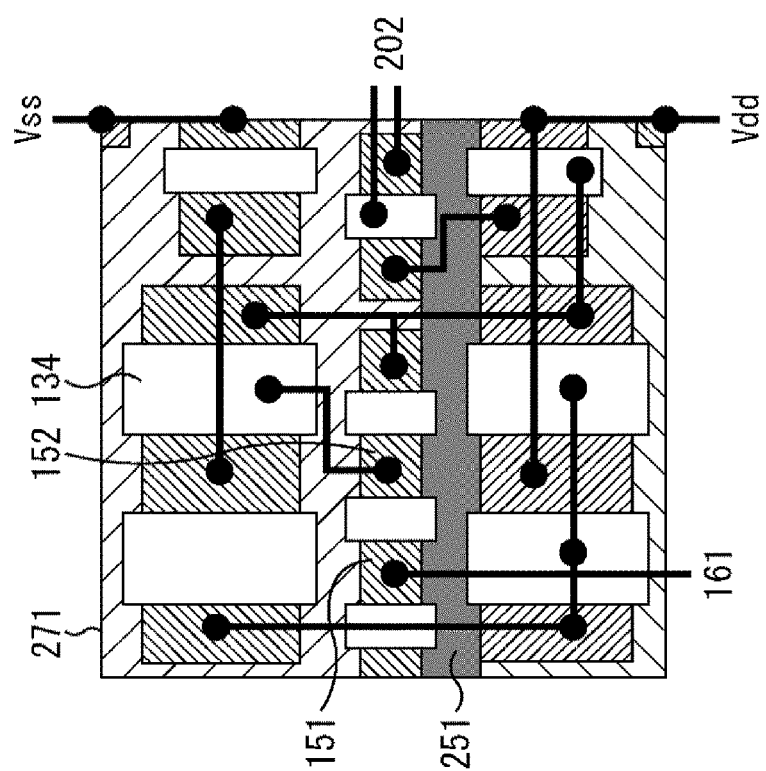
FIG. 7 is a plan view depicting a typical configuration of the element isolation layer in a unit pixel.

FIG. 7 is a plan view depicting a typical configuration of the element isolation layer 212 in the unit pixel 111. In the example of FIG. 7, the element isolation region 251 in the unit pixel 111 (inside a rectangle 271) is disposed to be in contact with the first floating diffusion layer 151 and the second floating diffusion layer 152.

Figure 8:
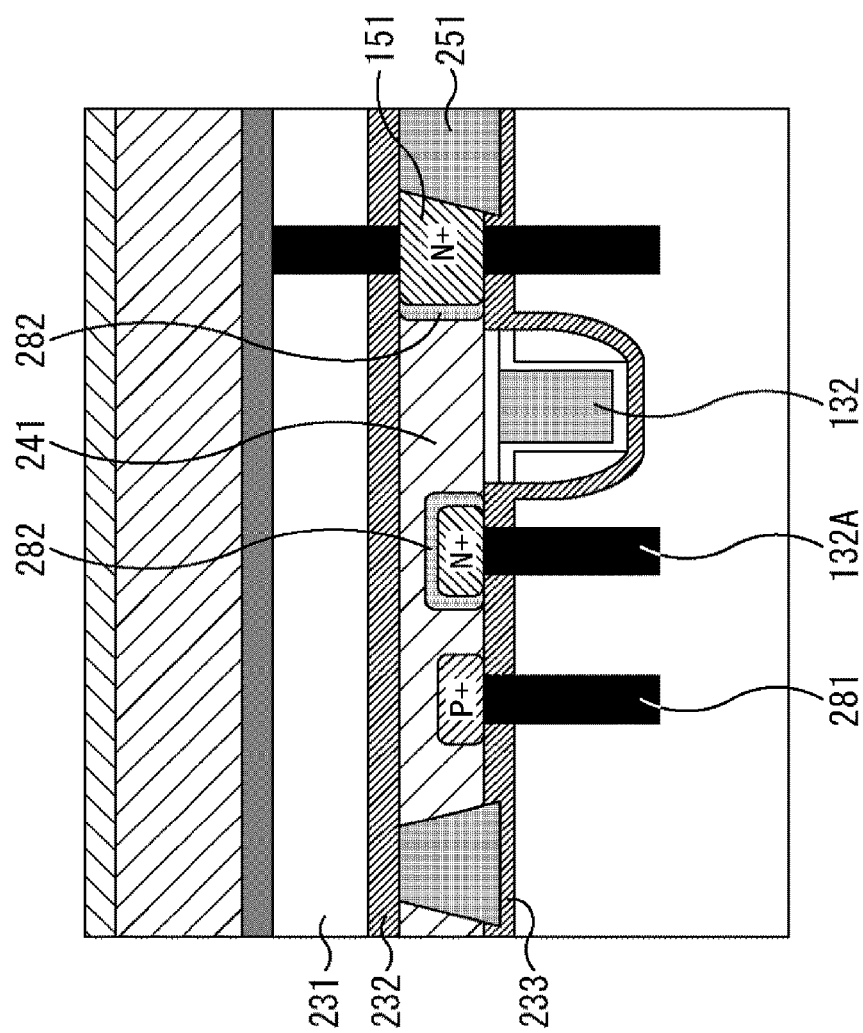
FIG. 8 is a cross-sectional diagram depicting a typical configuration of part of the element isolation layer.

FIG. 8 is a cross-sectional diagram depicting a typical configuration of part of the element isolation layer. The transistors are each formed by a well, a gate insulator film, a polysilicon gate, and a source and drain including a high-concentration diffusion layer.

The first floating diffusion layer 151 is formed by injecting impurities for annealing so that the layer will be highly concentrated up to the buried oxide (BOX) film layer 232. The second floating diffusion layer 152, not depicted, is formed in the same manner as the first floating diffusion layer 151.

Other high-concentration diffusion layers typically used as the source and drain may be as deep as the first floating diffusion layer 151, for example. However, making the other high-concentration diffusion layers slightly shallower (so that the layers will not be highly concentrated up to the buried oxide film layer 232) stabilizes transistor performance.

Disposing inside the same well as the transistor a high-concentration impurity layer (well contact 281) having the same polarity as the well permits control of substrate bias. This well contact may have the same impurity profile as the source and drain of the transistor. If the transistor is used as a fully depleted transistor, there is no need to provide the well contact 281.

A depletion layer 282 is formed around the high-concentration diffusion layers such as the first floating diffusion layer 151, the second floating diffusion layer 152, and the source and drain. If the depletion layer 282 comes into contact with the buried oxide film layer 232, a dark current can be incurred.

Figure 9:
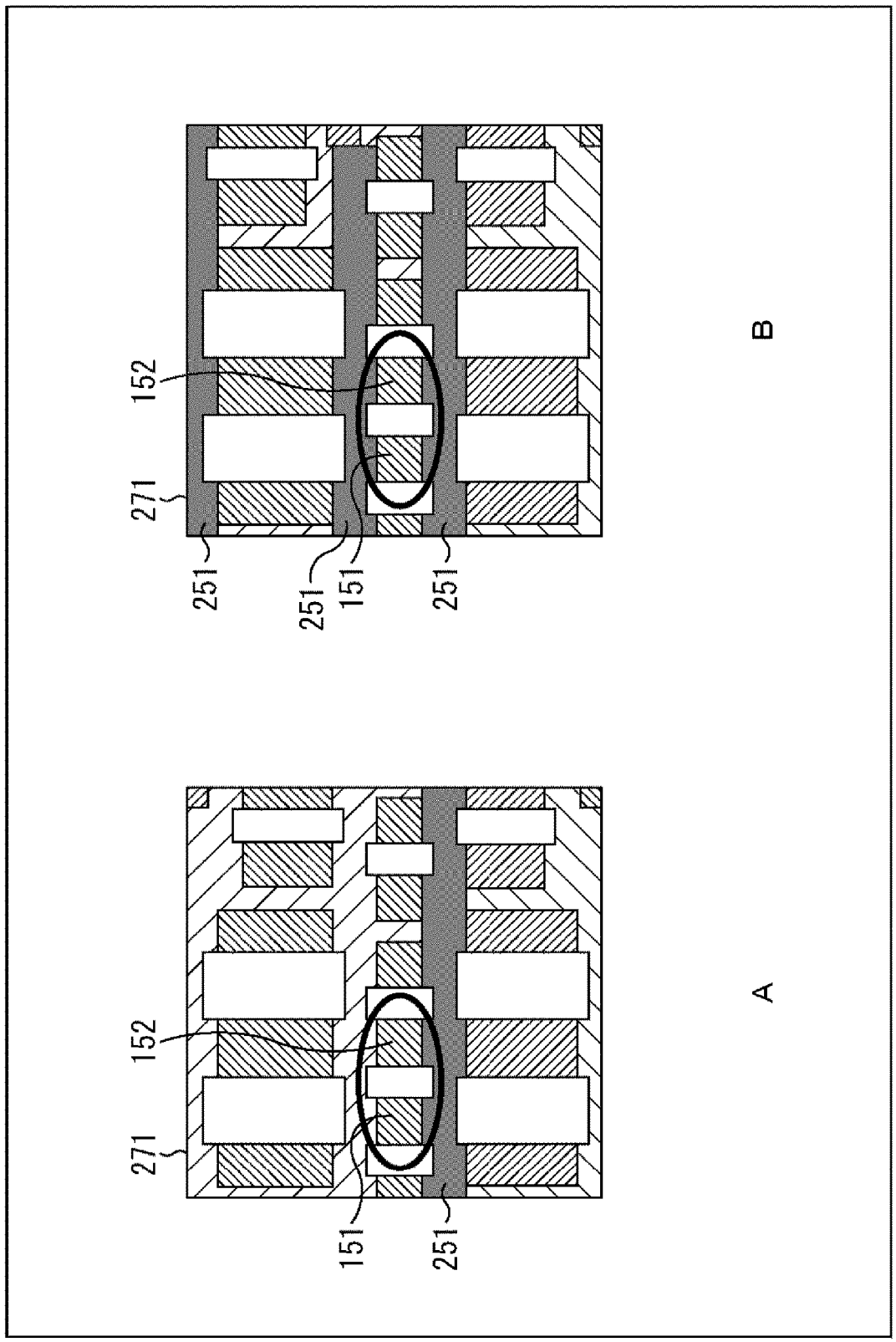
FIG. 9 is a set of plan views depicting other typical configurations of the element isolation layer of the unit pixel.

To avoid that, the element isolation regions 251 may be formed to be in contact with the side walls of the first floating diffusion layer 151 or the second floating diffusion layer 152 or both, as discussed above. This formation reduces the contact area between the depletion layer 282 formed around the floating diffusion layers on the one hand, and the boundary surface of the buried oxide film layer 232 on the other hand, as depicted in FIG. 8. This suppresses generation of the dark current. That in turn reduces any drop in the quality of images captured by the image sensor 100.

Where the element isolation layer 212 of the unit pixel 111 is configured as depicted in the example of FIG. 7, side walls are formed of the floating diffusion layers (i.e., first floating diffusion layer 151 or second floating diffusion layer 152, or both) in two directions (on the upper and the lower sides in the drawing). Alternatively, as in the example of Subfigure A in FIG. 9, the element isolation region 251 may be formed to be in contact with one of the side walls. As another alternative, as in the example of Subfigure B in FIG. 9, the element isolation regions 251 may be formed to be in contact with both side walls.

That is, the element isolation regions 251 may be formed in a manner contacting the side wall of the floating diffusion layer that accumulates the electrical charges resulting from photoelectric conversion, or in a manner contacting the multiple side walls of the floating diffusion layers. Where the element isolation regions 251 are formed as depicted in the example of Subfigure B in FIG. 9, the contact area between the floating diffusion layers and the element isolation regions 251 is increased. Consequently, the range in which depletion layers are generated around the floating diffusion layers is that much reduced. That is, the image sensor 100 suppresses the generation of the dark current without increasing pixel size, thereby reducing any drop in the quality of images captured by the image sensor 100.

Figure 10:
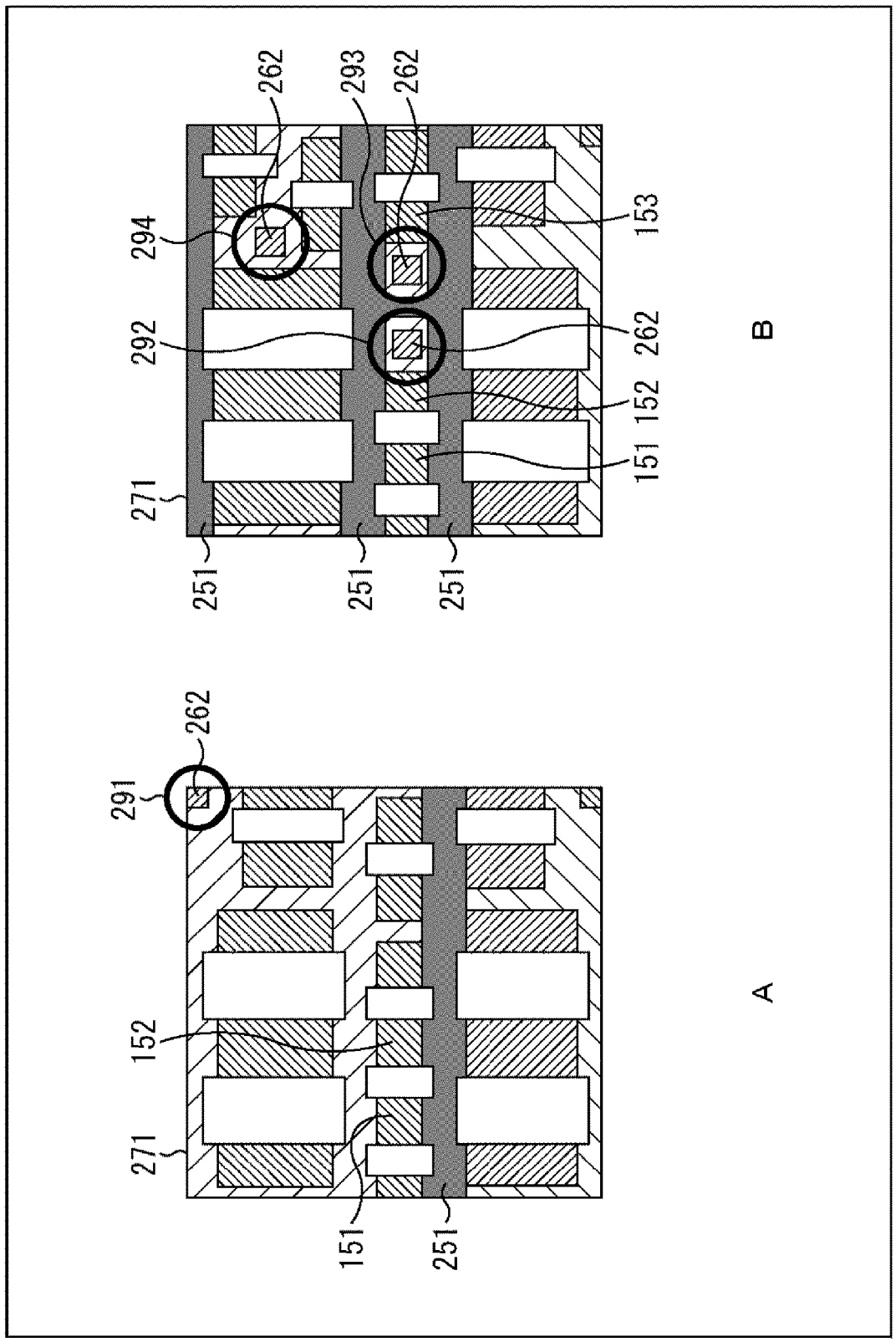
FIG. 10 is a set of plan views depicting other typical configurations of the element isolation layer of the unit pixel.

In the unit pixel 111, as indicated by a circle 291 in Subfigure A of FIG. 10, a well contact applicable to the entire P-well may be formed using one P+ diffusion layer 262, causing a common substrate bias to be impressed to the whole P-well.

Also in the unit pixel 111, as indicated by circles 292 to 294 in Subfigure B of FIG. 10, a well contact may be formed using the P+ diffusion layer 262 for each of the regions isolated by the element isolation regions 251 so that the well contacts may be impressed with a substrate bias independent of one another. In the example of Subfigure B in FIG. 10, the P-well of the second floating diffusion layer 152 is isolated from the other wells by the element isolation regions 251. The P+ diffusion layer 262 formed in the P-well is used to form a well contact dedicated to the second floating diffusion layer 152. This makes it possible to impress the substrate bias to the well contact dedicated to the second floating diffusion layer 152 independent of the other well contacts. That is, the well contact dedicated to the second floating diffusion layer 152 may be impressed with a substrate bias different from the ones for the other well contacts. This allows conversion efficiency to be varied and contributes to expanding the dynamic range of the image sensor 100.

That is, the element isolation regions 251 may be formed to isolate multiple floating diffusion layers formed in the unit pixel from one another. This allows the image sensor 100 to expand its dynamic range without increasing pixel size and to reduce any drop in the quality of images captured by the image sensor 100.

<Configuration Outside the Unit Pixel>

Figure 11:
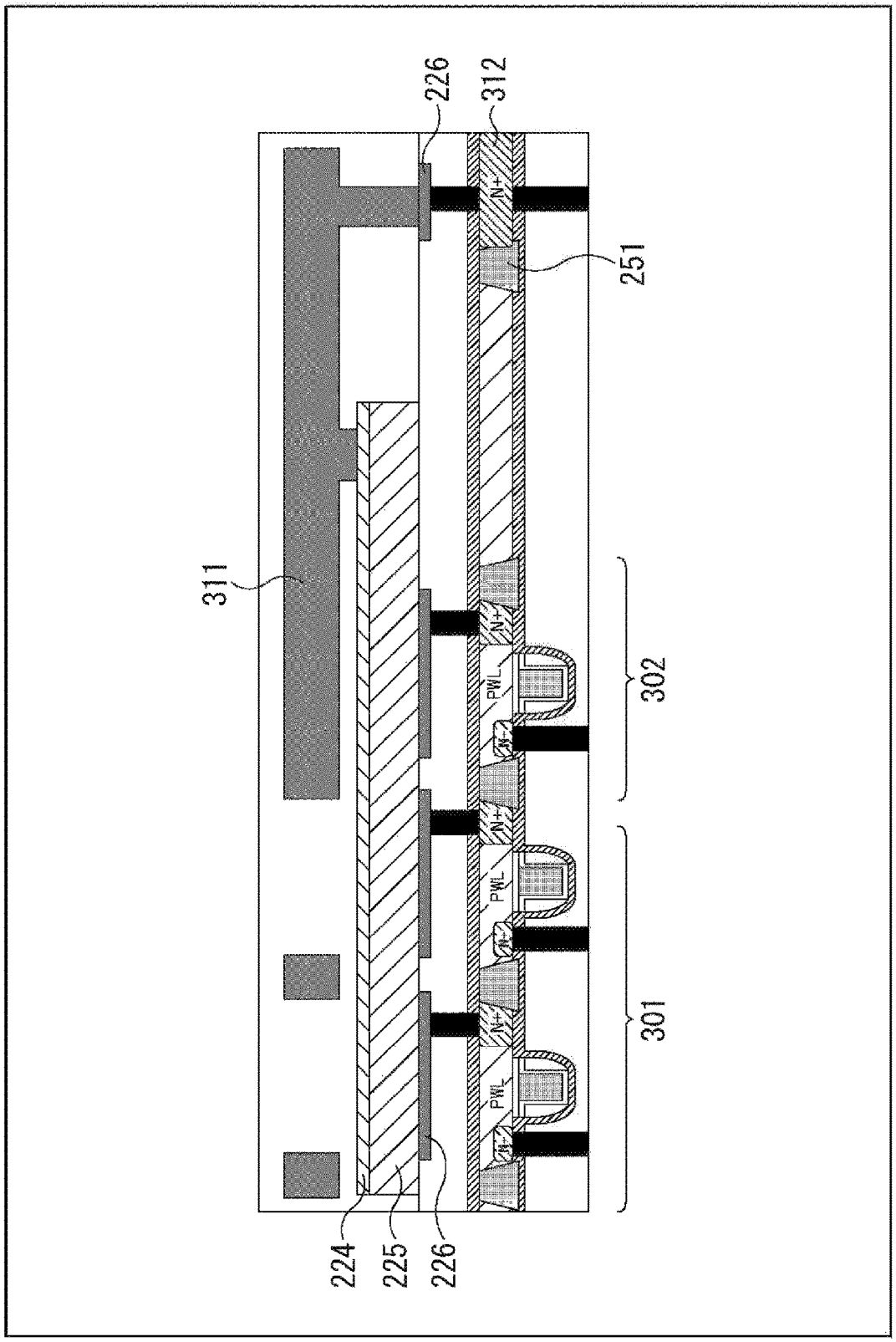
FIG. 11 is a cross-sectional diagram depicting a typical configuration of a pixel edge.

FIG. 11 is a cross-sectional diagram depicting a typical configuration of a pixel array edge. As depicted in the example of FIG. 11, a light incident plane is opened of an ordinary pixel 301 as a unit pixel formed apart from the edge of the pixel array 110. At the edge of the pixel array 110, a light shielding section 302 with its light incident plane light-shielded by a light shielding film 311 is formed.

The light shielding film 311 is formed of a conductive material such as a metal that does not transmit light. Outside the unit pixel 111, the upper electrode 224 is electrically connected with the element isolation layer 212 via the light shielding film 311. More specifically, outside the unit pixel 111, the light shielding film 311 electrically connects the upper electrode 224 with the lower electrode 226. The lower electrode 226 is electrically connected via electrode plugs with an N+ diffusion layer 312 that is a high-concentration diffusion layer formed in the element isolation layer 212.

As depicted in FIG. 11, as with the first floating diffusion layer 151, the N+ diffusion layer 312 is formed to be highly concentrated up to the buried oxide (BOX) film layer 232. That means the N+ diffusion layer 312 has the same impurity profile as the first floating diffusion layer 151. This simplifies the manufacturing processes and eliminates the need for wells.

Figure 12:
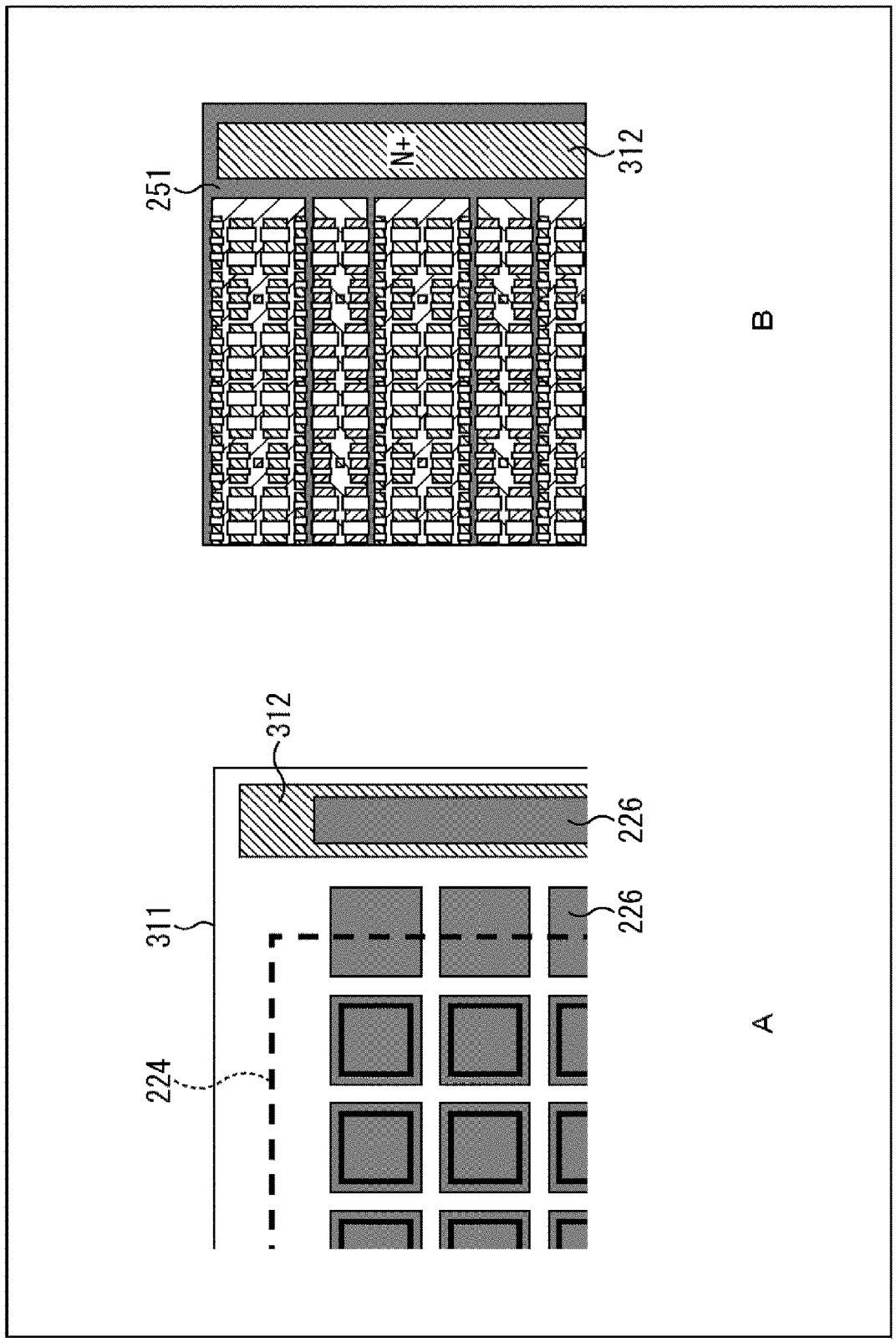
FIG. 12 is a set of plan views depicting a typical configuration of the pixel edge.

As depicted in Subfigure A of FIG. 12, the upper electrode 224 is connected with the N+ diffusion layer 312 via the light shielding film 311 and the lower electrode 226 disposed in a position different from the lower electrode 226 of each unit pixel 111 (i.e., outside the unit pixel 111).

And as depicted in the example of Subfigure B in FIG. 12, the element isolation regions 251 are formed in a manner surrounding the N+ diffusion layer 312. That is, the N+ diffusion layer 312 constituting a diffusion layer for the upper electrode 224 is isolated from the other parts by the element isolation regions 251.

The above configuration permits formation of the N+ diffusion layer 312 with no need to appropriate extensive well boundary regions. That in turn reduces any increase in substrate size.

Also as depicted in the example of Subfigure B in FIG. 12, the element isolation regions 251 are formed in a manner contacting the side walls of the N+ diffusion layer 312. This suppresses formation of a depletion layer around the N+ diffusion layer 312 and prevents the dark current from getting generated. As a result, any drop in the quality of images captured by the image sensor 100 is reduced without any increase in substrate size.

It is explained above how the pixel array 110 and the ADC array 120 are configured inside. Logic circuits, input/output (IO) circuits, and other parts may be disposed as desired outside the pixel array 110 over the pixel substrate 101 and outside the ADC array 120 over the circuit substrate 102.

Figure 13:
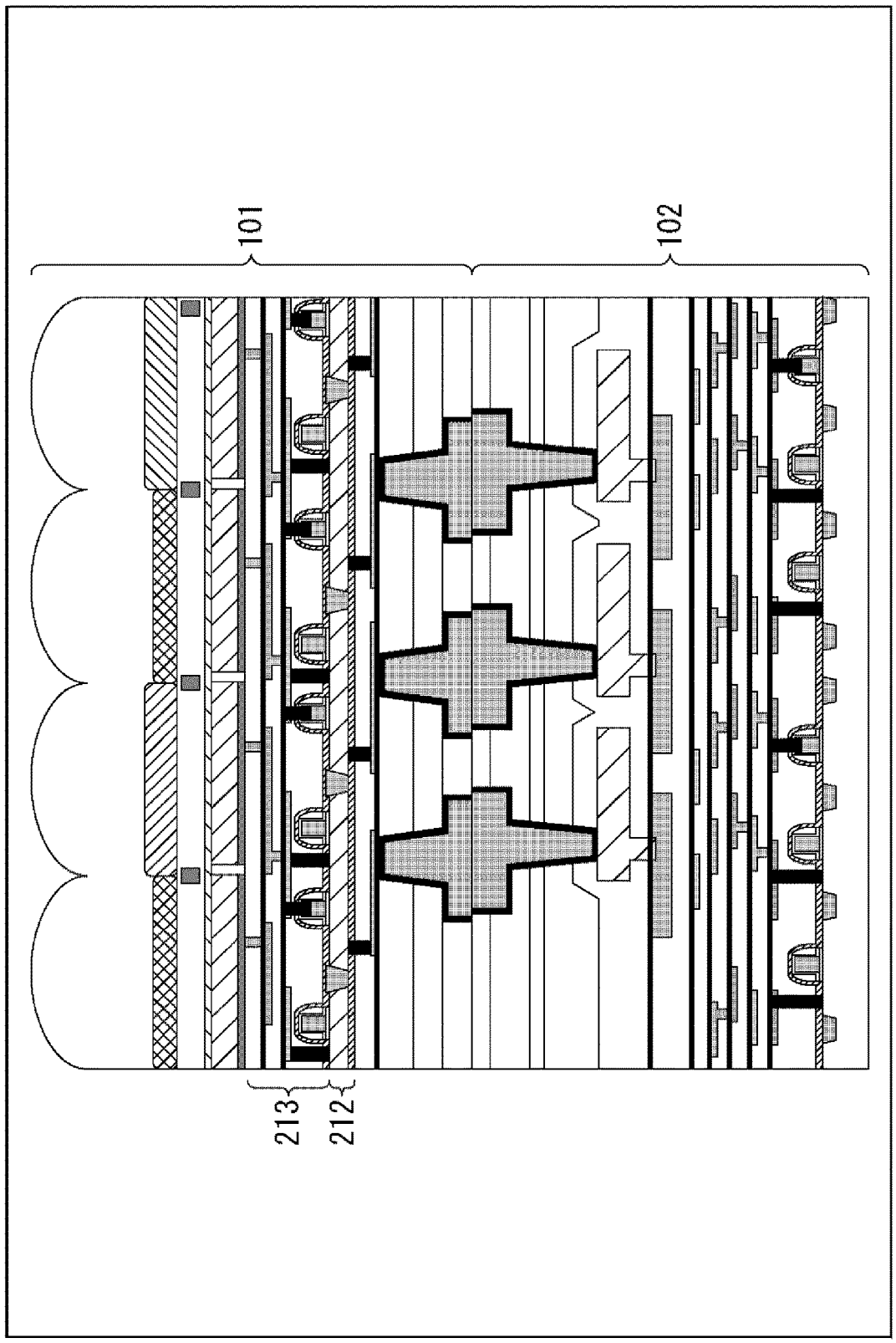
FIG. 13 is a cross-sectional diagram depicting a typical configuration of a front-illuminated image sensor.

In the foregoing paragraphs, a back-illuminated image sensor is described as an example. Alternatively, the present technology may be applied to a front-illuminated image sensor as depicted in FIG. 13 in which the transistor wiring layer 213 is positioned on the light incident side of the element isolation layer 212.

<Manufacturing Apparatus>

Figure 14:
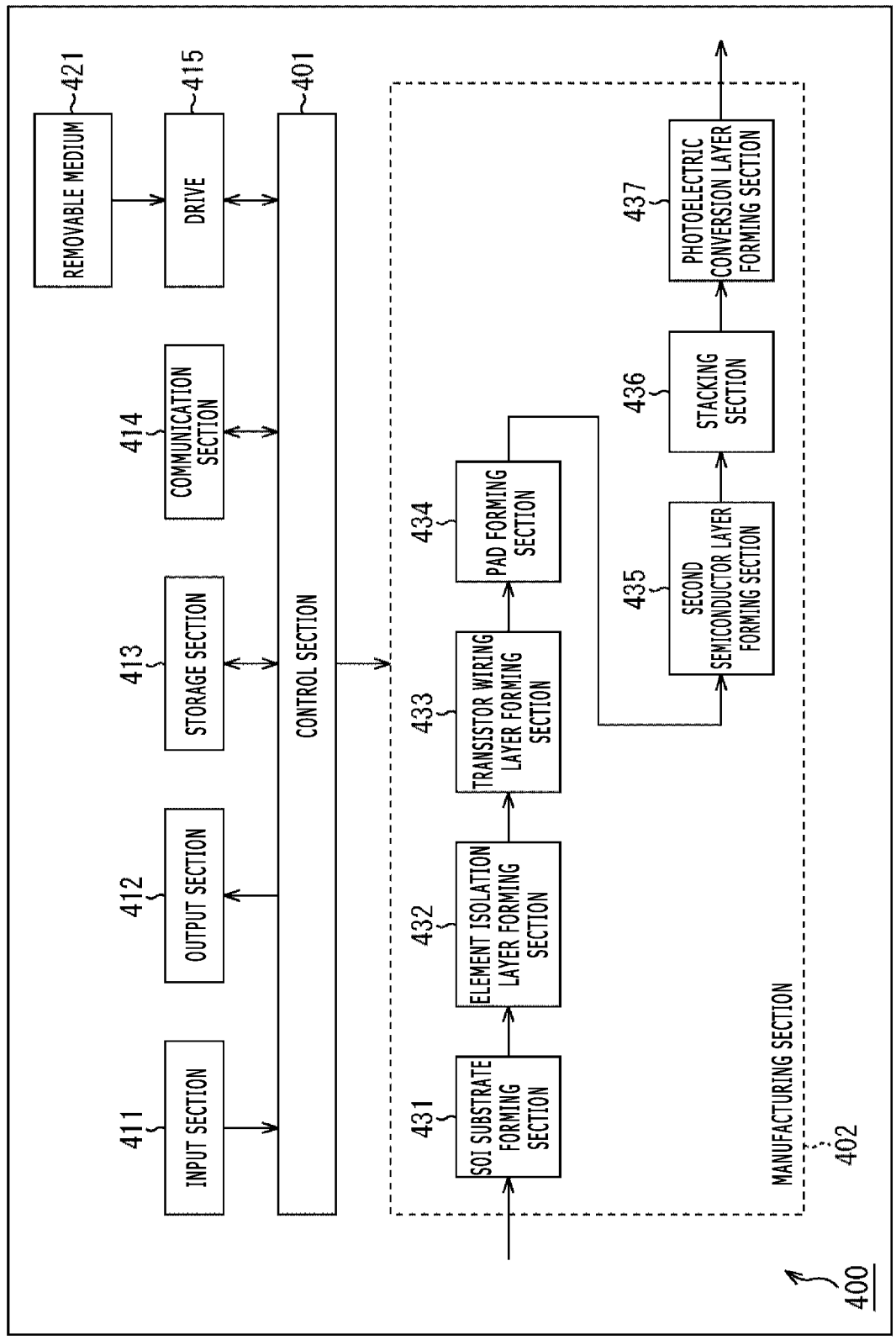
FIG. 14 is a block diagram depicting a typical configuration of a manufacturing apparatus.

FIG. 14 is a block diagram depicting a typical configuration of a manufacturing apparatus that manufactures the image sensor 100 as the imaging element to which the present technology is applied. A manufacturing apparatus 400 depicted in FIG. 14 includes a control section 401 and a manufacturing section 402.

The control section 401 includes a central processing unit (CPU), a read-only memory (ROM), and a random access memory (RAM), for example. The control section 401 controls the parts of the manufacturing section 402 and performs control processing related to manufacturing the image sensor 100. For example, the CPU of the control section 401 carries out various processes in accordance with programs stored in the ROM. The CPU further performs diverse processes in keeping with programs loaded from a storage section 413 into the RAM. The RAM may store data and other resources as needed for use by the CPU in performing the diverse processes.

Under control of the control section 401, the manufacturing section 402 performs processing related to manufacturing the image sensor 100. The manufacturing section 402 includes a silicon-on-insulator (SOI) substrate forming section 431, an element isolation layer forming section 432, a transistor wiring layer forming section 433, a pad forming section 434, a second semiconductor layer forming section 435, a stacking section 436, and a photoelectric conversion layer forming section 437.

The SOI substrate forming section 431 performs processes related to forming an SOI substrate configured to have $SiO_2$ inserted between a silicon (Si) substrate and a surface Si substrate. The element isolation layer forming section 432 performs processes related to forming the element isolation layer 212. The transistor wiring layer forming section 433 performs processes related to forming the transistor wiring layer 213. The pad forming section 434 performs processes related to forming the pads for electrically connecting circuits between the substrates. The second semiconductor layer forming section 435 performs processes related to forming the circuit substrate 102. The stacking section 436 performs processes related to stacking the pixel substrate 101 and the circuit substrate 102. The photoelectric conversion layer forming section 437 performs processes related to forming the photoelectric conversion layer 211 over the pixel substrate 101.

The above processing sections placed under control of the control section 401 carry out various processes for manufacturing the image sensor 100, as will be discussed later.

The manufacturing apparatus 400 further includes an input section 411, an output section 412, a storage section 413, a communication section 414, and a drive 415.

The input section 411 is made up of a keyboard, a mouse, a touch panel, and an external input terminal, for example. The input section 411 receives the input of instructions from a user or of information from the outside and feeds the received input to the control section 401. The output section 412 is formed by a display such as a cathode-ray tube (CRT) display or a liquid crystal display (LCD), speakers, and an external output terminal, for example. When supplied with diverse information from the control section 401, the output section 412 outputs the information in the form of images and sound, or as analog signals and digital data.

The storage section 413 includes a suitable storage medium such as a flash memory, a solid-state drive (SSD), or a hard disk. The storage section 413 stores information received from the control section 401 and, as requested by the control section 401, retrieves stored information and feeds the retrieved information to the control section 401.

The communication section 414 is configured from an interface or a modem adapted to wired or wireless local area networks (LAN), for example. The communication section 414 performs communication processing with an external apparatus via networks including the Internet. For example, the communication section 414 receives information from the control section 401, sends the received information to the communicating party, and supplies the control section 401 with information received from the communicating party.

The drive 415 is connected as needed with the control section 401. The drive 415 is loaded as needed with a removable medium 421 such as a magnetic disk, an optical disk, a magneto-optical disk, or a semiconductor memory. Computer programs read from the removable medium 421 via the drive 415 are installed as needed into the storage section 413.

<Flow of Manufacturing Processing>

Figure 15:
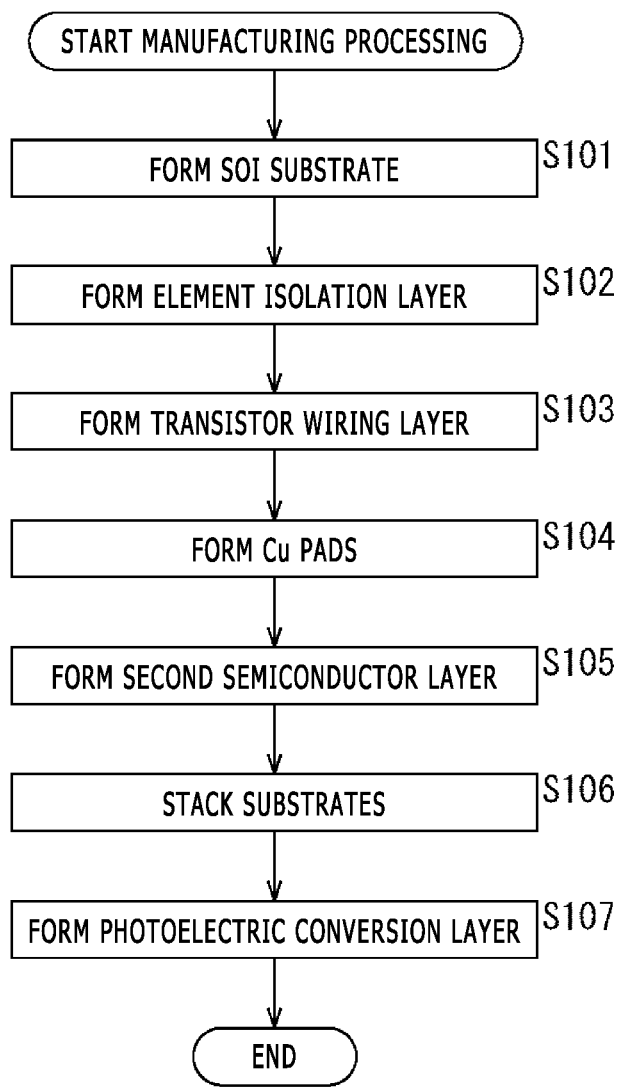
FIG. 15 is a flowchart explanatory of a typical flow of manufacturing processing.

Described below with reference to the flowchart of FIG. 15 is a typical flow of processing performed by the manufacturing apparatus 400 for manufacturing the image sensor 100. Reference will be made as needed to FIGS. 16 to 24 for the purpose of explanation.

When the manufacturing processing is started, step S101 is reached. In step S101, the SOI substrate forming section 431 under control of the control section 401 forms an SOI substrate configured as depicted in Subfigure A of FIG. 16, for example. In the example of Subfigure A in FIG. 16, the SOI substrate 500 has a three-layer structure made up of a silicon (Si) substrate 501, an $SiO_2$ layer 502, and an SOI layer 503 that constitutes a silicon surface layer. The SOI substrate forming section 431 forms an SOI substrate approximately 200 to 2000 nm thick, for example. Using this SOI substrate, the element isolation layer forming section 432 may form the element isolation layer 212 with a technique similar to ordinary shallow trench isolation (STI).

In step S102, the element isolation layer forming section 432 forms the element isolation layer 212 under control of the control section 401.

Figure 16:
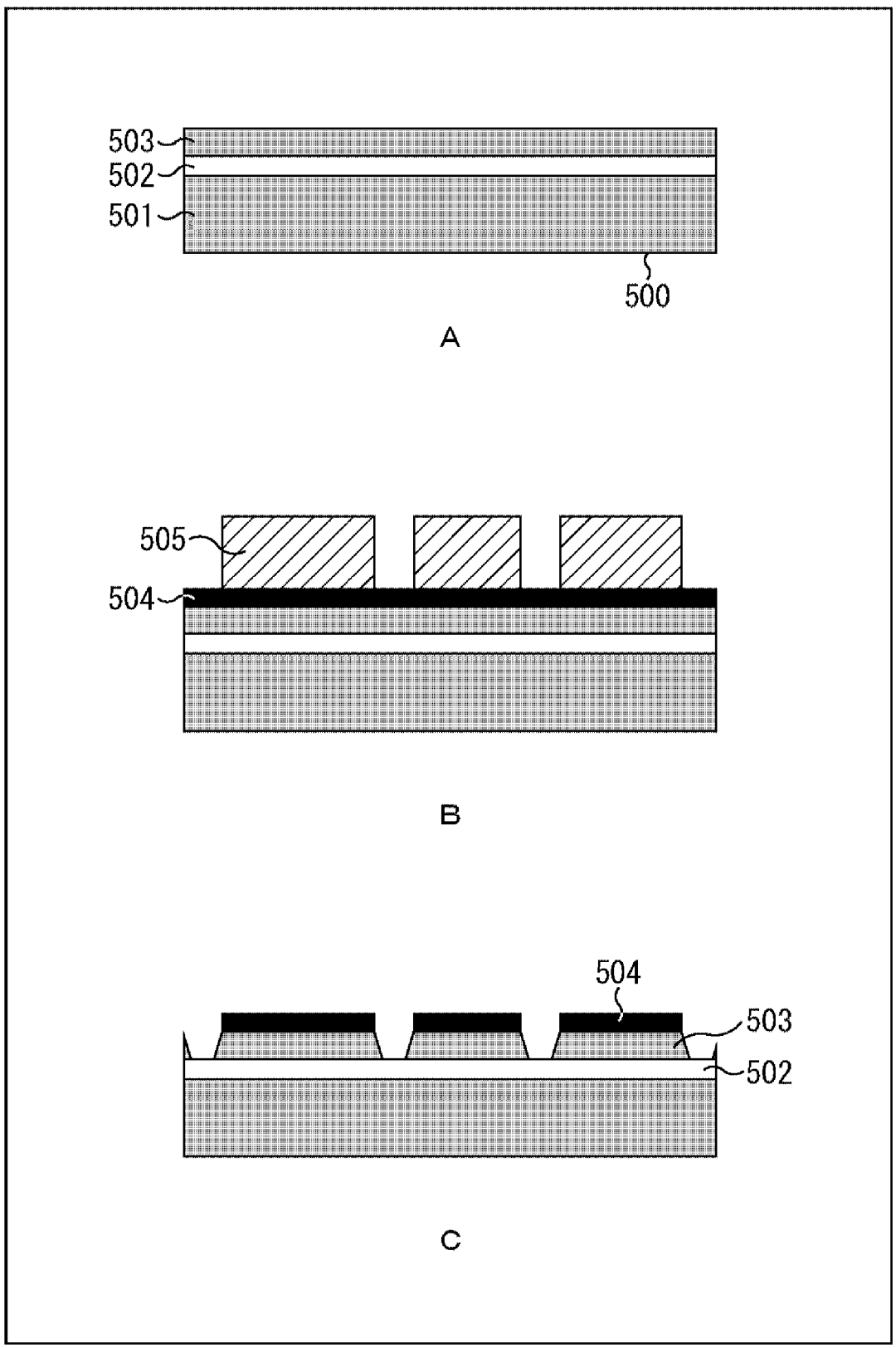
FIG. 16 is a set of cross-sectional diagrams explanatory of typical manufacturing processes.

As depicted in Subfigure B of FIG. 16, for example, the element isolation layer forming section 432 oxidizes the SOI substrate 500 to a depth of approximately 10 nm over the surface. The element isolation layer forming section 432 then forms a silicon nitride (SiN) film 504 by chemical vapor deposition (CVD). Thereafter, the element isolation layer forming section 432 applies a resist 505 to the film and exposes it to form an element isolation pattern.

The element isolation layer forming section 432 then performs dry etching to form a pattern in which the SiN film 504 and the SOI layer 503 are penetrated as depicted in Subfigure C of FIG. 16, for example.

The element isolation layer forming section 432 then performs the CVD process to deposit an $SiO_2$ film 506 to fill the penetrated portions with $SiO_2$, as depicted in Subfigure A of FIG. 17, for example.

The element isolation layer forming section 432 then performs chemical mechanical polishing (CMP) and wet etching to planarize the surface $SiO_2$ film 506, as depicted in Subfigure B of FIG. 17, for example. Thereafter, the element isolation layer forming section 432 removes the SiN film 504 as depicted in Subfigure C of FIG. 17, for example.

Returning to FIG. 15, the transistor wiring layer forming section 433 in step S103 forms the transistor wiring layer 213 under control of the control section 401.

The transistor wiring layer forming section 433 performs an ordinary CMOS process to form the transistor wiring layer 213 as depicted in Subfigure A of FIG. 18, for example.

Returning to FIG. 15, the pad forming section 434 in step S104 forms pads for connecting with the circuits of the circuit substrate 102 using a technique similar to ordinary Cu wiring formation.

The pad forming section 434 performs the CVD process to form a silicon carbide (SiC) film 512 and an $SiO_2$ film 513 over topmost layer wiring 511 (Subfigure A in FIG. 18), as depicted in Subfigure B of FIG. 18, for example.

The pad forming section 434 then applies a resist onto the $SiO_2$ film 513, exposes it, and performs dry etching of the $SiO_2$ film 513 to form a groove pattern 514 constituting pads, as depicted in Subfigure C of FIG. 18, for example.

The pad forming section 434 again applies a resist, exposes it, and performs dry etching of the $SiO_2$ film 513 and the SiC film 512 to form holes 515 serving as connection via-holes connecting the pads with the topmost layer wiring 511 as depicted in Subfigure A of FIG. 19, for example.

Then as depicted in Subfigure B of FIG. 19, the pad forming section 434 performs a physical vapor deposition (PVD) process to deposit a barrier metal film 516 approximately 10 nm thick, forms a Cu film by plating, and polishes the Cu film by CMP to expose the SiO$_2$ film 513, thereby forming the pads 201.

Returning to FIG. 15, the second semiconductor layer forming section 435 in step S105 forms the circuit substrate 102 constituting a second semiconductor layer. The second semiconductor layer forming section 435 performs an ordinary CMOS process to form layers such as the element isolation layer, the transistor layer, and the wiring layer over the circuit substrate 102.

Pads are also formed in the topmost layer of the circuit substrate 102 for connection with the pixel substrate 101. These pads may also be formed using a technique similar to that for the above-described pads over the pixel substrate 101. The pads over the circuit substrate 102 are laid out in such a manner that when the substrate is inverted, these pads coincide positionally with the pads over the pixel substrate 101.

In step S106, the stacking section 436 stacks the pixel substrate 101 and the circuit substrate 102 one on top of another. More specifically, the stacking section 436 inverts the pixel substrate 101 and pastes the pixel substrate 101 and the circuit substrate 102 together, before subjecting them to a heating process at approximately 350 degrees Celsius.

Figure 20:
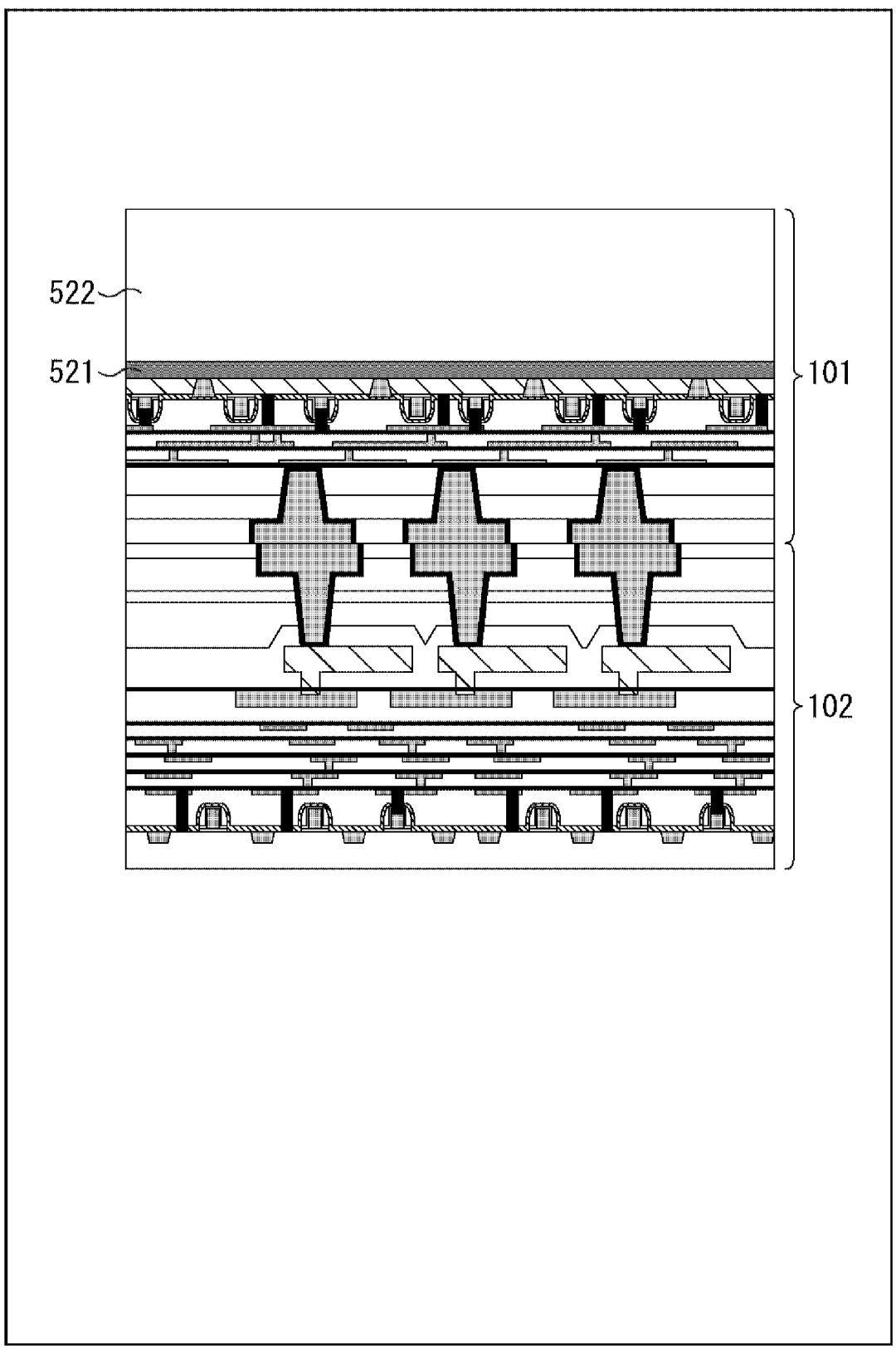
FIG. 20 is a cross-sectional diagram explanatory of a typical manufacturing process.

FIG. 20 is a cross-sectional diagram depicting how the pixel substrate 101 and the circuit substrate 102 are stacked on each other. As depicted in FIG. 20, a silicon (Si) substrate 522 as an SOI substrate and an SiO$_2$ layer 521 as a BOX layer are stacked over the element isolation layer 212 of the pixel substrate 101.

In step S107, the photoelectric conversion layer forming section 437 processes the SOI substrate to form the photoelectric conversion layer 211.

The photoelectric conversion layer forming section 437 performs CMP and wet etching to remove the silicon (Si) substrate 522 so as to expose the SiO$_2$ layer 521, as depicted in Subfigure A of FIG. 21, for example.

The photoelectric conversion layer forming section 437 then performs wet etching to remove the SiO$_2$ layer 521 to expose the SOI layer (element isolation layer 212), as depicted in Subfigure B of FIG. 21, for example.

The photoelectric conversion layer forming section 437 then performs the CVD and PVD processes to form the buried oxide film layer 232 over the element isolation layer 212, before depositing the insulating layer 231 such as an SiO$_2$ layer approximately 100 nm thick over the buried oxide film layer 232, as depicted in Subfigure C of FIG. 21, for example.

The photoelectric conversion layer forming section 437 then applies a resist, exposes it, and performs dry etching of the insulating layer 231 to form, as depicted in Subfigure A of FIG. 22, connection holes 523 connecting the electrodes of the photoelectric conversion section 225 with the element isolation layer 212 (i.e., connection holes connecting the lower electrode 226 with the first floating diffusion layer 151 in the element isolation layer, and connection holes connecting the upper electrode 224 with the N+ diffusion layer 312 as a high-concentration diffusion layer for the upper electrode 224).

The photoelectric conversion layer forming section 437 then uses the CVD or PVD process to deposit the lower electrode 226 of tantalum nitride (TaN), for example. Before forming the lower electrode 226, the photoelectric conversion layer forming section 437 may form tungsten (W) plugs.

The photoelectric conversion layer forming section 437 then applies a resist, exposes it, and performs dry etching of the TaN film to form a lower electrode pattern as depicted in Subfigure B of FIG. 22, for example. At this point, the lower electrode 226 is divided into portions corresponding to the individual unit pixels 111 as viewed on a plane. Outside the unit pixels 111, the lower electrode 226 for the upper electrode 224 is formed.

The photoelectric conversion layer forming section 437 then performs the PVD process, for example, to deposit the photoelectric conversion section 225 such as an organic photoelectric conversion film and the upper electrode 224 as a transparent electrode film typically formed of indium tin oxide (ITO).

The photoelectric conversion layer forming section 437 then applies a resist, exposes it, and performs dry etching to remove the photoelectric conversion section 225 and the upper electrode 224 outside the pixel regions, as depicted in Subfigure C of FIG. 22, for example. At this point, the upper electrode 224 and the photoelectric conversion section 225 may be divided into portions corresponding to the individual pixels or may be kept undivided to cover the entire pixel regions. The processing cost involved will be reduced if the upper electrode 224 and the photoelectric conversion section 225 are configured to cover the entire pixel regions.

The photoelectric conversion layer forming section 437 performs the CVD process to deposit an SiO$_2$ film constituting an insulating film for the inter-pixel light shielding layer 223 on the upper electrode 224, before applying a resist and exposing it. This, as depicted in Subfigure A of FIG. 23, for example, forms connection holes 524 over the upper electrode 224 at the edge of the pixel array 110. Connection holes 525 are further formed over the lower electrode 226 to connect the upper electrode 224 with the element isolation layer 212.

The photoelectric conversion layer forming section 437 then performs the PVD or CVD process to deposit a tungsten (W) film, before applying a resist and exposing it. This, as depicted in Subfigure B of FIG. 23, for example, forms a light shielding pattern as well as a wiring pattern for connecting the upper electrode 224 with the element isolation layer 212. The light shielding pattern may be formed as wide as approximately several pixels at the edge inside the pixel array 110. Inter-pixel light shielding walls may also be formed to prevent the mixing of colors between the unit pixels.

The photoelectric conversion layer forming section 437 then buries the inter-pixel light shielding walls of the inter-pixel light shielding layer 223, the light shielding pattern in Subfigure B of FIG. 23, and the wiring patterns with the insulating film such as an organic film, as depicted in Subfigure C of FIG. 23, for example.

Figure 24:
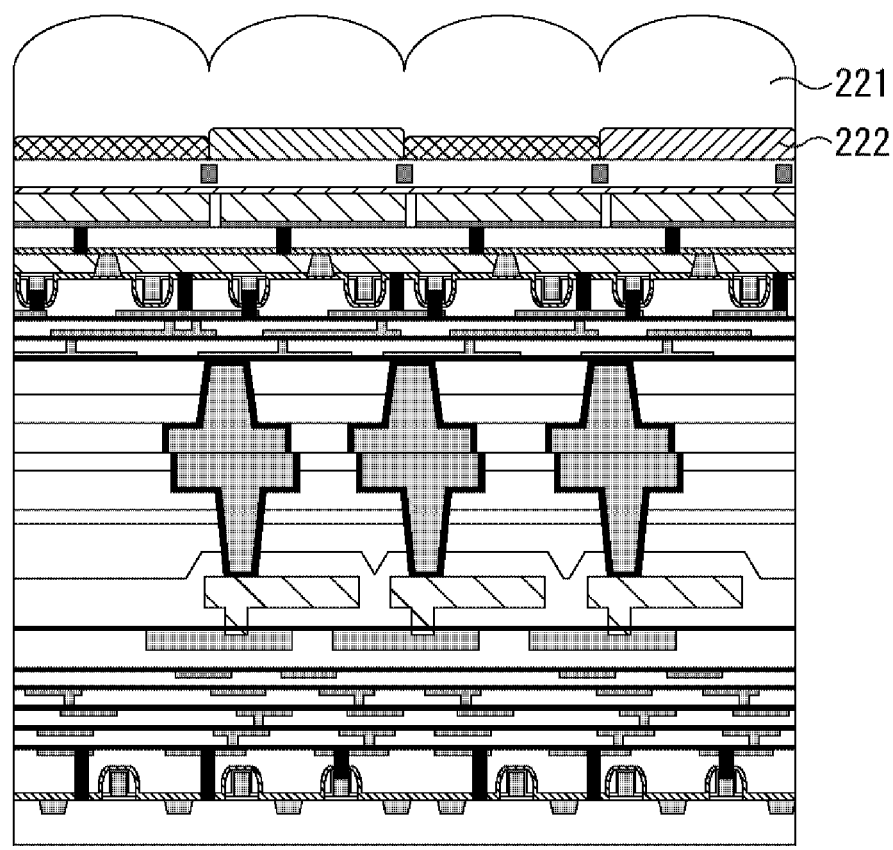
FIG. 24 is a cross-sectional diagram explanatory of a typical manufacturing process.

The photoelectric conversion layer forming section 437 then forms the color filters 222 over the inter-pixel light shielding layer 223, before forming the micro lenses 221 over the color filters 222, as depicted in FIG. 24, for example.

After the image sensor 100 is created as described above, the manufacturing section 402 outputs the image sensor 100 to the outside. This terminates the manufacturing processing.

By performing the manufacturing processing as described above, the manufacturing apparatus 400 creates the image sensor 100 (FIG. 1) to which the present technology is applied. That is, manufacturing the image sensor 100 in the manner described above reduces any increase in pixel size and lessens any drop in image quality.

2. Second Embodiment

<Image Sensor>

In the above-described image sensor 100, the photoelectric conversion section may be configured as desired and is not limited to the example discussed above. For instance, multiple photoelectric conversion sections may be stacked on top of another to absorb light in different wavelength bands.

Figure 25:
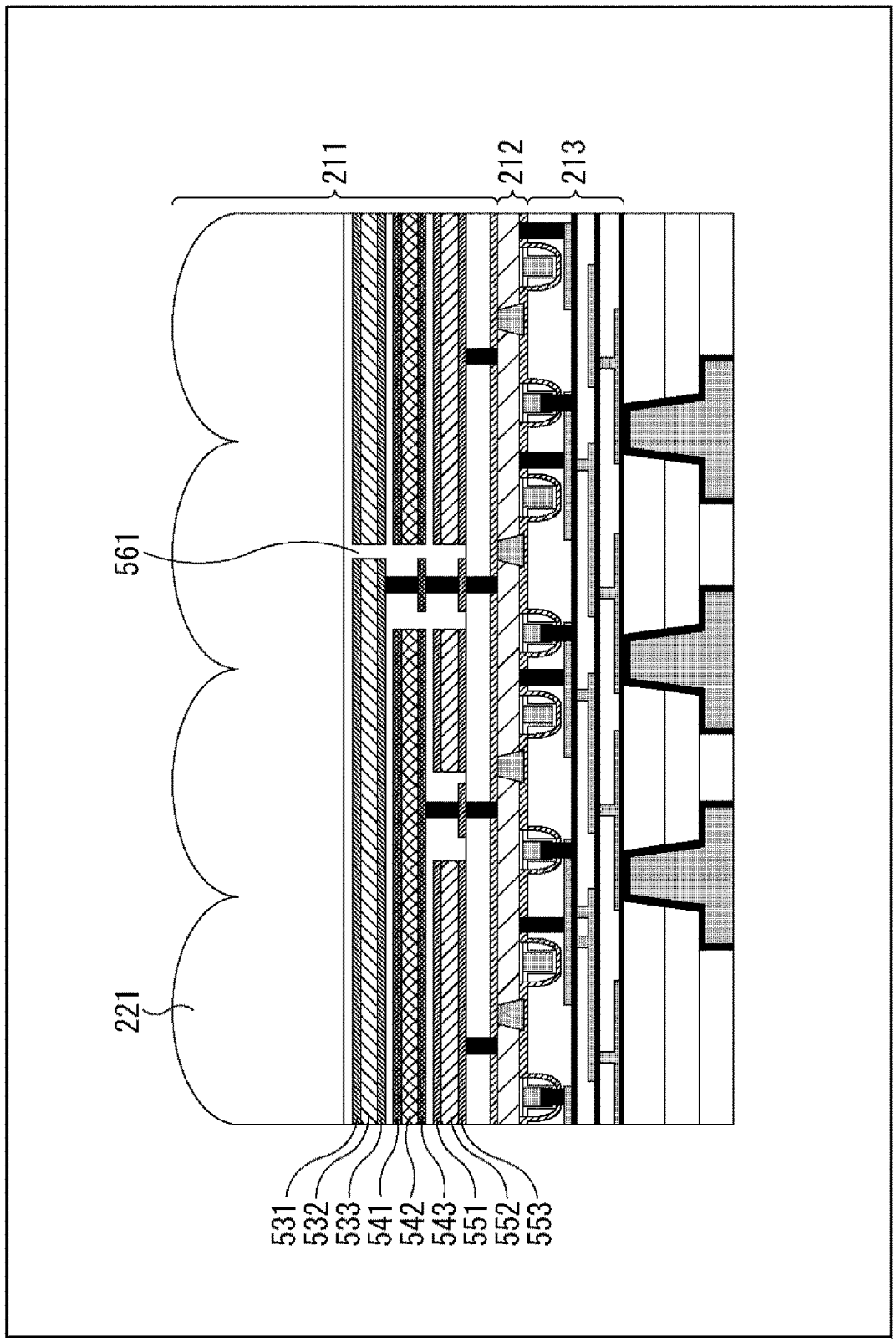
FIG. 25 is a cross-sectional diagram depicting a typical configuration of the pixel substrate.

FIG. 25 is a cross-sectional diagram depicting another typical configuration of the pixel substrate 101 for the image sensor 100 constituting an imaging element embodying the present technology. FIG. 25 corresponds to FIG. 4 depicting the first embodiment. The image sensor 100 of the second embodiment is also configured substantially the same as the first embodiment explained above with reference to FIGS. 1 to 3. That is, the image sensor 100 in this case is also made up of the pixel substrate 101 and the circuit substrate 102. The pixel array 110 and other parts are formed over the pixel substrate 101, and the ADC array 120 and other parts are formed over the circuit substrate 102.

In the second embodiment (example in FIG. 25), unlike in the first embodiment (FIG. 4), three photoelectric conversion sections are formed and stacked on top of another in the photoelectric conversion layer 211 over the pixel substrate 101 so as to absorb incident light components in different wavelength bands.

That is, the image sensor 100 of the second embodiment has multiple photoelectric conversion sections configured to be stacked on one another for photoelectric conversion of light in different wavelength bands.

The wavelength bands of light to be absorbed by the stacked photoelectric conversion sections may be determined as desired. There may be provided as many photoelectric conversion sections to be stacked as desired. In the ensuing paragraphs, it is assumed that there are provided, as depicted from top to bottom in the drawing, a blue light photoelectric conversion section 532 absorbing the wavelength band of blue light, a green light photoelectric conversion section 542 absorbing the wavelength band of green light, and a red light photoelectric conversion section 552 absorbing the wavelength band of red light.

The blue light photoelectric conversion section 532 is configured to be sandwiched between an upper electrode 531 and a lower electrode 533 for the blue light photoelectric conversion section 532. The green light photoelectric conversion section 542 is configured to be sandwiched between an upper electrode 541 and a lower electrode 543 for the green light photoelectric conversion section 542. The red light photoelectric conversion section 552 is configured to be sandwiched between an upper electrode 551 and a lower electrode 553 for the red light photoelectric conversion section 552.

The blue light photoelectric conversion section 532, the green light photoelectric conversion section 542, and the red light photoelectric conversion section 552 are each configured from an organic photoelectric conversion film, a compound semiconductor, or quantum dots. At least the upper electrode 531, the lower electrode 533, the upper electrode 541, the lower electrode 543, and the upper electrode 551 are constituted by transparent electrodes for transmitting light.

An $SiO_2$ film 561 is formed as an insulating film between the lower electrode 533 and the upper electrode 541 as well as between the lower electrode 543 and the upper electrode 551. The upper and the lower electrodes are thus electrically insulated from each other. The blue light photoelectric conversion section 532, the green light photoelectric conversion section 542, and the red light photoelectric conversion section 552 stacked on one another are connected, via their respective lower electrodes, with the element isolation layer 212 of different unit pixels 111 using electrode plugs. That is, the electrical charges obtained by the blue light photoelectric conversion section 532, the green light photoelectric conversion section 542, and the red light photoelectric conversion section 552 are the electrical charges destined for different unit pixels 111.

In other words, each photoelectric conversion section may receive light with an area as wide as three pixels. In this case, the image sensor 100 can expand its dynamic range without increasing pixel size while reducing any drop in the quality of images captured by the image sensor 100.

The other layers of the second embodiment are configured substantially the same as the first embodiment. That is, the image sensor 100 of the second embodiment includes, in the unit pixel 111 holding the photoelectric conversion section for photoelectrically converting incident light, the element isolation regions 251 which are made of an insulating material and which penetrate the element isolation layer 212 constituting a semiconductor layer in which transistors are formed. This configuration provides the effects similar to those of the first embodiment. That is, the image sensor 100 of the second embodiment also reduces any increase in pixel size and lessens any drop in image quality.

<Configuration Outside the Unit Pixels>

Figure 26:
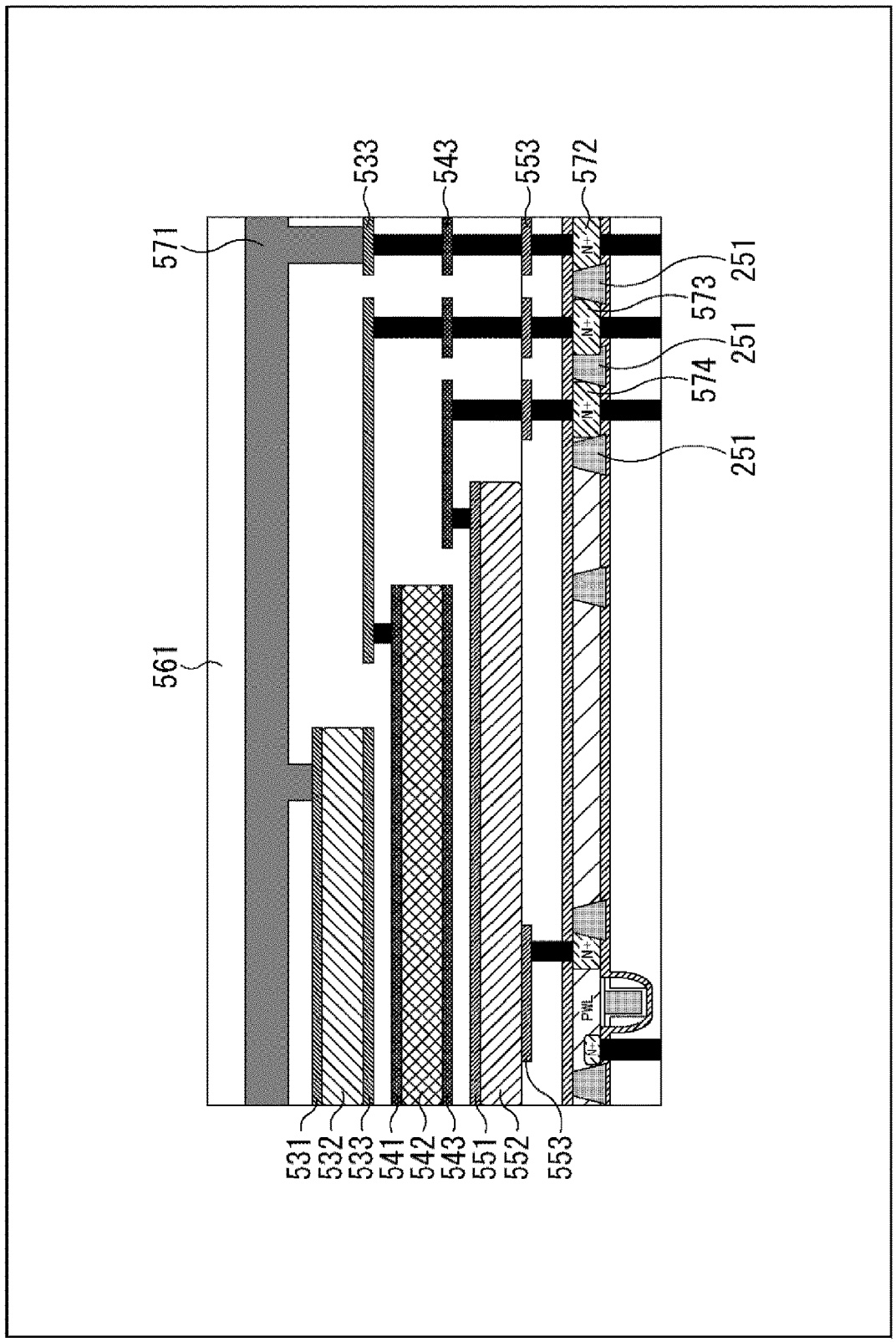
FIG. 26 is a cross-sectional diagram depicting a typical configuration of the pixel edge.

The configuration outside the unit pixels 111 at the edge of the pixel array 110 may be as depicted in FIG. 26, for example.

In the example of FIG. 26, the blue light photoelectric conversion section 532 is connected with an N+ diffusion layer 572 formed over an element isolation layer 512, by way of the upper electrode 531, a light shielding film 571 for light-shielding the edge of the pixel array 110, the lower electrode 533 for electrically connecting the blue light photoelectric conversion section 532 with the element isolation layer 512, the lower electrode 543, the lower electrode 553, and electrode plugs for electrically interconnecting these parts.

The green light photoelectric conversion section 542 is connected with an N+ diffusion layer 573 formed over the element isolation layer 512, by way of the upper electrode 541, the lower electrode 533 for electrically connecting the green light photoelectric conversion section 542 with the element isolation layer 512, the lower electrode 543, the lower electrode 553, and electrode plugs for electrically interconnecting these parts.

The red light photoelectric conversion section 552 is connected with an N+ diffusion layer 574 formed over the element isolation layer 512, by way of the upper electrode 551, the lower electrode 543 for electrically connecting the red light photoelectric conversion section 552 with the element isolation layer 512, the lower electrode 553, and electrode plugs for electrically interconnecting these parts.

The N+ diffusion layers 572, 573 and 574 are isolated from one another by the element isolation regions 251.

The above-described configuration allows the N+ diffusion layer 312 to be formed with no need to appropriate extensive well boundary regions. That is, any increase in substrate size is reduced.

The configuration outside the unit pixels 111 at the edge of the pixel array 110 is not limited to the example in FIG. 26. Alternatively, the configuration may be as depicted in FIG. 27.

Figure 27:
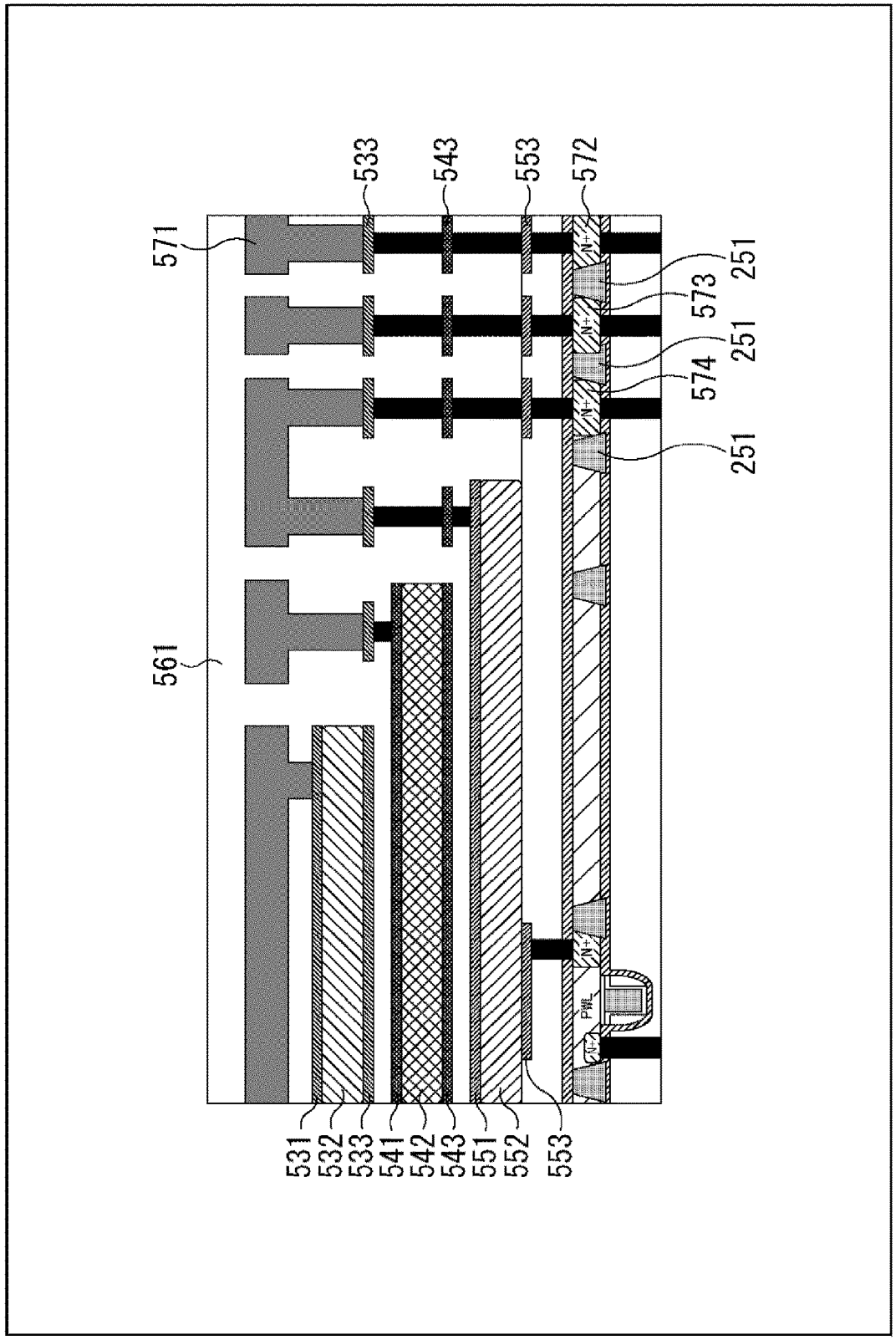
FIG. 27 is a cross-sectional diagram depicting another typical configuration of the pixel edge.

In the example of FIG. 27, the blue light photoelectric conversion section 532, the green light photoelectric conversion section 542, and the red light photoelectric conversion section 552 are each connected electrically with the element isolation layer 212 via the light shielding film 571. As in the example of FIG. 26, the blue light photoelectric conversion section 532 is connected with the N+ diffusion layer 572, the green light photoelectric conversion section 542 is connected with the N+ diffusion layer 573, and the red light photoelectric conversion section 552 is connected with the N+ diffusion layer 574. The N+ diffusion layers 572, 573 and 574 are isolated from one another by the element isolation regions 251.

The above configuration, as in the case of FIG. 26, allows the N+ diffusion layer 312 to be formed with no need to appropriate extensive well boundary regions. That is, any increase in substrate size is reduced.

In the second embodiment, as in the case of the first embodiment, logic circuits, IO circuits, and other parts may be disposed as desired outside the pixel array 110 over the pixel substrate 101 and outside the ADC array 120 over the circuit substrate 102.

Figure 28:
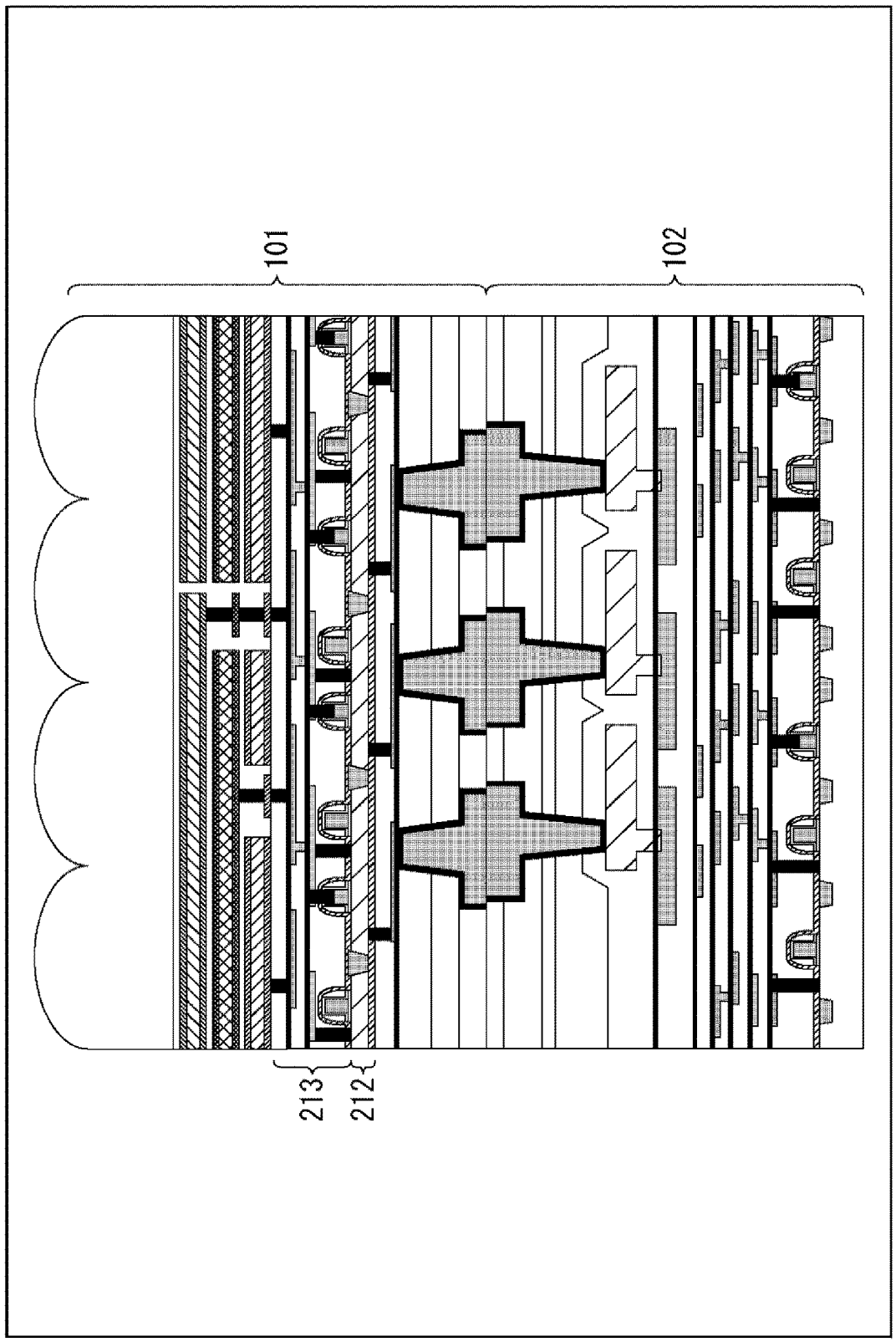
FIG. 28 is a cross-sectional diagram depicting a typical configuration of the front-illuminated image sensor.

Also in the second embodiment, as in the case of the first embodiment, the present technology may be applied to a front-illuminated image sensor as depicted in FIG. 28 in which the transistor wiring layer 213 is positioned on the light incident side of the element isolation layer 212.

<Manufacturing Apparatus>

The image sensor 100 may be manufactured by the manufacturing apparatus 400 of the second embodiment similar to that of the first embodiment.

<Flow of the Manufacturing Processing>

The manufacturing processing of the second embodiment may be performed in a manner similar to that of the first embodiment for manufacturing the image sensor 100.

As described above, the image sensor 100 of the second embodiment differs from that of the first embodiment in how the photoelectric conversion layer 211 is configured. To elaborate on this point, the process carried out in step S107 (FIG. 15) is explained below in detail.

The photoelectric conversion layer forming section 437 performs CMP and wet etching to remove the silicon (Si) substrate 522 so as to expose the SiO$_2$ layer 521, as depicted in Subfigure A of FIG. 29, for example.

The photoelectric conversion layer forming section 437 then performs wet etching to remove the SiO$_2$ layer 521 so as to expose the SOI layer (element isolation layer 212), as depicted in Subfigure B of FIG. 29, for example.

The photoelectric conversion layer forming section 437 then performs the CVD process and PVD process to form the buried oxide film layer 232 over the element isolation layer 212, before depositing the insulating layer 231 such as an SiO$_2$ layer approximately 100 nm thick over the buried oxide film layer 232, as depicted in Subfigure C of FIG. 29, for example.

The photoelectric conversion layer forming section 437 then applies a resist, exposes it, and performs dry etching of the insulating layer 231 to form connection holes 581 connecting the lower electrode 553 with the element isolation layer 212, as depicted in Subfigure A of FIG. 30, for example.

The photoelectric conversion layer forming section 437 then performs the CVD process and PVD process to deposit the lower electrode 226 of tantalum nitride (TaN), for example. Before depositing the film of the lower electrode 226, the photoelectric conversion layer forming section 437 may form tungsten (W) plugs.

The photoelectric conversion layer forming section 437 then applies a resist, exposes it, and performs dry etching of the TaN film to form the pattern of the lower electrode 553, as depicted in Subfigure B of FIG. 30, for example. At this point, the lower electrode 553 is divided into portions corresponding to the individual unit pixels 111 as viewed on a plane. Formed outside the unit pixels 111 are the lower electrode 553 connected with the upper electrode 531, the lower electrode 553 connected with the upper electrode 541, and the lower electrode 553 connected with the upper electrode 551.

The photoelectric conversion layer forming section 437 then performs the PVD process, for example, to deposit the red light photoelectric conversion section 552 and the upper electrode 551 over the lower electrode 553.

The photoelectric conversion layer forming section 437 then applies a resist, exposes it, and performs dry etching to remove the red light photoelectric conversion section 552 and the upper electrode 551 outside the pixel array 110, as depicted in Subfigure C of FIG. 30, for example. At this point, the upper electrode 551 and the red light photoelectric conversion section 552 may be divided into portions corresponding to the individual unit pixels 111 or may be configured to cover the entire pixel array 110. The processing cost involved will be reduced if the upper electrode 551 and the red light photoelectric conversion section 552 are configured to cover the entire pixel array 110. This, however, requires making holes serving as connection parts connecting the first and the second lower electrodes from above with a first semiconductor layer.

After forming the SiO$_2$ film 561 by the CVD process, the photoelectric conversion layer forming section 437 applies a resist, exposes it, and performs dry etching to form connection holes 582 connecting the lower electrode 543 with the upper electrode 551 or the lower electrode 553, as depicted in Subfigure D of FIG. 30, for example.

The photoelectric conversion layer forming section 437 then performs the CVD process and PVD process to deposit the lower electrode 543 constituted by a transparent ITO film, for example. Before depositing the lower electrode 543, the photoelectric conversion layer forming section 437 may form tungsten (W) plugs.

The photoelectric conversion layer forming section 437 then applies a resist, exposes it, and performs dry etching of the lower electrode 543 to form the pattern of the lower electrode 543, as depicted in Subfigure A of FIG. 31, for example.

The photoelectric conversion layer forming section 437 then performs the PVD process, for example, to deposit the green light photoelectric conversion section 542 and its upper electrode 541.

The photoelectric conversion layer forming section 437 then applies a resist, exposes it, and performs dry etching to remove the upper electrode 541 and the green light photoelectric conversion section 542 outside the pixel array 110, as depicted in Subfigure B of FIG. 31, for example. At this point, the upper electrode 541 and the green light photoelectric conversion section 542 may be divided into portions corresponding to the individual unit pixels 111 or may be configured to cover the entire pixel array 110. The processing cost involved will be reduced if the upper electrode 541 and the green light photoelectric conversion section 542 are configured to cover the entire pixel array 110. This, however, requires making holes serving as connection parts connecting the first lower electrode from above with the first semiconductor layer.

After depositing the SiO$_2$ film 561 by the CVD process, the photoelectric conversion layer forming section 437 applies a resist, exposes it, and performs dry etching to form connection holes 583 connecting the lower electrode 533 with the upper electrode 541 or the lower electrode 543, as depicted in Subfigure C of FIG. 31, for example.

The photoelectric conversion layer forming section 437 then performs the CVD process and PVD process to deposit the lower electrode 533 constituted by a transparent ITO film, for example. Before depositing the lower electrode 533, the photoelectric conversion layer forming section 437 may form tungsten (W) plugs.

The photoelectric conversion layer forming section 437 then applies a resist and exposes it to form the pattern of the lower electrode 533, as depicted in Subfigure A of FIG. 32, for example.

The photoelectric conversion layer forming section 437 then performs the PVD process, for example, to deposit the blue light photoelectric conversion section 532 and its upper electrode 531.

The photoelectric conversion layer forming section 437 then applies a resist, exposes it, and performs dry etching to remove the upper electrode 531 and the blue light photoelectric conversion section 532 outside the pixel array 110, as depicted in Subfigure B of FIG. 32, for example. At this point, the upper electrode 531 and the blue light photoelectric conversion section 532 may be divided into portions corresponding to the individual unit pixels 111 or may be configured to cover the entire pixel array 110. The processing cost involved will be reduced if the upper electrode 531 and the blue light photoelectric conversion section 532 are configured to cover the entire pixel array 110.

Figure 33:
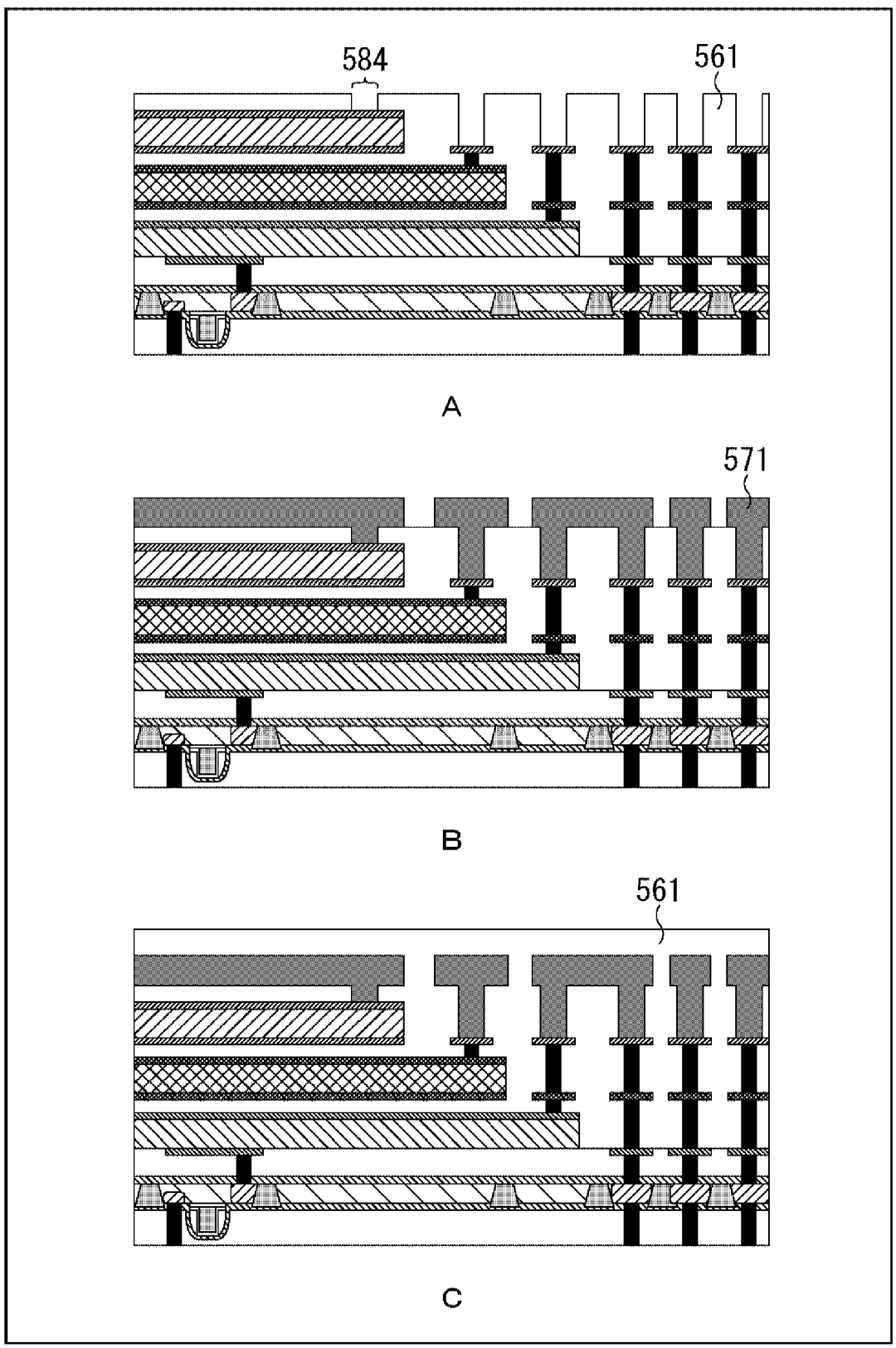
FIG. 33 is a set of cross-sectional diagrams explanatory of typical manufacturing processes.

After depositing the $SiO_2$ film 561 by the CVD process, the photoelectric conversion layer forming section 437 applies a resist, exposes it, and performs dry etching to form connection holes 584 connecting the light shielding film 571 with the upper electrode 531 or the lower electrode 533, as depicted in Subfigure A of FIG. 33, for example.

The photoelectric conversion layer forming section 437 then performs the PVD process or CVD process to deposit a tungsten (W) film, applies a resist thereon, and exposes it. This forms the light shielding film 571 serving both as a light shielding pattern and as a wiring pattern for connecting the upper electrodes in the different layers with the element isolation layer 212, as depicted in Subfigure B of FIG. 33, for example. The light shielding pattern is preferably formed as wide as approximately several pixels at the edge inside the pixel array 110. Inter-pixel light shielding walls may also be formed to prevent the mixing of colors between the unit pixels.

The photoelectric conversion layer forming section 437 then uses the $SiO_2$ film 561 to fill gaps between the inter-pixel light shielding films of the inter-pixel light shielding layer 223, as depicted in Subfigure C of FIG. 33, for example.

Figure 34:
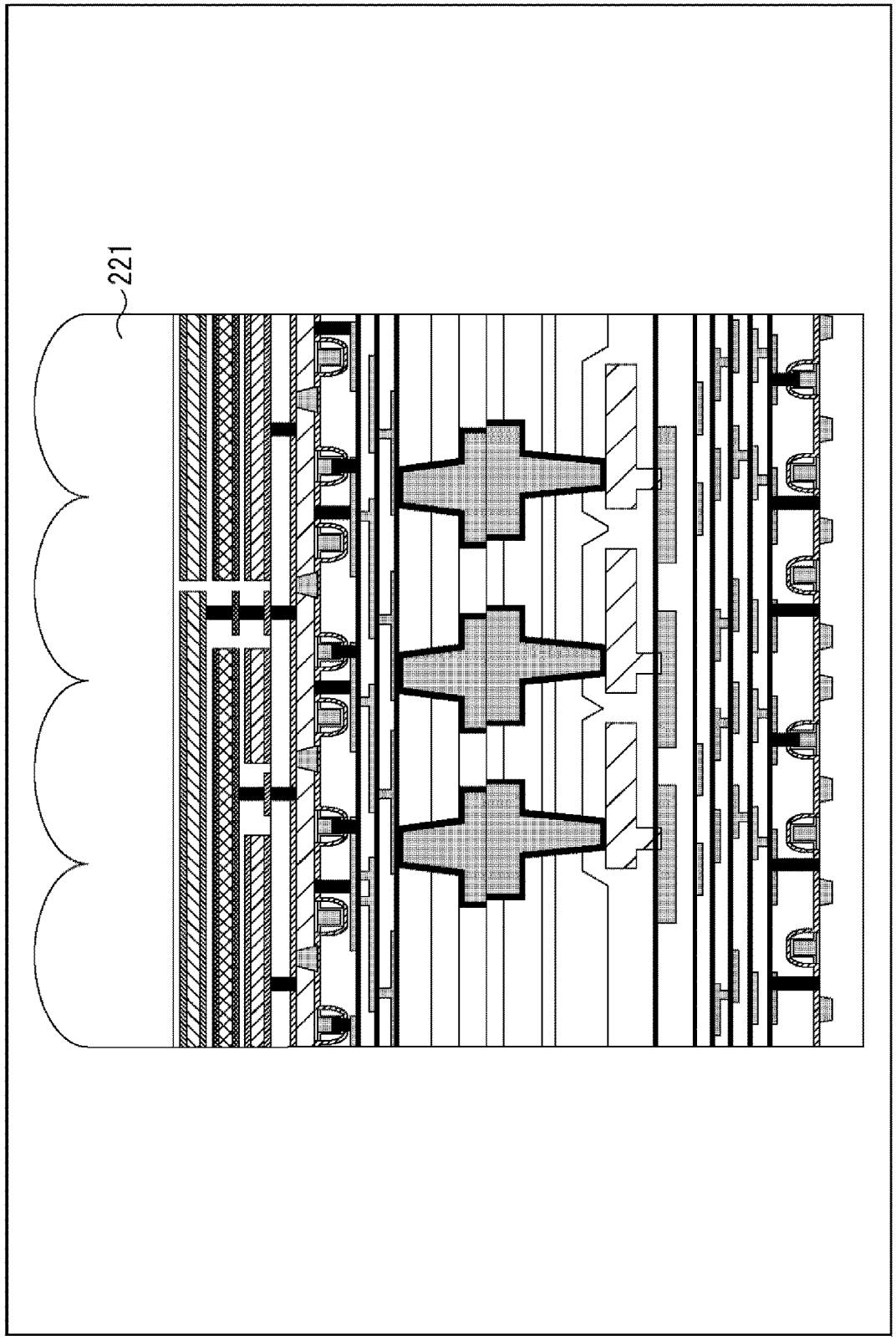
FIG. 34 is a cross-sectional diagram explanatory of a typical manufacturing process.

The photoelectric conversion layer forming section 437 then forms the micro lenses 221 over the inter-pixel light shielding layer 561 as depicted in FIG. 34, for example.

After the image sensor 100 is created as described above, the manufacturing section 402 outputs the image sensor 100 to the outside. This terminates the manufacturing processing.

By performing the manufacturing processing as described above, the manufacturing apparatus 400 creates the image sensor 100 (FIG. 1) to which the present technology is applied. That is, manufacturing the image sensor 100 in the manner described above reduces any increase in pixel size and lessens any drop in image quality.

3. Third Embodiment

<Image sensor>

In the above-described image sensor 100, the circuits formed in the unit pixels 111 and in the A/D conversion sections 121 may be configured as desired and are not limited to the examples discussed above. For instance, in each unit pixel 111 over the pixel substrate 101, a readout circuit may be configured to read the pixel signal from the unit pixel. The transistors making up the unit pixel A/D conversion circuit may all be formed in the A/D conversion sections 121 over the circuit substrate 102.

Figure 35:
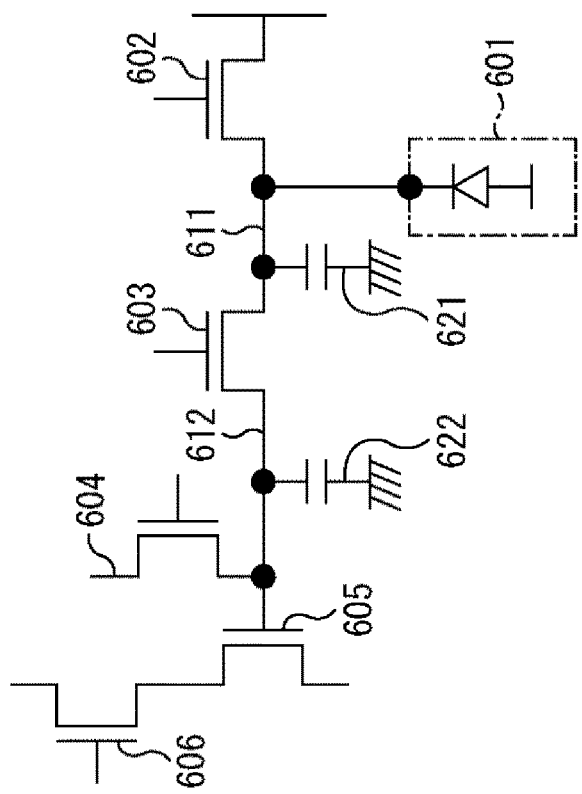
FIG. 35 is a schematic diagram depicting a typical configuration of a circuit mounted on the pixel substrate.

A typical configuration of a circuit mounted on the pixel substrate 101 in the above case is depicted in FIG. 35. As indicated in FIG. 35, a photoelectric conversion section 601, a first reset transistor 602, a transfer transistor 603, a second reset transistor 604, an amplification transistor 605, and a selection transistor 606 are formed in the unit pixel 111 over the pixel substrate 101.

As with the photoelectric conversion section 131 of the first embodiment, the photoelectric conversion section 601 converts incident light on the unit pixel 111 into electrical charges. The photoelectric conversion section 601 may be configured as desired. For example, the photoelectric conversion section 601 may be configured using the photoelectric conversion section 225 of a single layer as in the first embodiment. Alternatively, the photoelectric conversion section 601 may be configured using multiple photoelectric conversion sections stacked on each other to absorb light in different wavelength bands as in the second embodiment.

The transistors ranging from the first reset transistor 602 to the selection transistor 606 are all high-voltage transistors. That means the processing conditions for gate electrodes, diffusion layers, and wiring may be optimized for the pixel substrate 101 independent of the settings for the circuit substrate 102. These transistors are all N-type transistors. That is, only the N-type transistors (not P-type transistors) are formed in the unit pixel 111.

The unit pixel 111 also has a first floating diffusion layer 611 and a second floating diffusion layer 612 formed therein. The first floating diffusion layer 611 accumulates the electrical charges transferred from the photoelectric conversion section 601. The second floating diffusion layer 612 accumulates the electrical charges transferred from the first floating diffusion layer 611. A well contact 621 is formed in the first floating diffusion layer 611. A well contact 622 is formed in the second floating diffusion layer 612.

In the image sensor 100 of the third embodiment, the parts of the unit pixel A/D conversion circuit (i.e., circuits such as the comparison section, positive feedback circuit, and inverter) explained above with reference to FIG. 2 are formed in the A/D conversion section 121 of the ADC array 120 over the circuit substrate 102, the A/D conversion section 121 corresponding to the unit pixel 111.

That is, the image sensor 100 of the third embodiment includes, as the first substrate over which photoelectric conversion sections and semiconductor layers are formed, the pixel substrate 101 where the photoelectric conversion section 601 and the element isolation layer 212 are configured. The image sensor 100 also includes the circuit substrate 102 as the second substrate different from the pixel substrate 101. In the image sensor 100, the pixel substrate 101 and the circuit substrate 102 are stacked on each other. Further in the image sensor 100 of the third embodiment, transistors formed over the pixel substrate 101 make up a readout circuit that reads and amplifies the electrical charges obtained by the photoelectric conversion section 601 to generate a pixel signal; and transistors formed over the circuit substrate 102 make up a unit pixel A/D conversion circuit that converts the analog pixel signal read via the readout circuit into a digital signal.

The parts of the image sensor 100 other than the circuits formed over the pixel substrate 101 and the circuit substrate 102 are substantially the same as in the first or the second embodiment. For example, the layers made up of the photoelectric conversion layer 211, the element isolation layer 212, and the transistor wiring layer 213 over the pixel substrate 101 are the same as in the first or the second embodiment.

Thus the image sensor 100 of the third embodiment, as in the above-described embodiments, reduces any increase in pixel size and lessens any drop in image quality.

Figure 36:
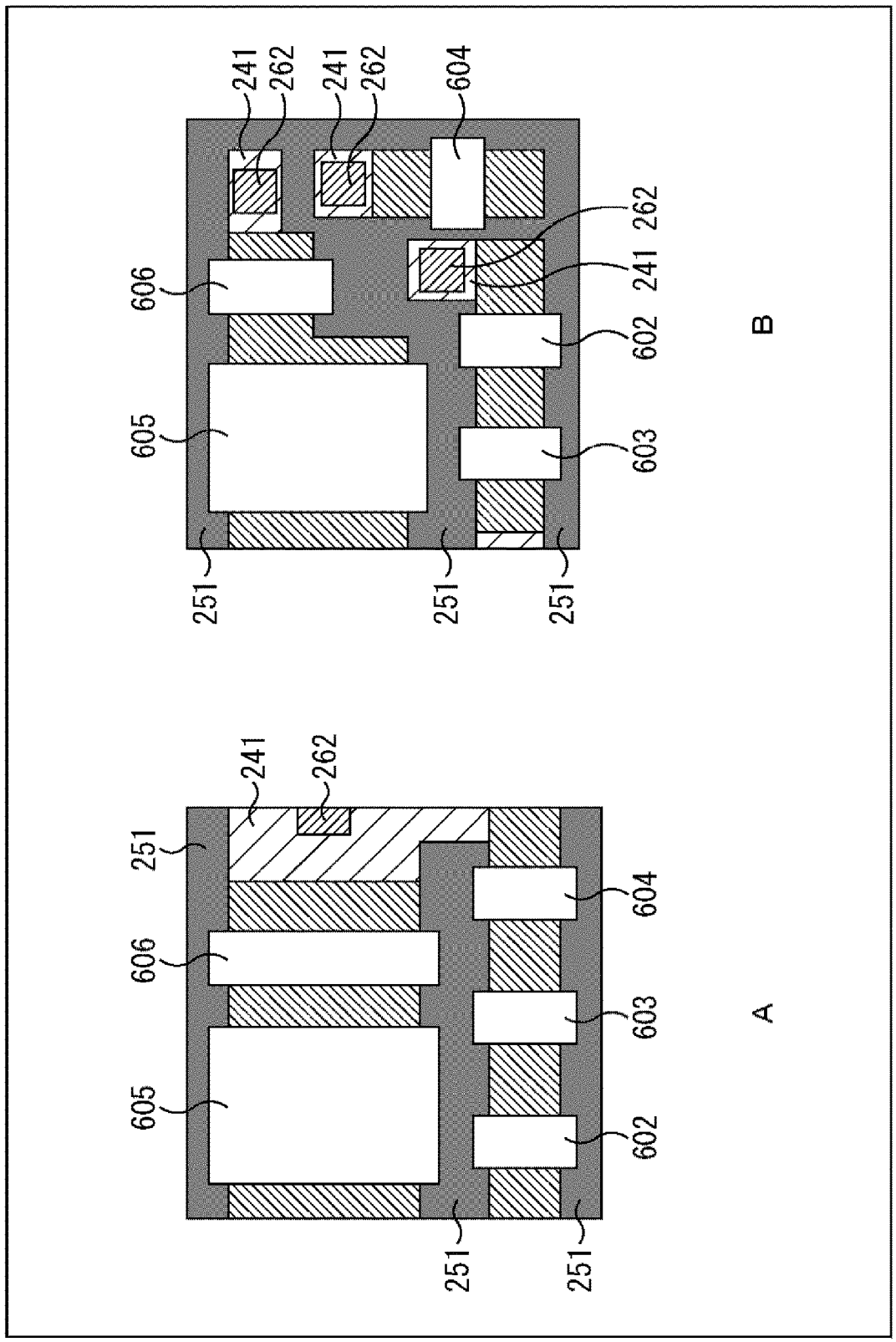
FIG. 36 is a set of plan views depicting other typical configurations of the element isolation layer of the unit pixel.

In the third embodiment, as in the first embodiment, a single P+ diffusion layer 262 may be used to form a well contact applicable to the entire P-wells 241 in the unit pixel 111 thereby to impress a common substrate bias to the whole P-wells, as depicted in Subfigure A of FIG. 36, for example.

In the unit pixel 111, as depicted in Subfigure B of FIG. 36, a well contact may be formed in each P-well 241 using the P+ diffusion layer 262 for each of the regions isolated by the element isolation regions 251 so that each well contact may be impressed independently with the substrate bias. In the case of Subfigure B in FIG. 36, for example, the element isolation regions 251 electrically isolate the first reset transistor 602 paired with the transfer transistor 603, the second reset transistor 604, and the amplification transistor 605 paired with the selection transistor 606 from one another. Each of the electrically isolated parts is furnished with the P-well 241 and the P+ diffusion layer 262. The substrate bias may be impressed independently to each of these well contacts. This allows conversion efficiency to be varied and enables the image sensor 100 to expand its dynamic range.

<Manufacturing Apparatus>

The image sensor 100 may be manufactured by the manufacturing apparatus 400 of the third embodiment similar to that of the first embodiment.

<Flow of the Manufacturing Processing>

The manufacturing processing of the third embodiment may be performed in a manner similar to that of the first embodiment for manufacturing the image sensor 100.

Thus the manufacturing apparatus 400 of the third embodiment may also create the image sensor 100 to which the present technology is applied. When thus manufactured, the image sensor 100 reduces any increase in pixel size and lessens any drop in image quality.

4. Fourth Embodiment

<Image Sensor>

The parts constituting the readout circuit for reading the pixel signal from the unit pixel 111 may be formed, for example, in the unit pixel 111 over the pixel substrate 101 and in the A/D conversion section 121 over the circuit substrate 102. In this case, the transistors making up the unit pixel A/D conversion circuit may all be formed in its A/D conversion section 121.

Figure 37:
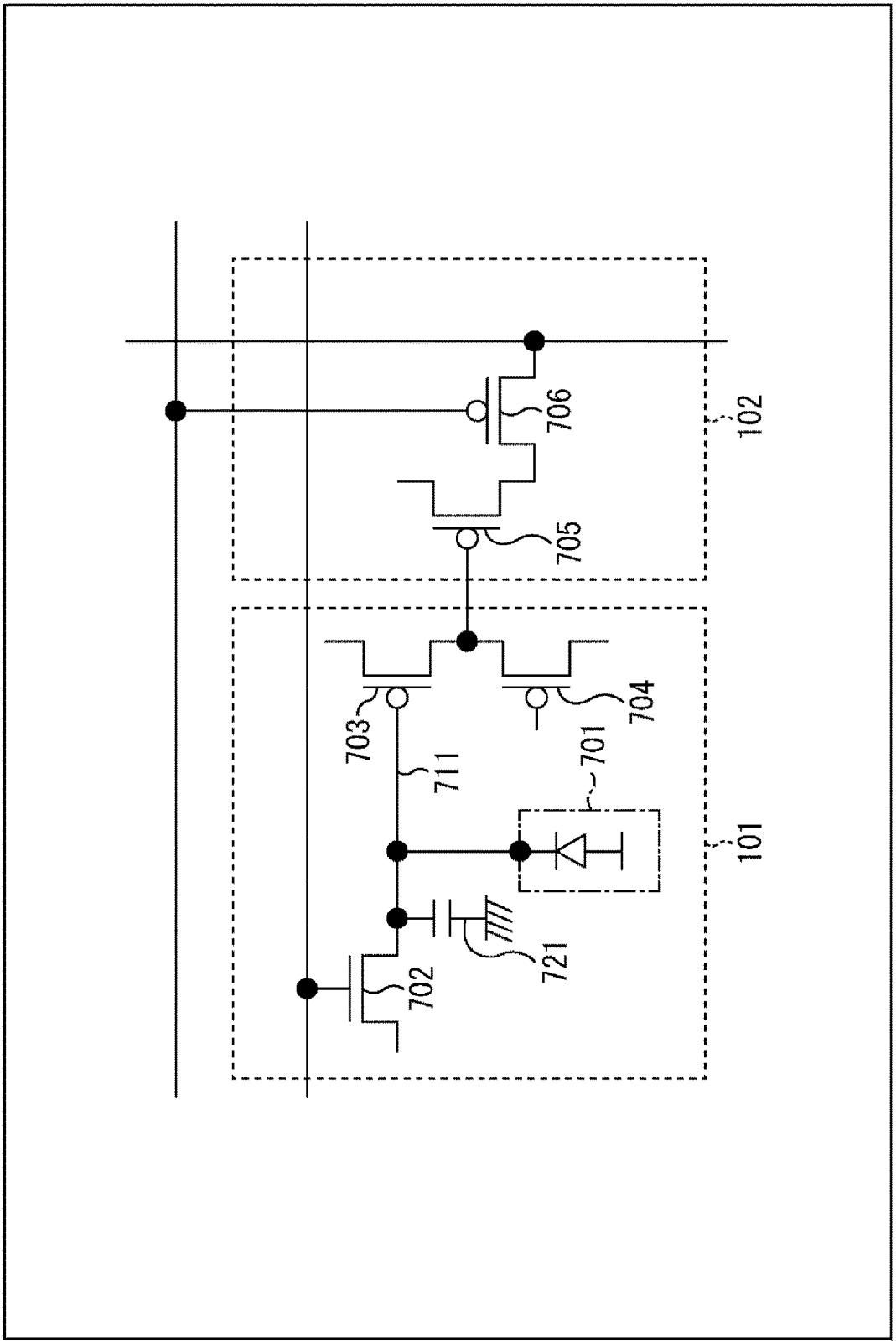
FIG. 37 is a schematic diagram depicting a typical configuration of circuits mounted on the image sensor.

FIG. 37 is a circuit diagram depicting a typical configuration of the readout circuit for reading the pixel signal from the unit pixel 111. In the fourth embodiment, as depicted in FIG. 37, a photoelectric conversion section 701, a reset transistor 702, a first amplification transistor 703, and a load MOS transistor 704 are formed in the unit pixel 111 over the pixel substrate 101. A second amplification transistor 705 and a selection transistor 706 are formed in the A/D conversion section 121 over the circuit substrate 102.

As with the photoelectric conversion section 131 of the first embodiment, the photoelectric conversion section 701 converts incident light on the unit pixel 111 into electrical charges. The photoelectric conversion section 701 may be configured as desired. For example, the photoelectric conversion section 701 may be configured using the single-layer photoelectric conversion section 225 as in the first embodiment. Alternatively, as in the second embodiment, the photoelectric conversion section 701 may be configured using multiple photoelectric conversion sections stacked on each other to absorb light in different wavelength bands.

In the example of FIG. 37, the reset transistor 702 is an N-type transistor. The transistors ranging from the first amplification transistor 703 to the selection transistor 706 are P-type transistors. That is, both P-type and N-type transistors are formed in the unit pixel 111.

The unit pixel 111 also has a floating diffusion layer 711 formed therein. The floating diffusion layer 711 accumulates the electrical charges transferred from the photoelectric conversion section 701. A well contact 721 is formed in the floating diffusion layer 711.

In the image sensor 100 of the fourth embodiment, the parts of the unit pixel A/D conversion circuit (i.e., circuits such as the comparison section, positive feedback circuit, and inverter) explained above with reference to FIG. 2 are formed in the A/D conversion section 121 of the ADC array 120 over the circuit substrate 102, the A/D conversion section 121 corresponding to the unit pixel 111.

That is, the image sensor 100 of the fourth embodiment includes, as the first substrate over which photoelectric conversion sections and semiconductor layers are formed, the pixel substrate 101 where the photoelectric conversion section 601 and the element isolation layer 212 are configured. The image sensor 100 also includes the circuit substrate 102 as the second substrate different from the pixel substrate 101. In the image sensor 100, the pixel substrate 101 and the circuit substrate 102 are stacked on each other.

Also in the image sensor 100 of the fourth embodiment, transistors formed over the pixel substrate 101 and transistors formed over the circuit substrate 102 make up a circuit that reads and amplifies the electrical charges obtained by the photoelectric conversion section 701.

The parts of the image sensor 100 other than the circuits formed over the pixel substrate 101 and the circuit substrate 102 are substantially the same as in the above-described embodiments. For example, the layers made up of the photoelectric conversion layer 211, the element isolation layer 212, and the transistor wiring layer 213 over the pixel substrate 101 are the same as in the first, the second, or the third embodiment.

Thus the image sensor 100 of the fourth embodiment, as in the above-described embodiments, reduces any increase in pixel size and lessens any drop in image quality.

Figure 38:
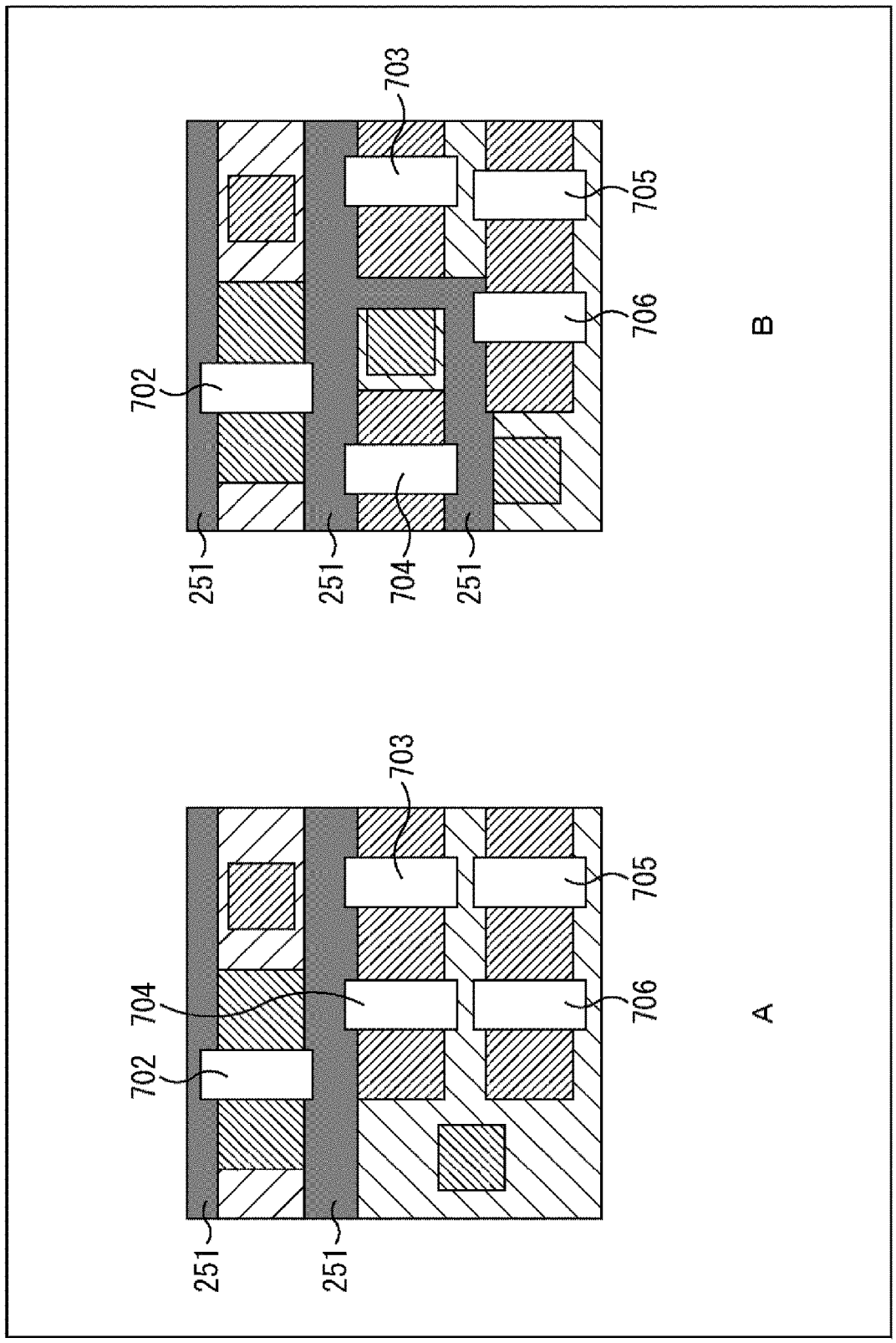
FIG. 38 is a set of plan views depicting typical configurations of the element isolation layer of the unit pixel.

In the fourth embodiment, as in the first embodiment, a well contact applicable to the entire P-wells may be formed in the unit pixel 111 so as to impress a common substrate bias to the whole P-wells, as depicted in Subfigure A of FIG. 38.

In the unit pixel 111, as in the first embodiment, a well contact may be formed in each P-well 241 for each of the regions isolated by the element isolation regions 251 so that each well contact may be impressed independently with the substrate bias, as depicted in Subfigure B of FIG. 38. This allows conversion efficiency to be varied and enables the image sensor 100 to expand its dynamic range.

<Manufacturing Apparatus>

The image sensor 100 may be manufactured by the manufacturing apparatus 400 of the fourth embodiment similar to that of the first embodiment.

<Flow of the Manufacturing Processing>

The manufacturing processing of the fourth embodiment may be performed in a manner similar to that of the first embodiment for manufacturing the image sensor 100.

Thus the manufacturing apparatus 400 of the fourth embodiment may thus create the image sensor 100 to which the present technology is applied. When thus manufactured, the image sensor 100 reduces any increase in pixel size and lessens any drop in image quality.

5. Fifth Embodiment

<Image Sensor>

The image sensor 100 may be configured using a single-layer semiconductor substrate. In the fifth embodiment, the image sensor 100 may be constituted by the pixel substrate 101 as depicted in Subfigure A of FIG. 39, for example.

Figure 39:
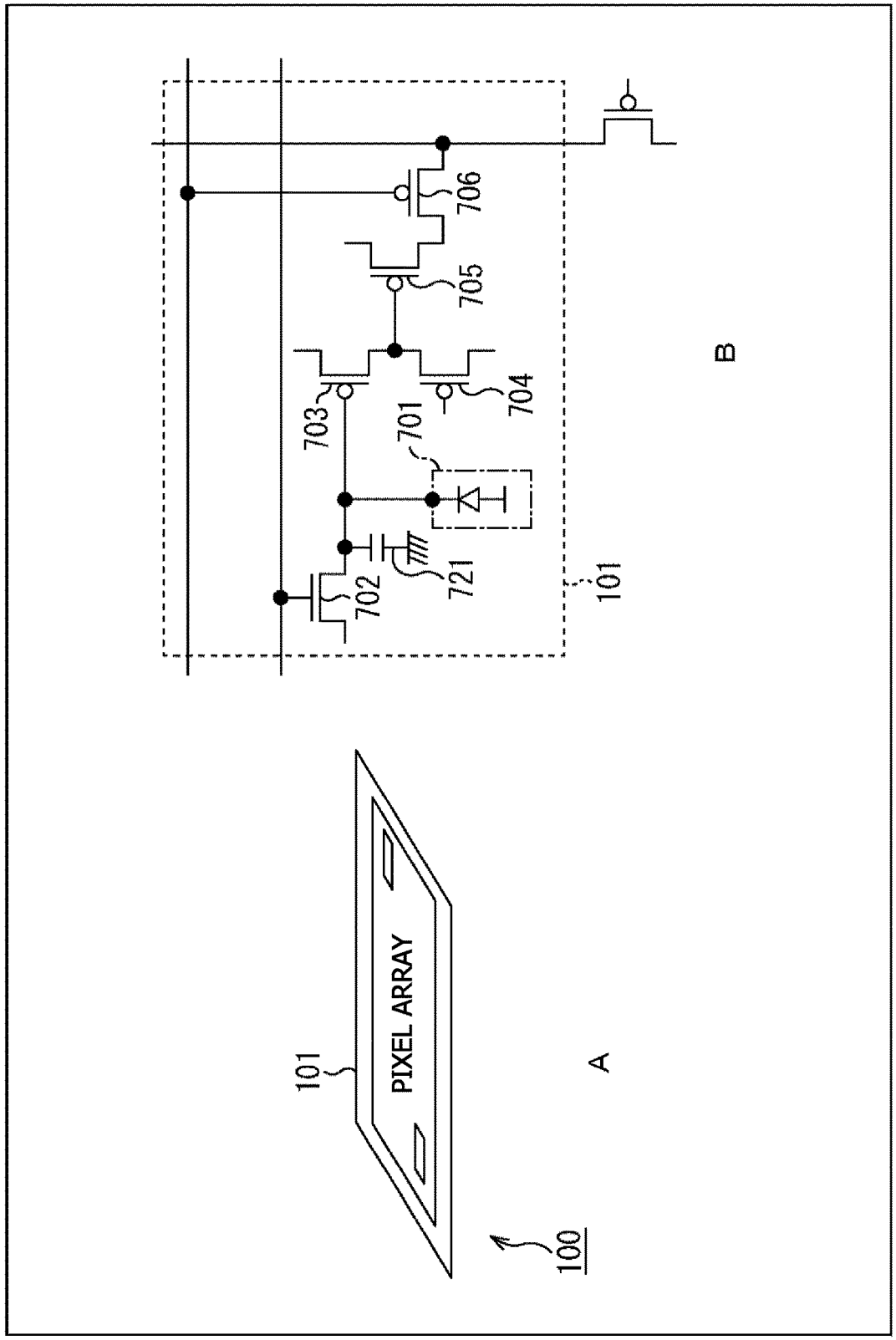
FIG. 39 is a set of schematic diagrams depicting a typical configuration of a circuit mounted on the pixel substrate.

In the unit pixel 111 over the pixel substrate 101, a readout circuit similar to that of the fourth embodiment is formed, as depicted in Subfigure B of FIG. 39, for example. It is to be noted that all parts making up the readout circuit are provided in the unit pixel 111 of the fifth embodiment. For example, the photoelectric conversion section 701 and the transistors ranging from the reset transistor 702 to the selection transistor 706 are all formed in the unit pixel 111 of the fifth embodiment.

That is, in the unit pixel 111, the transistors may be arranged to constitute a circuit that reads and amplifies the electrical charges obtained by the photoelectric conversion section.

The A/D conversion of the pixel signal read from the unit pixel 111 may be carried out by circuits formed outside the pixel array 110 over the pixel substrate 101. Alternatively, the A/D conversion may be performed by a device external to the pixel substrate 101.

Figure 40:
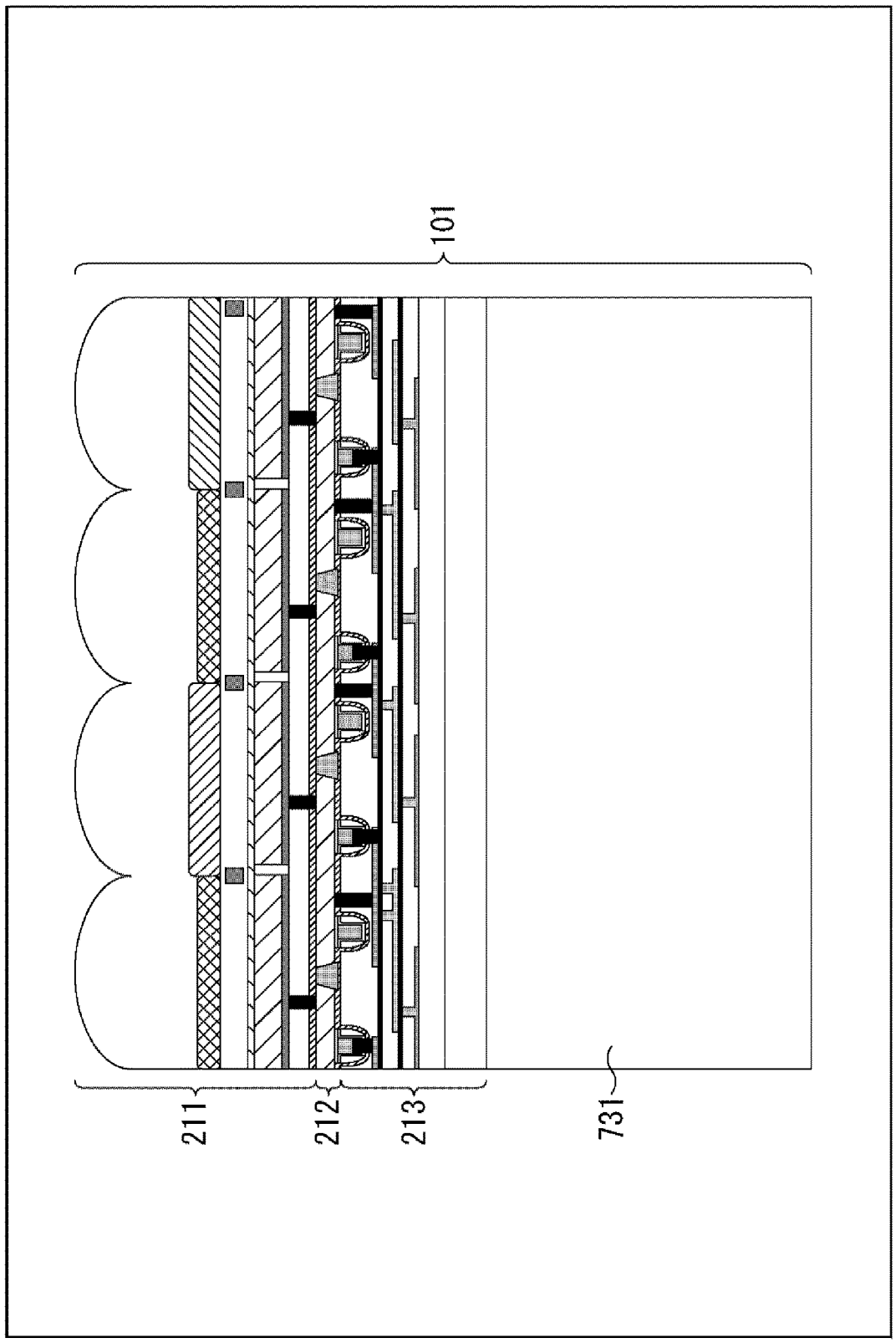
FIG. 40 is a cross-sectional diagram depicting a typical configuration of the image sensor.

FIG. 40 is a cross-sectional diagram depicting a typical configuration of the image sensor 100 in the above case. As depicted in FIG. 40, the image sensor 100 of this embodiment is configured with the single-layer pixel substrate 101, so that a silicon substrate 731 is formed under the transistor wiring layer 213.

When configured as depicted above, the image sensor 100 of the fifth embodiment reduces any increase in pixel size and lessens any drop in image quality in a manner similar to those of the above-described embodiments.

Figure 41:
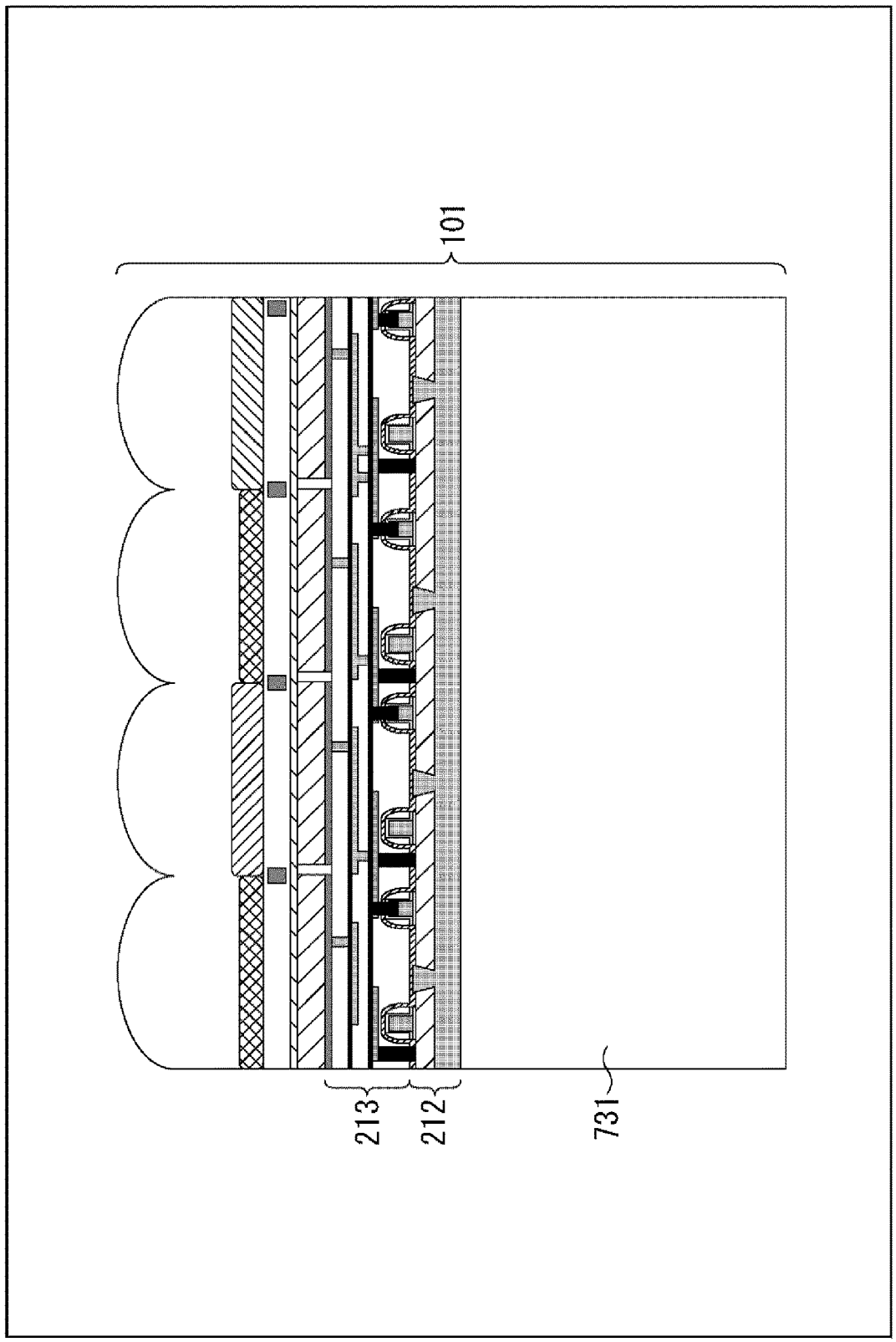
FIG. 41 is a cross-sectional diagram depicting a typical configuration of the front-illuminated image sensor.

As in the above-described embodiments, the image sensor 100 of the fifth embodiment may be configured not only as a back-illuminated image sensor but also as a front-illuminated image sensor in which the transistor wiring layer 213 is positioned on the light incident side of the element isolation layer 212, as depicted in FIG. 41.

<Manufacturing Apparatus>

The image sensor 100 may be manufactured by the manufacturing apparatus 400 of the fifth embodiment similar to that of the first embodiment.

<Flow of the Manufacturing Processing>

The manufacturing processing of the fifth embodiment may be performed in a manner similar to that of the first embodiment for manufacturing the image sensor 100.

Thus the manufacturing apparatus 400 of the fifth embodiment may thus create the image sensor 100 to which the present technology is applied. When thus manufactured, the image sensor 100 reduces any increase in pixel size and lessens any drop in image quality.

6. Sixth Embodiment

<Image Sensor>

In the fifth embodiment, the transistors formed in the unit pixel 111 over the pixel substrate 101 of the image sensor 100 may all be N-type transistors. That is, as depicted in Subfigure A of FIG. 42, the parts of the readout circuit (FIG. 35) explained above in connection with the third embodiment may be formed in the unit pixel 111 over the single-layer pixel substrate 101.

Figure 42:
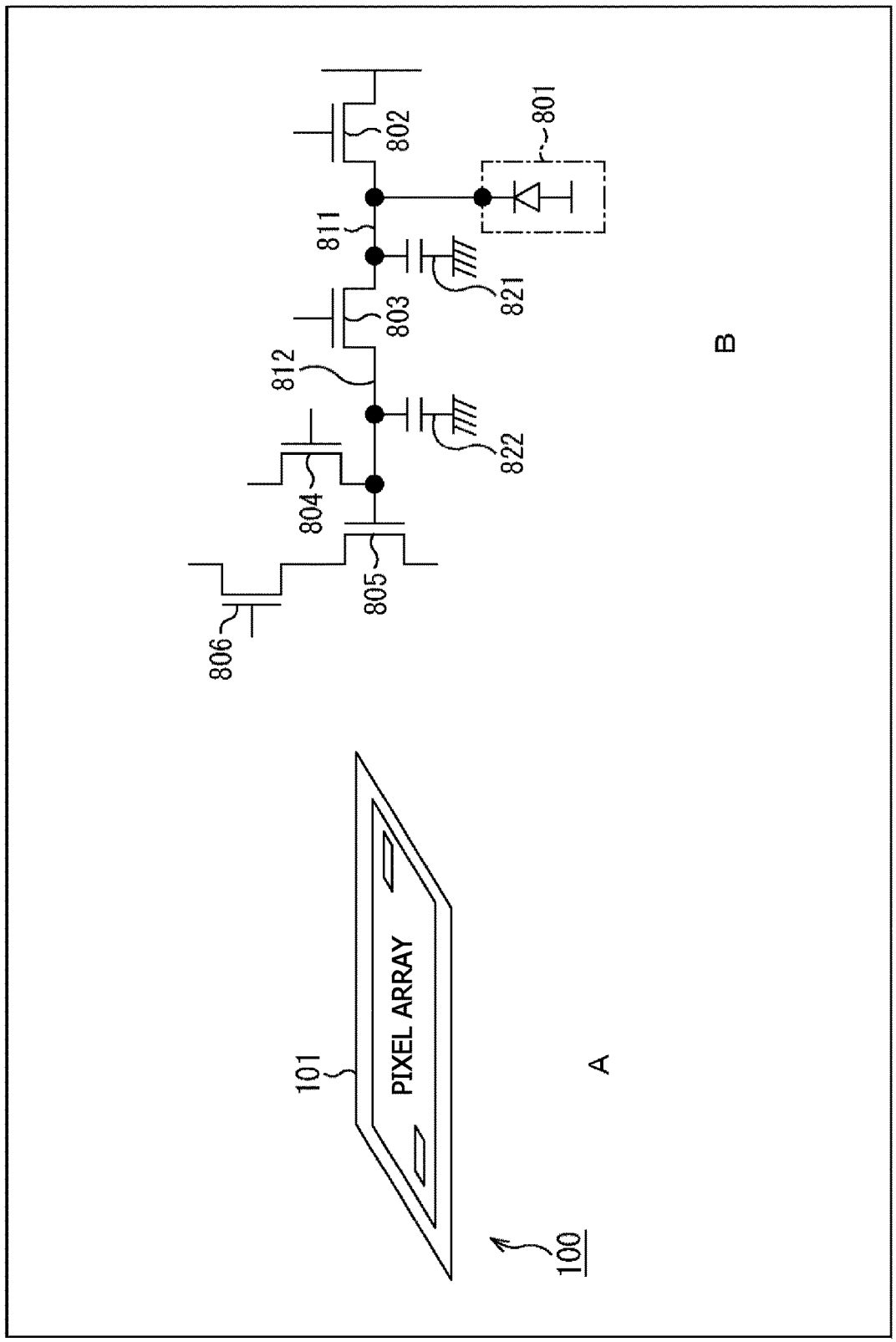
FIG. 42 is a set of schematic diagrams depicting a typical configuration of a circuit mounted on the pixel substrate.

A typical configuration of the readout circuit is depicted in Subfigure B of FIG. 42. As indicated in Subfigure B of FIG. 42, a photoelectric conversion section 801, a first reset transistor 802, a transfer transistor 803, a second reset transistor 804, an amplification transistor 805, and a selection transistor 806 are formed in the unit pixel 111. A first floating diffusion layer 811 and a second floating diffusion layer 812 are further formed in the unit pixel 111. A well contact 821 is formed in the first floating diffusion layer 811. A well contact 822 is formed in the second floating diffusion layer 812.

The photoelectric conversion section 801 corresponds to the photoelectric conversion section 601. The transistors ranging from the first reset transistor 802 to the selection transistor 806 correspond respectively to the transistors ranging from the first reset transistor 602 to the selection transistor 606.

Thus the image sensor 100 of the sixth embodiment, as in the above-described embodiments, reduces any increase in pixel size and lessens any drop in image quality.

The image sensor 100 of the sixth embodiment is configured with the single-layer pixel substrate 101 as depicted in Subfigure A of FIG. 42. Thus in the image sensor 100 of the sixth embodiment, the A/D conversion circuit for converting the analog pixel signal read from the unit pixel 111 into the digital signal may be formed either outside the pixel array 110 over the pixel substrate 101 or outside the image sensor 100.

Alternatively, the A/D conversion circuit for converting the analog pixel signal read from the unit pixel 111 into the digital signal may be formed for each unit pixel, for each of the columns in the pixel array 110, for each of the areas over the pixel array 110, or one for the entire pixel array 110.

<Manufacturing Apparatus>

The image sensor 100 may be manufactured by the manufacturing apparatus 400 of the sixth embodiment similar to that of the first embodiment.

<Flow of the Manufacturing Processing>

The manufacturing processing of the sixth embodiment may be performed in a manner similar to that of the first embodiment for manufacturing the image sensor 100.

Thus the manufacturing apparatus 400 of the sixth embodiment may thus create the image sensor 100 to which the present technology is applied. When thus manufactured, the image sensor 100 reduces any increase in pixel size and lessens any drop in image quality.

7. Seventh Embodiment

<Image Sensor>

Figure 43:
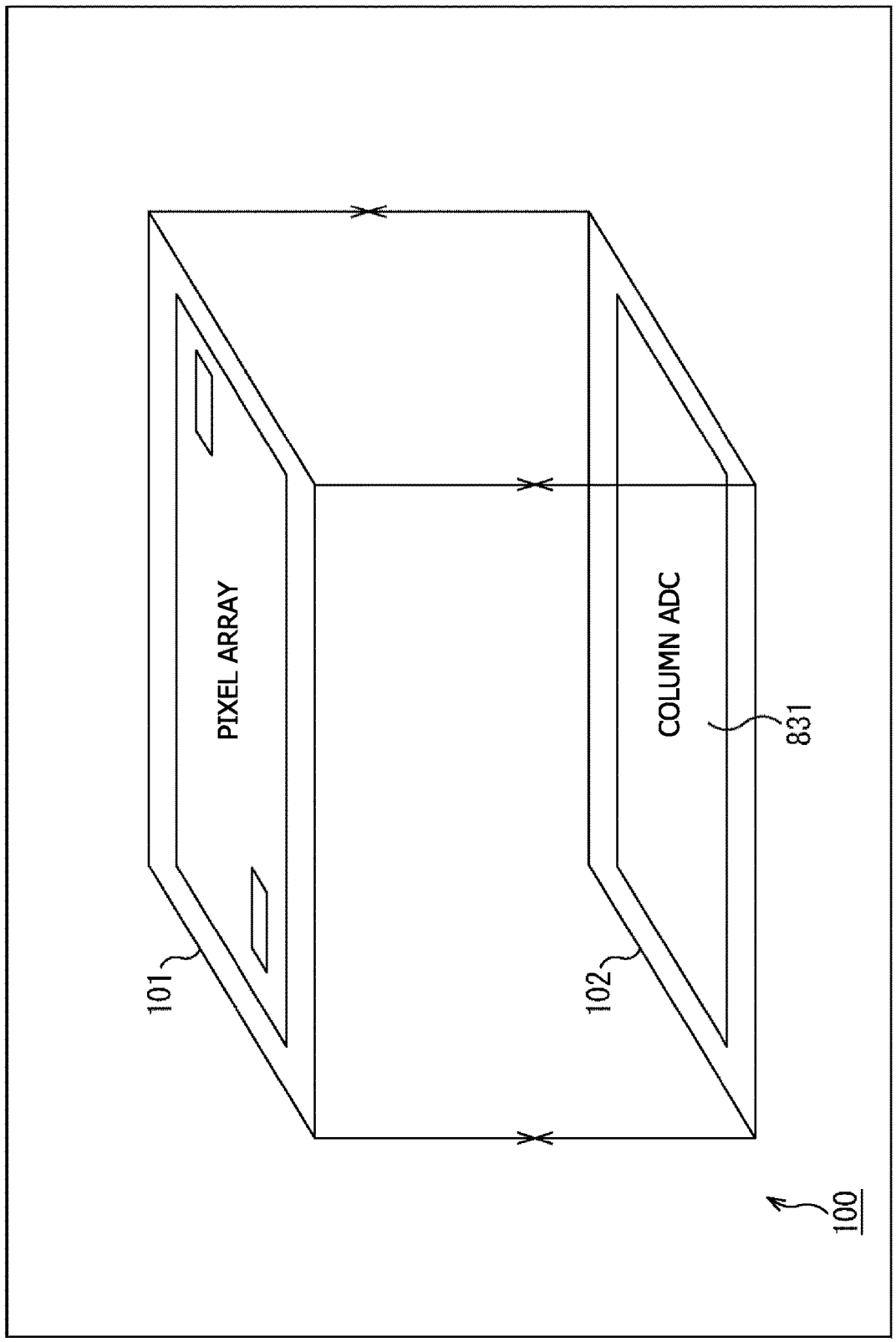
FIG. 43 is a perspective view depicting a typical configuration of the image sensor.

Furthermore, as depicted in FIG. 43, for example, the image sensor 100 may be formed in a multilayer structure composed of the pixel substrate 101 and the circuit substrate 102. Each unit pixel 111 over the pixel substrate may include a readout circuit that reads a pixel signal from the photoelectric conversion section of the unit pixel 111. The circuit substrate 102 may include a column A/D conversion circuit formed for each column of the pixel array 110, the column A/D conversion circuit converting the analog pixel signal read from the unit pixel 111 into the digital signal.

As depicted in FIG. 43, the pixel substrate 101 includes the pixel array 110. The circuit substrate 102 overlaid on the pixel substrate 101 includes a column ADC 831 as a region where the column A/D conversion circuit is disposed for each column of the pixel array 110. That is, the column ADC 831 includes multiple column A/D conversion circuits (e.g., as many as the columns of the pixel array 110).

The image sensor 100 of the seventh embodiment is configured substantially the same as the image sensor 100 of the third embodiment except for the A/D conversion section configured over the circuit substrate 102.

Thus the image sensor 100 of the seventh embodiment, as in the third embodiment, reduces any increase in pixel size and lessens any drop in image quality.

<Manufacturing Apparatus>

The image sensor 100 may also be manufactured by the manufacturing apparatus 400 of the seventh embodiment similar to that of the first embodiment.

<Flow of the Manufacturing Processing>

The manufacturing processing of the seventh embodiment may be performed in a manner similar to that of the first embodiment for manufacturing the image sensor 100.

Thus the manufacturing apparatus 400 of the seventh embodiment may thus create the image sensor 100 to which the present technology is applied. When thus manufactured, the image sensor 100 reduces any increase in pixel size and lessens any drop in image quality.

8. Eighth Embodiment

<Imaging Apparatus>

Figure 44:
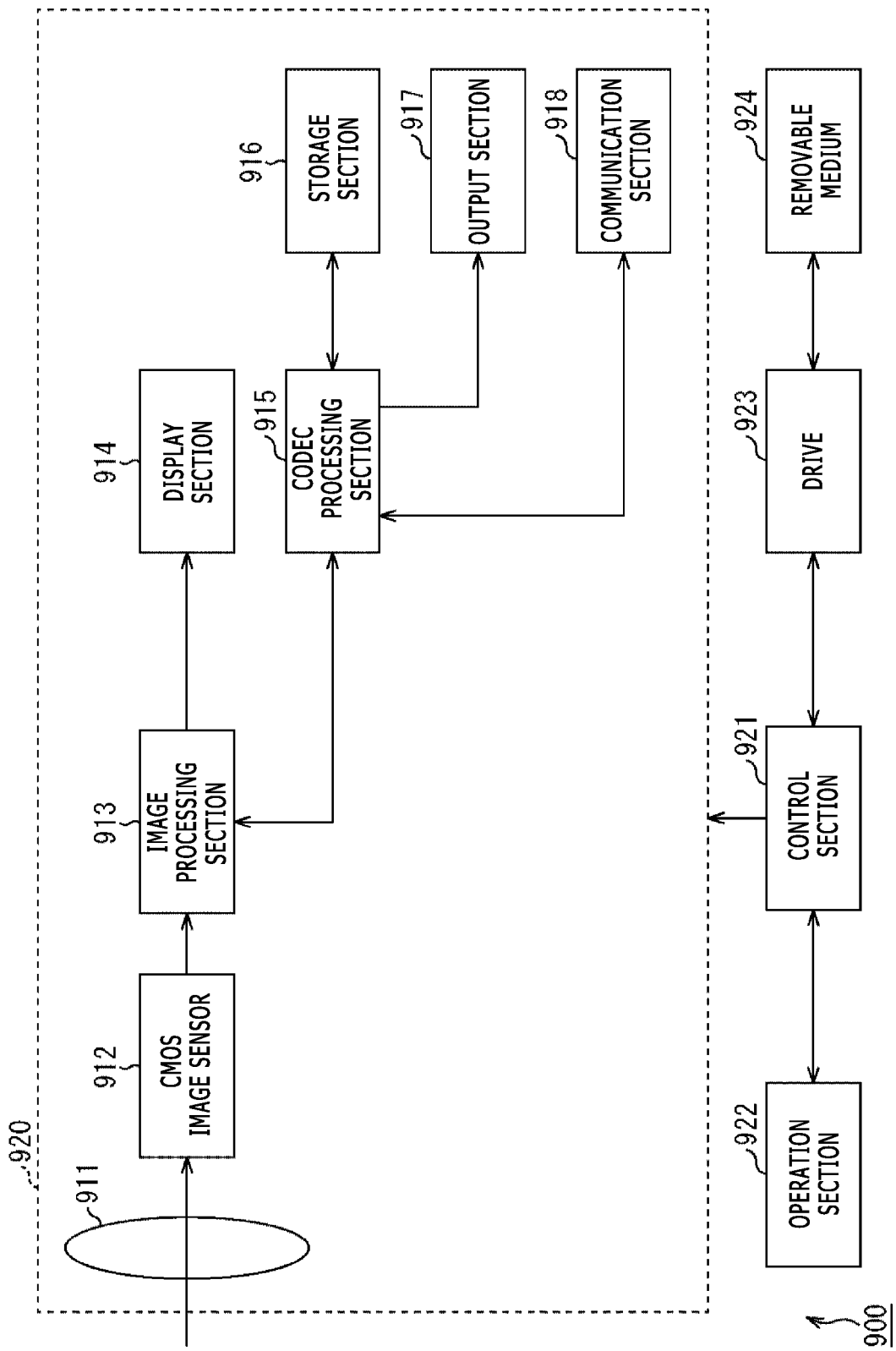
FIG. 44 is a block diagram depicting a typical configuration of an imaging apparatus.

The present technology may also be applied to equipment other than the imaging element. For example, this technology may be applied to an apparatus (e.g., electronic device) that includes the imaging element, such as an imaging apparatus. FIG. 44 is a block diagram depicting a typical configuration of the imaging apparatus as a typical electronic device to which the present technology is applied. The imaging apparatus 900 depicted in FIG. 44 captures an image of the target object and outputs the captured image of the object as an electrical signal.

As depicted in FIG. 44, the imaging apparatus 900 includes an optical section 911, a CMOS image sensor 912, an image processing section 913, a display section 914, a codec processing section 915, a storage section 916, an output section 917, a communication section 918, a control section 921, an operation section 922, and a drive 923.

The optical section 911 is constituted, for example, by lenses that adjust focusing on the target object to collect light from the focused position, by a diaphragm that adjusts exposure, and by a shutter that controls the timing of imaging. The optical section 911 transits light (i.e., incident light) from the target object and forwards the transmitted light to the CMOS image sensor 912.

The CMOS image sensor 912 converts the incident light photoelectrically into an analog signal per pixel (pixel signal), converts the analog signal into a digital signal, performs signal processing such as CDS on the digital signal, and feeds the resulting captured image data to the image processing section 913.

The image processing section 913 processes the captured image data obtained by the CMOS image sensor 912. More specifically, the image processing section 913 performs diverse image processing such as color mixture correction, black level correction, white balance adjustment, demosaicing, matrix processing, gamma correction, and YC conversion on the captured image data fed from the CMOS image sensor 912. The image processing section 913 feeds the captured image data having undergone the image processing to the display section 914.

The display section 914 is configured as a liquid crystal display, for example. The display section 914 displays images of the captured image data (e.g., images of the target object) fed from the image processing section 913.

The image processing section 913 feeds the captured image data having undergone the image processing further to the codec processing section 915 as needed.

The codec processing section 915 performs an encoding process of a predetermined method on the captured image data coming from the image processing section 913, and feeds the resulting encoded data to the storage section 916. Also, the codec processing section 915 reads encoded data stored in the storage section 916, decodes the retrieved data to generate decoded image data, and feeds the resulting decoded image data to the image processing section 913.

The image processing section 913 performs predetermined image processing on the decoded image data fed from the codec processing section 915. The image processing section 913 feeds the decoded image data having undergone the image processing to the display section 914. The display section 914, configured as a liquid crystal display, for example, displays images of the decoded image data coming from the image processing section 913.

Alternatively, the codec processing section 915 may supply the output section 917 with the encoded data obtained by encoding the captured image data fed from the image processing section 913 or with the encoded data read from the storage section 916, the output section 917 being caused to output the received encoded data to outside of the imaging apparatus 900. As another alternative, the codec processing section 915 may supply the output section 917 with the captured image data yet to be encoded or with the decoded image data obtained by decoding the encoded data read from the storage section 916, the output section 917 being caused to output the received image data or the decoded data to outside of the imaging apparatus 900.

Furthermore, the codec processing section 915 may transmit the captured image data, encoded captured image data, or decoded image data to another apparatus via the communication section 918. The codec processing section 915 may acquire the captured image data or the encoded image data via the communication section 918. As needed, the codec processing section 915 may encode or decode the captured image data or the encoded image data obtained via the communication section 918. As described above, the codec processing section 915 may feed the image data or the encoded data thus obtained to the image processing section 913, or may output the obtained data to the storage section 916, output section 917, and communication section 918.

The storage section 916 stores the encoded data fed from the codec processing section 915, for example. The encoded data stored in the storage section 916 is read out as needed to the codec processing section 915 for decoding. The captured image data obtained by the decoding process is fed to the display section 914. The display section 914 displays captured images reflecting the captured image data received.

The output section 917 includes an external output interface such as an external output terminal. The output section 917 outputs various data received via the codec processing section 915 to outside of the imaging apparatus 900 by way of the external output interface.

The communication section 918 feeds diverse information such as the image data or the encoded data coming from the codec processing section 915 to another apparatus acting as the communicating party in a predetermined communication mode (for wired or wireless communication). Also, the communication section 918 acquires diverse information such as image data or encoded data from another apparatus acting as the communicating party in a predetermined communication mode (for wired or wireless communication), and feeds the acquired information to the codec processing section 915.

The control section 921 controls the operations of the individual processing sections of the imaging apparatus 900 (i.e., processing sections encircled by dotted lines 920 in the drawing, operation section 922, and drive 923).

The operation section 922 is made up of suitable input devices such as a jog dial (registered trademark), keys, buttons, or a touch panel. The operation section 922 receives the input of operations from a user, for example, and supplies the control section 921 with signals corresponding to the operation input.

The drive 923 reads information from a removable medium 924 loaded therein such as a magnetic disk, an optical disk, a magneto-optical disk, or a semiconductor memory. The drive 923 retrieves diverse information such as programs and data from the removable medium 924, and feeds the retrieved information to the control section 921. When loaded with the writable removable medium 924, the drive 923 writes to the removable medium 924 diverse information such as image data or encoded data received via the control section 921.

The present technology explained above in connection with various embodiments is applied to the CMOS image sensor 912 of the above-described imaging apparatus 900. That is, the above-described image sensor 100 is used as the CMOS image sensor 912. When thus constituted, the CMOS image sensor 912 reduces any increase in pixel size and lessens any drop in image quality. As a result, the imaging apparatus 900, when imaging the target object, provides captured images of higher resolution and higher quality than before.

9. Others

The series of processes described above may be executed either by hardware or by software. Where a software-based series of processing is to be carried out, the program constituting the software may be installed from a network or from suitable recording media.

The recording medium may be, for example, constituted by the removable medium 421 on which the program is recorded and which are distributed apart from the apparatus proper to deliver the program to users as depicted in FIG. 14. The removable medium 421 includes a magnetic disk (including flexible disk) and an optical disk (including CD-ROM and DVD). The removable medium 421 also includes a magneto-optical disk (including Mini Disc (MD)) and a semiconductor memory.

In the case above, the program may be installed into the storage section 413 after being retrieved from the removable medium 421 loaded in the drive 415.

Alternatively, the program may be transmitted via wired or wireless transmission media such as a local area network, the Internet, or a digital satellite service when offered. In this case, the program may be received by the communication section 414 before being installed into the storage section 413.

As another alternative, the program may be preinstalled in a read-only memory (ROM), for example, in the storage section 413 or in the control section 401.

The program to be executed by a computer may be processed chronologically, i.e., in the sequence depicted in this description; in parallel with other programs, or in otherwise appropriately timed fashion such as when it is invoked as needed.

In this description, the steps describing the program recorded on the recording media represent not only the processes that are to be carried out chronologically in the depicted sequence but also processes that may be performed parallelly or individually and not necessarily on a time-series basis.

The processes of the above-described steps may be performed by the devices discussed above or by some suitable device other than the above devices. In such a case, the device for executing the processes need only include functions (e.g., in the form of functional blocks) necessary for carrying out the processes. The information necessary for the processing may be transmitted as needed to the executing device.

In this description, the term "system" refers to an aggregate of multiple components (devices or modules (parts)). It does not matter whether all components are housed in the same enclosure. Thus a system may be configured with multiple devices housed in separate enclosures and interconnected via a network, as well as with a single device that houses multiple modules in a single enclosure.

Any configuration explained in the foregoing paragraphs as one device (or a processing sections) may be divided into multiple devices (or processing sections). Conversely, the configurations explained above as multiple devices (or processing sections) may be unified into one device (or one processing section). Also, each device (or processing section) may obviously be supplemented with a configuration or configurations other than those discussed above. Furthermore, part of the configuration of a given device (or processing section) may be included in the configuration of another device (or processing section), provided the configurations and the workings remain substantially the same for the system as a whole.

Whereas some preferred embodiments of the present disclosure have been described above in detail with reference to the accompanying drawings, these embodiments are not limitative of the technical scope of this disclosure. It is obvious that those skilled in the art will easily conceive variations or alternatives of the disclosure within the scope of the technical idea stated in the appended claims. It is to be understood that such variations, alternatives and other ramifications also fall within the technical scope of the present disclosure.

For example, the present technology may be configured as a cloud computing setup in which a single function is processed cooperatively by multiple networked devices on a shared basis.

Also, each of the steps discussed in reference to the above-described flowcharts may be executed either by a single device or by multiple devices on a shared basis.

Furthermore, if a single step includes multiple processes, these processes included in the single step may be executed either by a single device or by multiple devices on a shared basis.

Usage Examples of the Image Sensor

Figure 45:
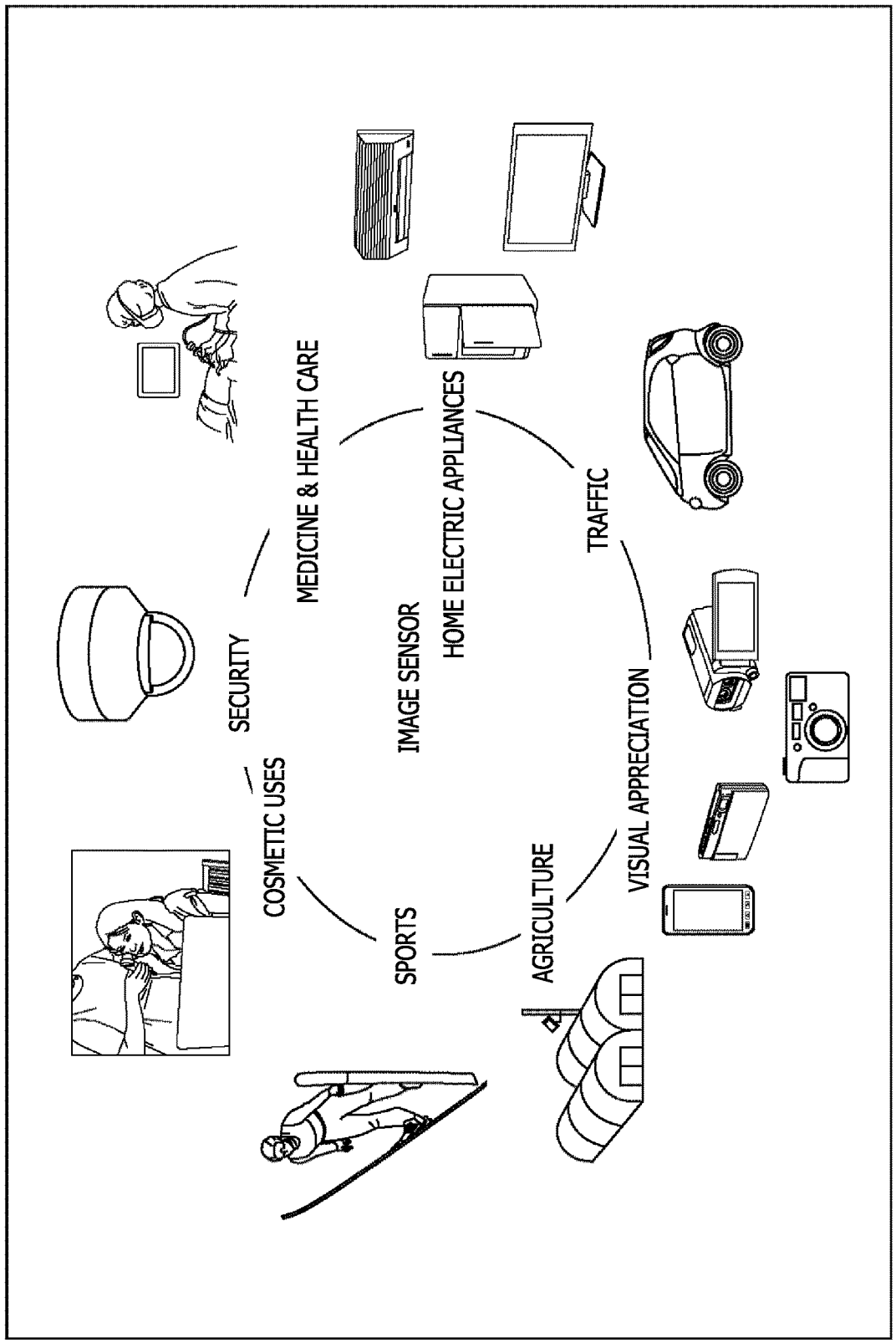
FIG. 45 is a schematic diagram explanatory of usage examples of the imaging element.

FIG. 45 is a schematic diagram depicting usage examples of the image sensor described above.

The image sensor discussed above may be used in various electronic devices outlined below, such as those having diverse types of light including visible light, infrared light, ultraviolet radiation, or X-radiation sensed by the image sensor.

- Electronic devices that capture images for visual appreciation, such as digital cameras and camera function-equipped mobile devices.
- Traffic use electronic devices including onboard sensors that capture images of the front side, rear side, surroundings, and interior of a vehicle to ensure safe operations such as automated vehicle stop and to recognize the driver's status; surveillance cameras for monitoring passing vehicles and the roads on which they travel; and distance measurement sensors for measuring the distance between vehicles.
- Electronic devices that capture images of users' gestures to operate home electric appliances such as TV sets, refrigerators, and air conditioners in a manner reflecting the gestures.
- Electronic devices for medicine and health care uses, such as endoscopes and instruments that capture images of blood vessels using received infrared radiation.
- Electronic devices for security uses, such as surveillance cameras for crime prevention and cameras for personal authentication.
- Electronic devices for cosmetic uses, such as skin measuring instruments and microscopes for capturing images of the scalp.
- Electronic devices for sports uses, such as action cameras and wearable cameras.
- Electronic devices for agriculture uses, such as surveillance cameras for monitoring fields and crops.

The embodiments of the present technology are not limited to those discussed above and may be varied, modified, or altered diversely without departing from the spirit and scope of this technology. For example, the present technology may be implemented not only as a device or a system incorporating the above-described image sensor along with the manufacturing apparatus and the manufacturing method for manufacturing the device or the system, but also as any configuration incorporating the above image sensor, including a processor in the form of a system large scale integration (LSI), a module that uses multiple such processors, a unit that uses multiple such modules, or a set that supplements the unit with additional functions, along with the manufacturing apparatus and the manufacturing method for manufacturing these configurations.

The present technology may be configured preferably as follows:

(1) An imaging element including:
an element isolation region configured with an insulator to penetrate a semiconductor layer having transistors formed in a pixel including a photoelectric conversion section photoelectrically converting incident light.

(2) The imaging element as stated in paragraph (1) above, in which the element isolation region is configured to isolate at least one of the transistors formed in the semiconductor layer, a diffusion layer, and a well from the others.

(3) The imaging element as stated in paragraph (2) above, in which the element isolation region is configured to be in contact with a side wall of a floating diffusion layer accumulating electrical charges photoelectrically converted by the photoelectric conversion section.

(4) The imaging element as stated in paragraph (3) above, in which the element isolation region is configured to be in contact with multiple side walls of the floating diffusion layer.

(5) The imaging element as stated in any one of paragraphs (2) to (4) above, in which the element isolation region is configured to isolate multiple floating diffusion layers from one another formed in the pixel.

(6) The imaging element as stated in any one of paragraphs (2) to (5) above, in which the element isolation region is configured to isolate a P-well from an N-well.

(7) The imaging element as stated in any one of paragraphs (2) to (6) above, in which the element isolation region is configured to isolate a P-type transistor from an N-type transistor.

(8) The imaging element as stated in any one of paragraphs (2) to (7) above, further including:
a pixel array having multiple pixels arrayed two-dimensionally.

(9) The imaging element as stated in any one of paragraphs (2) to (8) above, in which the element isolation region is configured to isolate the diffusion layer for an upper electrode of the photoelectric conversion section outside the pixel.

(10) The imaging element as stated in paragraph (9) above, in which the element isolation region is configured to be in contact with a side wall of the diffusion layer for the upper electrode.

(11) The imaging element as stated in any one of paragraphs (1) to (10) above, in which a first substrate over which the photoelectric conversion section and the semiconductor substrate are formed and a second substrate different from the first substrate are stacked on each other; and transistors formed over the first substrate and transistors formed over the second substrate constitute a circuit configured to read and amplify electrical charges obtained by the photoelectric conversion section, the circuit further subjecting the amplified electrical charges to analog-to-digital conversion.

(12) The imaging element as stated in any one of paragraphs (1) to (11) above, in which the photoelectric conversion section is formed by multiple photoelectric conversion sections configured to be stacked on each other to photoelectrically convert light in different wavelength bands.

(13) The imaging element as stated in any one of paragraphs (1) to (12) above, in which a first substrate over which the photoelectric conversion section and the semiconductor substrate are formed and a second substrate different from the first substrate are stacked on each other; transistors formed over the first substrate constitute a circuit configured to read and amplify electrical charges obtained by the photoelectric conversion section; and transistors formed over the second substrate constitute a circuit configured to subject a signal formed of the electrical charges amplified by the other circuit to analog-to-digital conversion.

(14) The imaging element as stated in any one of paragraphs (1) to (13) above, in which a first substrate over which the photoelectric conversion section and the semiconductor substrate are formed and a second substrate different from the first substrate are stacked on each other; transistors formed over the first substrate and transistors formed over the second substrate constitute a circuit configured to read and amplify electrical charges obtained by the photoelectric conversion section; and transistors formed over the second substrate constitute a circuit configured to subject a signal formed of the electrical charges amplified by the other circuit to analog-to-digital conversion.

(15) The imaging element as stated in any one of paragraphs (1) to (14) above, in which the transistors in the pixel constitute a circuit configured to read and amplify electrical charges obtained by the photoelectric conversion section.

(16) The imaging element as stated in paragraph (15) above, in which the transistors in the pixel are all N-type transistors.

(17) The imaging element as stated in paragraph (16) above, in which a first substrate over which the photoelectric conversion section and the semiconductor substrate are formed and a second substrate different from the first substrate are stacked on each other; and transistors formed over the second substrate constitute a circuit configured to subject a signal formed of the electrical charges amplified by the other circuit to analog-to-digital conversion, the circuit being disposed for each column of the pixels disposed in array pattern.

(18) An electronic device including:
an imaging section configured to capture an image of a target object; and
an image processing section configured to perform image processing on image data obtained by the imaging section capturing the image of the target object; in which the imaging section includes an element isolation region configured with an insulator to penetrate a semiconductor layer having transistors formed in a pixel including a photoelectric conversion section photoelectrically converting incident light.

(19) A manufacturing apparatus for manufacturing an imaging element, the manufacturing apparatus including:
an element isolation region forming section configured to form an element isolation region configured with an insulator to penetrate a semiconductor layer having transistors formed in a pixel including a photoelectric conversion section photoelectrically converting incident light.

(20) A manufacturing method for use with a manufacturing apparatus for manufacturing an imaging element, the manufacturing method including:
forming an element isolation region configured with an insulator to penetrate a semiconductor layer having transistors formed in a pixel including a photoelectric conversion section photoelectrically converting incident light.

REFERENCE SIGNS LIST

100 Image sensor
101 Pixel substrate
102 Circuit substrate
110 Pixel array
111 Unit pixel
120 ADC array
121 A/D conversion section
131 Photoelectric conversion section
132 First reset transistor
133 Transfer transistor
134 Amplification transistor
135 Second reset transistor
136 Comparison section
137, 138 Transistor
141 to 144 Transistor
151 First floating diffusion layer
152 Second floating diffusion layer
161, 162 Well contact
211 Photoelectric conversion layer
212 Element isolation layer
213 Transistor wiring layer
224 Upper electrode
225 Photoelectric conversion section
226 Lower electrode
241 P-well
242 N-well
251 Element isolation region
261 N+ diffusion layer
262 P+ diffusion layer
282 Depletion layer
312 N+ diffusion layer
400 Manufacturing apparatus
402 Manufacturing section
432 Element isolation layer forming section
900 Imaging apparatus
912 CMOS image sensor

What is claimed is:

1. An imaging element comprising:
an element isolation region configured with an insulator, the insulator configured to penetrate a semiconductor layer, the semiconductor layer having transistors formed in a pixel, the pixel including a photoelectric conversion section, wherein the photoelectric conversion section photoelectrically converts incident light into electrical charges,
wherein the element isolation region is disposed on a boundary between a P-well and an N-well of the imaging element, wherein the element isolation region is in direct contact with a plurality of side walls of a floating diffusion layer, and wherein the floating diffusion layer accumulates the electrical charges photoelectrically converted by the photoelectric conversion section.

2. The imaging element according to claim 1, wherein the element isolation region is configured to isolate at least one of the transistors formed in the semiconductor layer, a diffusion layer, and a well from the others.

3. The imaging element according to claim 2, wherein the element isolation region is configured to isolate a plurality of the floating diffusion layers from one another formed in the pixel.

4. The imaging element according to claim 2, wherein the element isolation region is configured to isolate the P-well from the N-well.

5. The imaging element according to claim 2, wherein the element isolation region is configured to isolate a P-type transistor from an N-type transistor.

6. The imaging element according to claim 2, further comprising:
a pixel array having a plurality of pixels arrayed two-dimensionally.

7. The imaging element according to claim 2, wherein the element isolation region is configured to isolate the diffusion layer for an upper electrode of the photoelectric conversion section outside the pixel.

8. The imaging element according to claim 7, wherein the element isolation region is configured to be in contact with a side wall of the diffusion layer for the upper electrode.

9. The imaging element according to claim 1,
wherein a first substrate over which the photoelectric conversion section and the semiconductor substrate are formed and a second substrate different from the first substrate are stacked on each other; and transistors formed over the first substrate and transistors formed over the second substrate constitute a circuit configured to read and amplify electrical charges obtained by the photoelectric conversion section, the circuit further subjecting the amplified electrical charges to analog-to-digital conversion.

10. The imaging element according to claim 1, wherein the photoelectric conversion section is formed by a plurality of the photoelectric conversion sections configured to be stacked on each other to photoelectrically convert light in different wavelength bands.

11. The imaging element according to claim 1,
wherein a first substrate over which the photoelectric conversion section and the semiconductor substrate are formed and a second substrate different from the first substrate are stacked on each other;

transistors formed over the first substrate constitute a circuit configured to read and amplify electrical charges obtained by the photoelectric conversion section; and transistors formed over the second substrate constitute a circuit configured to subject a signal formed of the electrical charges amplified by the other circuit to analog-to-digital conversion.

12. The imaging element according to claim 1
wherein a first substrate over which the photoelectric conversion section and the semiconductor substrate are formed and a second substrate different from the first substrate are stacked on each other;

transistors formed over the first substrate and transistors formed over the second substrate constitute a circuit configured to read and amplify electrical charges obtained by the photoelectric conversion section; and transistors formed over the second substrate constitute a circuit configured to subject a signal formed of the electrical charges amplified by the other circuit to analog-to-digital conversion.

13. The imaging element according to claim 1, wherein the transistors in the pixel constitute a circuit configured to read and amplify electrical charges obtained by the photoelectric conversion section.

14. The imaging element according to claim 13, wherein the transistors in the pixel are all N-type transistors.

15. The imaging element according to claim 14,
wherein a first substrate over which the photoelectric conversion section and the semiconductor substrate are formed and a second substrate different from the first substrate are stacked on each other; and transistors formed over the second substrate constitute a circuit configured to subject a signal formed of the electrical charges amplified by the other circuit to analog-to-digital conversion, the circuit being disposed for each column of the pixels disposed in array pattern.

16. An electronic device comprising:
an imaging section configured to capture an image of a target object; and an image processing section configured to perform image processing on image data obtained by the imaging section capturing the image of the target object, wherein the imaging section includes an element isolation region configured with an insulator, the insulator configured to penetrate a semiconductor layer, the semiconductor layer having transistors formed in a pixel, the pixel including a photoelectric conversion section, wherein the photoelectric conversion section photoelectrically converts incident light into electrical charges, wherein the element isolation region is disposed on a boundary between a P-well and an N-well of the imaging element, wherein the element isolation region is in direct contact with a plurality of side walls of a floating diffusion layer, and wherein the floating diffusion layer accumulates the electrical charges photoelectrically converted by the photoelectric conversion section.

17. The electronic device according to claim 16, wherein the element isolation region is configured to isolate at least one of the transistors formed in the semiconductor layer, a diffusion layer, and a well from the others.

18. The electronic device according to claim 17, wherein the element isolation region is configured to isolate a plurality of the floating diffusion layers from one another formed in the pixel.

19. A manufacturing apparatus for manufacturing an imaging element, the manufacturing apparatus comprising:
an element isolation region forming section configured to form an element isolation region configured with an insulator, the insulator configured to penetrate a semiconductor layer having transistors formed in a pixel, the pixel including a photoelectric conversion section, wherein the photoelectric conversion section photoelectrically converts incident light into electrical charges, wherein the element isolation region is disposed on a boundary between a P-well and an N-well of the imaging element, wherein the element isolation region is in direct contact with a plurality of side walls of a floating diffusion layer, and wherein the floating diffusion layer accumulates the electrical charges photoelectrically converted by the photoelectric conversion section.

20. A manufacturing method for use with a manufacturing apparatus for manufacturing an imaging element, the manufacturing method comprising:
forming an element isolation region configured with an insulator, the insulator configured to penetrate a semiconductor layer, the semiconductor layer having transistors formed in a pixel, the pixel including a photoelectric conversion section, wherein the photoelectric conversion section photoelectrically converts incident light into electrical charges, wherein the element isolation region is disposed on a boundary between a P-well and an N-well of the imaging element, wherein the element isolation region is in direct contact with a plurality of side walls of a floating diffusion layer, and wherein the floating diffusion layer accumulates the electrical charges photoelectrically converted by the photoelectric conversion section.

* * * * *